United States Patent [19]

Jarvie et al.

[11] Patent Number: 6,027,941
[45] Date of Patent: Feb. 22, 2000

[54] METHOD FOR DISTANCE MEASUREMENTS WITH SOLID-STATE NMR

[75] Inventors: Thomas P. Jarvie, Middletown; Joel S. Bader, Branford; Gregory T. Went, Madison, all of Conn.

[73] Assignee: CuraGen Corporation, New Haven, Conn.

[21] Appl. No.: 08/648,609

[22] Filed: May 15, 1996

[51] Int. Cl.[7] .............................. G01N 24/00; G01V 3/00
[52] U.S. Cl. ..................... 436/173; 324/309; 324/311; 324/313; 324/314; 435/7.1
[58] Field of Search .................... 435/6, 7.1; 436/501, 436/536, 532, 86, 173; 324/309, 311, 313, 314

[56] References Cited

U.S. PATENT DOCUMENTS 5,210,691   5/1993   Freedman et al. .

OTHER PUBLICATIONS

Burke et al., 1992, "Solid–state NMR assessment of enzyme active center structure under nonaqueous conditions", J. Biol. Chem. 28:20057–20064.

Campbell and Downing, 1994, "Building protein structure and function from modular units", Tibtech 12:168–172.

Christensen and Schaefer, 1993, "Solid–state NMR determination of intra– and intermolecular $^{31}P$–$^{13}C$ distances for Shikimate 3–phosphate and [1–$^{13}C$]glyphosphate bound to enolpyruvylshikimate–3–3phosphate synthase", Biochem. 32:2868–2873.

Clackson and Wells, 1994, "In vitro selection from protein and peptide libraries", Tibtech 12:173–184.

Clore and Gronenborn, 1994, "Structures of larger proteins, protein–ligand and protein–DNA complexes by multidimensional heteronuclear NMR", Protein Sci. 3:372–390.

Dabulis and Klibanov, 1992, "Dramatic enhancement of enzymatic activity in organic solvents by lypoprotectants", Biotech. and Bioengin. 41:566–571.

Desai et al., 1994, "Protein structure in the lyophilized state: a hydrogen isotope exchange/NMR study with bovine pancreatic trypsin inhibitor", J. Am. Chem. Soc. 116:9420–9422.

Ernst, et al., 1990, *Principles of Nuclear Magnetic Resonance in one and two dimensions* (Clarendon Press, Oxford).

Frye and Maciel, 1982, "Setting the magic angle using a quadpolar nuclide", J. Magnetic Resonance 48:125–131.

Garbow and Gullion, 1991, "Improvements in REDOR NMR spectroscopy. Minimizing resonance–offset effects", J. Magnetic Resonance 95:442–445.

Garbow and McWherter, 1993, "Determination of the molecular conformation of melanostatin using $^{13}C,^{15}N$–/REDOR NMR spectroscopy", J. Am. Chem. Soc. 115:238–244.

Giebel et al., 1995, "Screening of cyclic peptide phage libraries identifies ligands that bind streptavidin with high affinities", Biochem. 34:15430–15435.

(List continued on next page.)

*Primary Examiner*—Donald E. Adams
*Assistant Examiner*—Joseph W. Ricigliano
*Attorney, Agent, or Firm*—Pennie & Edmonds LLP

[57] ABSTRACT

This invention includes methods for analyzing data generated by various solid-state NMR experiments, including rotational echo double resonance (REDOR), transferred echo double resonance (TEDOR), dipolar recoupling at the magic angle (DRAMA), dipolar recoupling with a windowless sequence (DRAWS), and melding of spin-locking and DRAMA (MELODRAMA). The methods are based alternately on a new analytical transform or the maximum entropy method and their multi-dimensional extensions. They permit simultaneous, multiple distance measurements of high accuracy and precision, even from nuclei with identical chemical shifts. By providing high quality easily obtained distance measurement from disordered solid state materials, this invention also improves drug discovery and design through fast determination of structures of pharmaceutical lead compounds, drug molecules, or their targets.

46 Claims, 16 Drawing Sheets

OTHER PUBLICATIONS

Goldman and Youvan, 1992, "An algorithmically optimized combinatorial library screened by digital imaging spetroscopy", Biotech. 10:1557–1561.

Gregory et al., 1995, "Windowless dipolar recoupling: the detection of weak dipolar couplings between spin 1/2 nuclei with large chemical shift anisotropies", Chem Phys. Letts. 246:654–663.

Griebenow and Klibanov, 1995, "Lyophhilization–induced reversible changes in the secondary structure of proteins", Proc. Natl. Acad. Sci. USA 92:10969–10976.

Guan and Dixon, 1991, "Eukaryotic proteins expressed in *Escherichia coli*: an improved thrombin cleavage and purification procedure of fusion proteins with glutathione s–transferase", Anal. Biochem. 192:262–267.

Gubernatis et al., 1991, "Quantum Monte Carlo simulations and maximum entropy: dynamics from imaginary–time data", Phys. Rev. 44:6011–6029.

Gullion and Schaefer, 1989, "Rotational–echo double–resonance NMR", J. Magnetic Resonance 81: 196–200.

Gullion and Schaefer, 1989, "Detection of weak heteronuclear dipolar coupling by rotational–echo double–resonance nuclear magnetic resonance", Advances In Magnetic Resonance 13:57–83.

Gullion et al., 1990, "New, compensated Carr–Purcell sequences", J. Magnetic Resonance 89:479–484.

Hing, 1993, "Measurement of heteronulear dipolar coupling by transferred–echo double–resonance NMR", J. Magnetic Resonance 103:151–162.

Hing et al., 1994, "An investigation of the ligand–binding site of the glutamine–binding protein of *Escherichia coli* using rotational–echo double–resonance NMR", Biochem. 33:8651–8661.

Hing et al., 1992, "Transferred–echo double–resonance NMR", J. Magnetic Resonance 96: 205–209.

Hore, 1990, "Maximum entropy and nuclear magnetic resonance", Maximum Entropy in Motion (Clarendon Press, Oxford) pp. 41–73.

Jarvie et al., 1996, "Simultaneous multiple distance measurements in peptides via solid–state NMR", J. Am. Chem. Soc. 118:5330–5331.

Katz, 1995, "Binding to protein targets of peptidic leads discovered by phage display: crystal structures of Streptavidin–bound linear and cyclic peptide ligands containing the HPO sequence", Biochem. 34:15421–15429.

Lazo et al., 1993, "Rapidly–frozen polypeptide samples for characterization of high definition dynamics by solid–state NMR spectroscopy", Biochem. and Biophys. Res. Comm. 197:904–909.

MacArthur et al., 1994, "NMR and crystallography—complementary approaches to structure determination", Tibtech 12: 149–153.

Marengere et al., 1994, "SH2 domain specificity and activity modified by a single residue", Nature 369:502–505.

Marshall et al., "Determination of a precise interatomic distance in a helical peptide by REDOR NMR", J. Am. Chem. Soc. 112:963–966. PY=1990.

Mueller et al., 1995, "The REDOR Transform: direct calculation of internuclear couplings from dipolar–dephasing NMR data", Chem. Phys. Lett. 242:535–542.

Mueller, 1995, "Analytic solutions for the time evolution of dipolar–dephasing NMR signals", J. Mag. Res. 113:81–93.

Munowitz, 1988, *Coherence and NMR*, (John Wiley & Sons, New York).

Munowitz et al., 1982, "Two–dimensional separation of dipolar and scaled isotrophic chemical shift interactions in magic angle NMR spectra", J. Chem. Phys. 77:1686–1689.

O'Neil, et al., 1992, "Identification of novel peptide antagonists for GPIIa/IIIa from a conformationally constrained phage peptide library", Proteins: Structure, Function, and Genetices 14:509–515.

Pan et al., 1990, "Determination of C–N internuclear distances by rotational–echo double–resonance NMR of solids", J. Magnet. Res. 90:330–340.

Roberts et al., 1987, "Measurement of heteronuclear bond distances in polycrystalline solids by solid–state NMR techniques", J. Am. Chem. Soc. 109:4163–4169.

Schafer et al., 1995, "De–Pake–ing of NMR powder spectra by nonnegative least–sqaures analysis with Tikhonov regularization", J. Magnetic Resonance 116:145–149.

Skilling, ed., 1989, *Maximum entropy and Bayesian methods*, pp. 45–52 (Kluwer Academic Publishers, Boston).

Sollfrey, 1969, "Inverse functions of the products of two Bessel functions", J. Math. Phys. 10:1429–1430.

Stout and Stroud, 1996, "The complex of the anti–cancer therapeutic, BW1843U89, with thymidylate synthase at 2.0A resolution: implications for a new mode of inhibition", Structure 4:67–77.

Sun et al., 1995, "Internuclear distance measurements in solid state nuclear magnetic resonance: dipolar recoupling via rotor synchronized spin locking", J. Chem. Phys. 102:702–707.

Tycko and Dabbagh, 1990. "Measurement of nuclear magnetic dipole–dipole couplings in magic angle spinning NMR", Chem. Phys. Letters, 173:461–465.

Tycko and Smith, 1993, "Symmetry principles in the design of pulse sequences for structural measurements in magic angle spinning nuclear magnetic resonance", J. Chem. Phys. 98:932–943.

Van Eck and Veeman, 1994, "A solid–state NMR 3D heteronuclear dipolar–correlation experiment. The correlation of $\delta(^{13}C)$, $\delta(^{15}N)$, and $D_{(C-N)}$", J. Magnetic Resonance 109:250–252.

Weichsel and Montfort, 1995, "Ligand–induced distortion of an active site in thymidylate synthase upon binding anticancer drug 1843U89", Nat. Struc. Biol. 2:1095–1101.

Wells, 1994, "Structureal and functional basis for hormone binding and receptor oligomerization", Curr. Opin. Cell Biol. 6:163–173.

Wolfram, 1991, *Mathematica: a system for doing mathematics by computer*, (Addison–Wesley Publishing Company, New York).

Yu et al., 1994, "Structural basis for the binding of proline–rich peptides to SH3 domains", Cell. vol. 76:933–945.

Zhao, 1995, "A paradigm for drug discovery using a conformation from the crystal structure of a presentation scaffold", Nat. Struc. Biol. 2:1131–1137.

METHOD FOR DISTANCE MEASUREMENTS WITH SOLID-STATE NMR

This invention was made with United States Government support under award number 70NANB5H1066 awarded by the National Institute of Standards and Technology. The United States Government has certain rights in the invention.

TABLE OF CONTENTS
1. FIELD OF THE INVENTION
2. BACKGROUND OF THE INVENTION
3. SUMMARY OF THE INVENTION
4. BRIEF DESCRIPTION OF THE DRAWINGS
5. DETAILED DESCRIPTION
    5.1. THE DIPOLAR SPECTRUM AND DIPOLAR DEPHASING EXPERIMENTS
    5.2. THE MAXIMUM ENTROPY EMBODIMENT
    5.3. THE REDOR TRANSFORM EMBODIMENT
    5.4. SYMMETRIC TEDOR
    5.5. MULTIDIMENSIONAL ANALYSIS METHODS
        5.5.1. TWO-DIMENSIONAL ANALYSIS METHODS
        5.5.2. QUASI THREE-DIMENSIONAL CORRELATION ANALYSIS METHODS
        5.5.3. THREE-DIMENSIONAL ANALYSIS METHODS
    5.6. SAMPLE LABELING METHODS
6. EXAMPLES
    6.1. REDOR DATA COLLECTION
    6.2. ONE-DIMENSIONAL REDOR DATA ANALYSIS
    6.3. TWO-DIMENSIONAL REDOR DATA ANALYSIS
    6.4. SAMPLE LABELING
7. COMPUTER PROGRAM CODE
    7.1. FOR THE MAXIMUM ENTROPY EMBODIMENT
    7.2. FOR THE REDOR TRANSFORM EMBODIMENT CODE
8. SPECIFIC EMBODIMENTS, CITATION OF REFERENCES

A portion of the disclosure of this patent document contains material which is subject to copyright protection. The copyright owner has no objection to the facsimile reproduction by any one of the patent disclosure, as it appears in the Patent and Trademark Office patent files and records, but otherwise reserves all copyright rights whatsoever.

1. FIELD OF THE INVENTION

The field of the invention is the analysis of data generated by nuclear magnetic resonance ("NMR") spectroscopic measurements of molecules to produce data relating to internuclear separations within the molecule. The invention has particular application to quick and accurate determinations of molecular structure in the field of drug design by use of the new NMR and signal processing techniques.

2. BACKGROUND OF THE INVENTION

The search for new and better drugs motivates the need for faster and more accurate methods of molecular structure determination. Pharmaceutical companies need to discover and commercialize new pharmaceuticals quickly and efficiently. While the need for new drugs has increased in recent years, the productivity of drug discovery and development has not markedly improved. Despite a more that ten-fold increase in research and development spending by the pharmaceutical and biotechnology industries between 1976 and 1994, the number of new molecules approved by the FDA for pharmaceutical use remained relatively constant in the range of 12–30 per year throughout this period. The time spent on discovery, development, and commercialization of new pharmaceutical molecules has remained constant at 10–12 years per drug. There is a need to shorten the time and reduce the cost of drug discovery.

To understand better the problems in the drug discovery, consider the current state of the art. Evidence from molecular biology points to the interaction of proteins with their targets as a fundamental biological mechanism underlying the normal state and numerous diseased states. For example, artheriosclerosis (the principal cause of heart attack and stroke) and cancer, responsible for greater than 50% of the mortality in the U.S., are triggered by the disordering of specific protein-protein recognition events. Early approaches to drug design depended on the chance observation of biological effects of a known compound or the screening of large numbers of exotic compounds, usually derived from natural sources, for any biological effects. The nature of the actual protein target was usually unknown. Characterizing diseases by specific molecular recognition events involved presents opportunities for more rational drug discovery and development.

To date, however, rational drug design has met with only limited success. One approach to rational drug design is based on first determining the entire structure of the proteins involved, examining the structure for possible targets, and then predicting the structure of drug molecules likely to bind to the possible target. The physical structure in the drug molecule that binds to the target region on the protein or other ligand is called a pharmacophore. Thus, the location of thousands of atoms in the protein must be accurately determined before beginning the drug design process. Recent structural studies on the potent anti-cancer drug 1843U89, an inhibitor of thymidylate synthetase (TS), indicate that the structure of the active site of TS is severely distorted upon binding of the drug (Weichsel et al., 1995, *Nature Structural Biology* 2:1095–1101; Stout et al., 1996, *Structure* 4:67–77). As this example indicates, even if the structure of the protein target TS was accurately characterized, rational drug design based on characterization of the targets would miss important potential drugs.

A more promising approach to rational drug design is based on diversity libraries, which are huge libraries of related molecules used to explore protein-target interactions (Clackson et al., 1994, *Tibtech* 12:173–184). From such a library only those members binding to the target of interest are selected. Two different promising libraries are those that consist of small cyclic peptides, with 6 to 12 amino acids, and those that consist of small organic molecules. Methods are now available to create such libraries and to select library members that recognize a specific protein target (Goldman et al., 1992, *BioTechnology* 10:1557–1561). Once a diversity library is created, it is a source from which to select specific members that bind to targets of interest. Molecular biological methods can be used to identify in a matter of days either single molecules or small ensembles of molecules from these huge libraries that bind to targets with high affinity and specificity. For example, researchers at Arris Pharmaceutical (Giebel et al., 1995, *Biochemistry* 34:15430–15435; Katz, B. A., 1995, *Biochemistry* 34:15421–15429) and SmithKline Beecham Pharmaceuticals (Zhao et al., 1995, *Nature Structure Biology* 2:1131–1137), have screened diversity libraries to select binders for streptavidin (Giebel et al., 1995, *Biochemistry* 34:15430–15435). They found several high-affinity cyclic peptides. Further, the researchers postulate that upon determination of the peptide structures with crystallography, the high-affinity peptide ligands will lead to small organic ligands (Katz, B. A., 1995, *Biochemistry* 34:15421–15429).

Finding pharmaceutically promising small organics from molecules selected in a diversity-library screen involves determination of the structure followed by comparison against known structures of small organics through data base searching. The step of finding small organics from an X-ray crystallographic structure by database search was done with the fibrinogen inhibitor REI-RGD34 (Zhao et al., 1995, *Nature Structure Biology* 2:1131–1137). Of the molecules returned from their database search, 11% were known binders to the target peptide. This search was based on a crystal structure of the inhibitor determined to 1 Å. As these examples indicate, the diversity methods can select molecules from a screen, and those molecules can be compared to suitable pharmaceutical leads if their molecular structure is determined with sufficient accuracy.

Translating the structure of a molecule selected from a screen to a small organic lead compound relies upon an accurate characterization of the molecular structure of the selected molecule. Experimental structure determination currently relies primarily upon X-ray crystallography and solution-state NMR (MacArthur et al., 1994, *Trends in Biotechnology* 12:149–153). X-ray crystallography depends on the interaction of electron clouds with X-rays to provide information on the location of every heavy atom in a crystal of interest. The accuracy of X-ray crystallography is 0.5–2.0 Å (1 Å=$10^{-8}$ cm). One of its principal drawbacks is the difficulty in obtaining the highly regular crystals necessary to achieve high resolution diffraction patterns. Although the art of crystal growing has improved, it remains insufficient. Many classes of biologically relevant proteins, for example transmembrane receptors, are highly resistant to crystallization. The difficulty is in part due to the existence of large hydrophilic and hydrophobic structural regions. Although in advance, co-crystallization of pairs of interacting species can still be difficult. Additional difficulties are the expense and time associated with obtaining high-quality crystals (MacArthur et al., 1994, *Trends in Biotechnology* 12:149–153), and uncertainty in whether or not the structures of the crystalline forms are representative of the in vivo conformations (Clore et al., 1994, *Protein Science* 3:372–390). The same problems arise when the target molecule is DNA or RNA.

Solution-state NMR, the second primary method, relies upon correlations between nuclear spins resulting from dipole-dipole interactions indirectly mediated by the electron clouds. High-resolution, multidimensional, solution-state NMR techniques are an attractive alternative to crystallography since that they can be applied in situ (i.e., in aqueous environment) to the study of small protein domains (Yu et al., 1994, *Cell* 76:933–945). Solution-state NMR has been successful at determining the structure of moderate-sized proteins and protein/ligand complexes to a 2 Å resolution, similar to that of X-ray methods (MacArthur et al., 1994, *Trends in Biotechnology* 12:149–153; Clore et al., 1994, *Protein Science* 3:372–390). The structure of a ligand (such as a pharmaceutical lead compound) bound to a protein is most efficiently determined when the protein is uniformly $^{13}$C and $^{15}$N labeled (at increased cost), and the binding occurs in the slow exchange limit (Clore et al., 1994, *Protein Science* 3:372–390). In this limit, a bound complex remains together long enough for resonances of the free and bound form of the ligand to be resolved. The slow exchange limit restricts the applicability of the technique to only those ligands that exhibit tight binding. Also, complex spectra makes the analysis of the mutual correlations quite time consuming. Due to resolution problems resulting from increasingly complicated spectra and overlapping resonance lines, solution-state NMR has strict size limitations on the molecules that can be studied. The maximum size of a protein that is amenable to study is approximately 25 kDaltons (kD) (Clore et al., 1994, *Protein Science* 3:372–390). All of the above concerns and problems apply as well when the target molecules are DNA or RNA. In fact, a lack of resolution, along with a dearth of mutual correlations, limit the size of DNA and RNA molecules to less than 40 total bases.

Resolution obtainable by either crystallography or solution-state NMR has been inadequate for effective rational drug design, especially for the selection of a lead compound from databases of organic compound. The resolution required to achieve both drug affinity and drug specificity, although not precisely known, is probably measured in fractions of an Å, or even 0.1 Å (MacArthur et al., 1994, *Trends in Biotechnology* 12:149–153). This accuracy appears to be beyond the capabilities of X-ray and solution-state NMR methods.

Improved methods of molecular structural determination, especially those applicable to drug discovery, have great utility. One such method that avoids some limitations associated with X-ray crystallography and solution-state NMR, and has significant advantages, is solid-state NMR, particularly dipolar-dephasing experiments such as rotational echo double resonance (REDOR) (Gullion et al., 1989, *Journal of Magnetic Resonance* 81:196–200; Gullion et al., 1989, *Advances in Magnetic Resonance* 13:57–83). Compared with crystallography, solid-state NMR has the advantage that it obtains high-resolution structural information from polycrystalline and disordered materials. This eliminates the need for the formation of highly regular crystals to achieve high resolution diffraction, and eliminates structural perturbations due to crystal packing forces. In contrast to solution-state NMR, which relies upon mutual correlations between nuclei from the indirect dipolar coupling (studied via the Nuclear Overhauser effect, NOE) that fall off as $1/r^6$, solid-state NMR relies upon the direct dipolar coupling, which decreases as $1/r^3$, for the measurement of internuclear distances, where r is the internuclear distance. As a result, longer distances can be measured with solid-state NMR, and the distances measured have a higher degree of accuracy and precision. Furthermore, solid-state NMR is not strictly limited by the size of the complex resulting from the drug bound to a target molecule. In the solid-state NMR experiments, the size limitations are determined primarily by the quantity of the sample available, and the sensitivity of the NMR spectrometer.

One advantage of the REDOR transform technique over solution-state NMR measurement is the direct and accurate determination of the internuclear distance from a measured frequency. Solution-state NMR experiments rely upon the indirect measurement of the dipolar coupling for distance measurements. In solution-state NMR there is no direct relationship between an experimentally measured parameter and the distance. Instead, the strength of the coupling, as inferred from the Nuclear Overhauser effect (NOE), is related to a range of possible distances spanning a few Angstroms.

For clarity, and to fit the experimental example presented in this invention, the discussion here will be limited to REDOR, although it can be generalized to other dipolar-dephasing (dipolar-recoupling) methods such as TEDOR (Hing et al., 1993, *Journal of Magnetic Resonance, Series A* 103:151–162; Hing et al., 1992, *Journal of Magnetic Resonance* 96:205–209), DRAMA (Tycko et al., 1990, *Chemical Physics Letters* 173:461–465; Tycko et al., 1993, *Journal of Chemical Physics* 98:932–943), DRAWS (Gregory et al., In 36th *Experimental Nuclear Magnetic Resonance Conference*; Boston, Mass., 1995; p 289), and MELODRAMA (Sun et al., 1995, *Journal of Chemical Physics* 102:702–707). REDOR is a high-resolution solid-state NMR technique for measuring the distance between heteronuclei in varied solid state materials. As applied to biological materials, this has primarily meant the distance between one $^{13}C$ atom and one $^{15}N$ atom (Marshall et al., 1990, *Journal of the American Chemical Society* 112:963–966; Garbow et al., 1993, *Journal of the American Chemical Society* 115:238–244). Because of the nature of nuclear magnetic interactions in the solid state, REDOR has the inherent ability to measure internuclear distances with a high degree of accuracy and precision. REDOR measurements are accurate to better than 0.05 Å when the $^{13}C$-$^{15}N$ distances are from 0 to 4 Å, and to better than 0.1 Å when the $^{13}C$-$^{15}N$ distances are from 4 to 6Å.

REDOR data has an important drawback that has limited its applicability and utility—conventional analysis and processing allows the measurement of one distance at a time from nuclear spins with degenerate chemical shifts. The reason for this drawback is that conventional REDOR data analysis relies upon a simplistic numerical calculation of the powder average of the disordered material. This analysis results in a universal curve (an example is shown in FIG. 2), having a shape related to the internuclear distance. Conventional analysis methods cannot separate overlapping universal curves. Therefore, in the conventional method of analysis, the simultaneous measurement of more than one distance from spins with degenerate chemical shifts is impractical.

A second area for improvement in dipolar-dephasing experiments is the elimination of the signal from uncoupled natural abundance nuclei that introduce complications into the processing of the data. One experiment that eliminates this natural abundance contribution is TEDOR. The analysis of TEDOR data, however, is cumbersome and limits its applicability. A method combining the ease of analysis of REDOR and the low background contribution of TEDOR would have clear utility.

A limitation with REDOR as it is currently practiced is the slow nature of the information gathering—usually only one distance at a time is measured between specifically labeled spins. Measurement of a number of distances, for instance at an active binding site in a molecule or a pharmacophore in a drug, is then both time consuming and expensive. While distance measurements obtained by this method are accurate and precise, they require distances to be measured, one at a time, in a slow, tedious fashion. Garbow and Gullion (Garbow et al., 1991, *Journal of Magnetic Resonance* 95:442–445) have shown that these burdens can be reduced by the measurement of REDOR signals from chemically shifted nuclei. However, as the size of a molecule increases, this strategy is limited by degenerate chemical shifts.

In a conventional two-dimensional NMR experiment, both dimensions in the time-domain data set are functions of sines and cosines. A two-dimensional frequency-domain spectrum is generated by Fourier transformation of both dimensions. In the solid-state NMR dipolar-dephasing experiments, only the second dimension is a function of sines and cosines; the first dimension is a function of cylindrical Bessel functions of fractional order. Thus, the standard method of Fourier transforming both time-domain dimensions to get a two-dimensional frequency domain spectrum is inappropriate for the dipolar-dephasing method. Previous two-dimensional solid-state NMR experiments (employing a Fourier transform in both dimensions) have measured the dipolar coupling versus the chemical shift, but only for strong dipolar couplings. These techniques are suitable only for strong dipolar couplings and are not suitable for the weak dipolar couplings measured in the dipolar-dephasing experiments.

Although the experiment of van Eck and Veeman (van Eck et al., 1994, *Journal of Magnetic Resonance, Series A* 109:250–252) is a three-dimensional experiment, they analyzed the data by Fourier transformation of the TEDOR dimension. Thus, their results lack the high-resolution and straight-forward interpretation inherent in the three-dimensional method put forth in this invention.

Whereas there is clear value in information relating to molecular structure, whereas there is utility in methods and devices relating to the generation of such information, whereas solid-state NMR is a method of great utility for generating such information in the form of precise distances for selected pairs of nuclei, whereas the state-of-the-art methods for analyzing the signals generated by solid-state NMR experiments all have certain limitations, there is a need for a new type of analysis method that is capable of producing high-precision information from experimental time-domain data in the form of frequency-domain spectra, that can produce high-precision distance information from the time-domain data, that suppresses noise in the time-domain experimental data, that provides an internal consistency check on generated spectra, that can separate contributions from several dipolar couplings in a single time-domain signal, that accepts time-domain data in which the signal has not decayed to zero at the final point, that does not require smoothing of time-domain data, with subsequent line broadening, that is built naturally on a representation of data collected at discrete points in time, rather than continuously over a certain period, that is able to handle naturally the noise from natural abundance signals, that, in summary, provides the best possible frequency-domain and distance-domain spectra from a time-domain signal according to a precise, information theoretic definition.

Citation of references herein and above shall not be construed as an admission that such reference is prior art to the present invention.

3. SUMMARY OF THE INVENTION

It is a broad object of this invention to provide internuclear distances derived from solid state NMR measurements faster, more accurately and precisely, and with greater versatility than prior art solid-state NMR techniques. In the specific case of $^{13}C$-$^{15}N$, the distance measurements obtained from this invention are accurate to better that 0.05 Å when the distance is less than 4 Å, and to better than 0.1 Å when the distance is from 4 to 6 Å. This object has great utility in addressing the prior art problems of molecular structure determination in the field of drug design by providing a method that is more precise and more time efficient than crystallography or solution-state NMR. The increased speed and accuracy of the pharmacophore structure determination should lead more quickly and efficiently to suitable pharmaceutical compounds.

It is an object of the invention to provide high-precision information from experimental time-domain data generated by solid-state NMR experiments that measure signals arising from dipolar couplings. This time-domain data is analyzed to produce frequency-domain or, equivalently, distance-domain spectra corresponding to the dipolar couplings contributing to the time-domain data.

This invention achieves these objects by introducing improvements to both experimental procedures and data analysis that allows simultaneous measurement of multiple distances, and more precise measurements of single distances. The invention introduces methods based on the REDOR transform and the maximum entropy method. This invention provides methods for the analysis of time-domain data from a class of solid-state NMR experiments that extract from the time domain data a spectrum corresponding to frequency-domain information of the coupling frequencies contributing to said data. In other words, the methods provide a spectrum of internuclear distances contributing to the signal expressed by the time-domain data. The invention is also applicable to solid-state NMR heteronuclear and homonuclear distance measurement experiments, other than REDOR, which possess the same functional form for time evolution as the REDOR signal. Most generally, this invention is applicable to solid-state NMR heteronuclear and homonuclear distance measurement experiments where the time evolution of the signal function is known numerically.

One embodiment of the invention provides a method of performing REDOR NMR measurements and data analysis, with the REDOR transform, that enables multiple, simultaneous distance measurements from nuclear spins that possess identical chemical shifts. In a preferred embodiment, a one-dimensional REDOR transform allows the measurement of two or more internuclear distances from all nuclei at one specific chemical shift. In another preferred embodiment, a two-dimensional spectrum that correlates chemical shift of the observed nucleus to the heteronuclear dipolar coupling allows the measurement of two or more internuclear distances from all chemically shifted nuclei. In another preferred embodiment, two-dimensional spectra are obtained for both nuclei in the heteronuclear pair. Subsequent correlation of the two spectra leads to improved site identification in complex samples. In a further preferred embodiment, a three-dimensional spectrum that correlates the chemical shifts of both nuclei to each other and to the dipolar coupling enables improved site identification in complex samples.

Another embodiment uses the maximum entropy method. This method requires as input the kernel for generating the time-domain data corresponding to a particular coupling frequency or a particular internuclear separation, depending on the mode of operation. The most probable spectrum corresponding to the data is generated by the method using a maximum entropy method. Additionally, the maximum entropy method uses default values for the spectrum and estimates of the noise in the supplied data, and generates information relating to the error in the spectrum and the reliability of the noise estimate provided for the data.

The invention also comprises a method for performing symmetric TEDOR experiments that eliminate the natural abundance contribution to the intensity of the measured peaks in the NMR spectrum. This eliminates the need for offset correction in the measured NMR signal. The functional form of the symmetric TEDOR experiment is identical to the REDOR experiment. Improvements to the TEDOR experiment are introduced that eliminate the natural abundance contribution and allow the application of the improved data processing techniques put forth in this invention.

It is a feature of this invention that the simultaneous measurements of multiple distances by the REDOR technique decreases experimental times. Many distances measured simultaneously take less time than many distances measured sequentially. Furthermore, simultaneous distance measurements lower the cost of synthesis of the samples, both target proteins and drug molecules. The lower cost of the protein target results from the reduced quantity of protein needed for the experiments. The lower cost of the drug molecules results from the less expensive synthesis of multiple distances on a single compound. The gains in the number of distances measured are not at the expense of increased time spent on data analysis. The time spent on data analysis (typically hours) is far less than the time spent on x-ray crystallography and solution-state NMR data analysis (typically months).

Application of the methods of this invention to pharmaceutical lead compounds allows measurement of more than one distance from pairs of nuclei that have identical chemical shifts.

It is a feature of this invention that, by allowing the distance measurements to be made in more complex samples with multiple distances, the cost of materials used in the structure determination can be lowered. In a specific embodiment of the invention, the complex samples are made by physically mixing peptides with one measurable distance per peptide. In an alternate embodiment of the invention, the complex sample contains many measurable distances within one peptide. In another embodiment of the invention, the complex samples are made by physically mixing peptides where each peptide contains multiple measurable distances.

It is a feature of the invention that, in contrast to crystallography which requires the availability of highly regular crystals for diffraction, the experiments are performed on disordered (microcrystalline or amorphous) materials. Further, the invention is not strictly limited by the molecular weight of the molecule or molecules of interest due to resolution concerns, as in solution-state NMR.

It is a feature of this invention that this method can be used in studies of pharmacophores in a number of environments. In a preferred embodiment of the invention, peptides are bound to synthesis resin. In an alternate preferred embodiment of the invention, peptides are intimately mixed into a matrix such as unlabeled peptide or milk protein. In another preferred embodiment of the invention, peptides are bound to target proteins.

It is a feature of this invention that the materials upon which the technique can be applied extend beyond peptides reported in this invention and include, but are not limited to, non-peptide molecules such as peptoids, peptidomimetics, nucleic acids, carbohydrates, and other small organic drug molecules. Distance measurement can be made between the target protein and the ligand as well as distance measurements within the target protein. The relevant feature of any applicable material is that it possesses naturally, or can be selectively labeled with, pairs of NMR active nuclei. The pairs can be either heteronuclear pairs or homonuclear pairs.

Both groups of methods are applicable to multi-dimensional NMR analysis. The method introduced for two-dimensional processing of the data allows the simultaneous measurement of multiple distances from multiple chemically shifted spins. Two additional methods, the correlation of two-dimensional data sets and three-dimensional experiments, further enhance resolution. By correlating the heteronuclear dipolar coupling between the nuclei to the chemical shifts of both species, these techniques expand the utility of the techniques to more complex samples. A complex sample is defined as a sample that contains multiple internuclear distances and multiple, chemically shifted nuclei. The benefit is that more complex samples translate into more heteronuclear distances measured per unit time. The measured distances in the one-dimensional, two-dimensional, and three-dimensional techniques retain the high accuracy and precision of conventional REDOR measurements while allowing increases in speed and lowered costs.

In an embodiment this invention provides a method for determining one or more distances in a sample comprising one or more molecules, said one or more molecules comprising one or more pairs of sites, each said pair of sites comprising a first site and a second site, each said distance being between said first and said second site, said method comprising: generating NMR time-domain data from NMR active nuclei, wherein each pair of said one or more pairs of sites has said first site occupied by a first NMR active nucleus and has said second site occupied by a second NMR active nucleus, wherein said first NMR active nucleus is observed in said generating step, and said first and second NMR active nuclei have a dipolar coupling characterized by a dipolar coupling frequency responsive to the distance between said first and second sites, and said time-domain data is responsive along at least one first time dimension to said dipolar coupling of each said one or more pairs; and analyzing said NMR time-domain data to obtain spectral-domain data identifying said one or more dipolar coupling frequencies characterizing said dipolar couplings between said first and said second nucleus in said one or more pairs of sites, said analyzing comprising applying a maximum entropy transform to said time-domain data along said first time dimension.

In an embodiment this invention provides a method for determining one or more distances in a sample comprising one or more molecules, said one or more molecules comprising one or more pairs of sites, each said pair of sites comprising a first site and a second site, each said distance being between said first and said second site, said method comprising: binding one or more of said one or more molecules to one or more target compounds; generating NMR time-domain data from NMR active nuclei, wherein each pair of said one or more pairs of sites has said first site occupied by a first NMR active nucleus and has said second site occupied by a second NMR active nucleus, wherein said first NMR active nucleus is observed in said generating step, and said first and second NMR active nuclei have a dipolar coupling characterized by a dipolar coupling frequency responsive to the distance between said first and second sites, and said time-domain data being is responsive along at least one first time dimension to said dipolar coupling of each said one or more pairs; and analyzing said NMR time-domain data to obtain spectral-domain data identifying said one or more dipolar coupling frequencies characterizing said dipolar couplings between said first and said second nucleus in said one or more pairs of sites, said analyzing comprising applying a REDOR transform to said time-domain data along said first time dimension.

In an embodiment this invention provides a method for determining one or more distances in a sample comprising one or more peptides, said one or more peptides comprising one or more pairs of sites, each said pair of sites comprising a first site and a second site, each said distance being between said first and said second site, said method comprising: generating NMR time-domain data from NMR active nuclei, wherein each pair of said one or more pairs of sites has said first site occupied by a first NMR active nucleus and has said second site occupied by a second NMR active nucleus, wherein said first NMR active nucleus is observed in said generating step, and aid first and second NMR active nuclei have a dipolar coupling characterized by a dipolar coupling frequency responsive to the distance between said first and second sites, and said time-domain data being is responsive along at least one first time dimension to said dipolar coupling of each said one or more pairs; and analyzing said NMR time-domain data to obtain spectral-domain data identifying said one or more dipolar coupling frequencies characterizing said dipolar couplings between said first and said second nucleus in said one or more pairs of sites, said analyzing comprising applying a REDOR transform to said time-domain data along said first time dimension.

In an embodiment this invention provides a method for determining a plurality of distances in a sample comprising one or more molecules, said one or more molecules comprising a plurality of pairs of sites, each said pair of sites comprising a first site and a second site, each said distance being between said first and said second site, said method comprising: generating NMR time-domain data from NMR active nuclei, wherein each pair of said one or more pairs of sites has said first site occupied by a first NMR active nucleus and has said second site occupied by a second NMR active nucleus, wherein said first NMR active nucleus is observed in said generating step, and said first and second NMR active nuclei have a dipolar coupling characterized by a dipolar coupling frequency responsive to the distance between said first and second sites, and said time-domain data is responsive along at least one first time dimension to said dipolar coupling of each said one or more pairs; and analyzing said NMR time-domain data to obtain spectral-domain data identifying said one or more dipolar coupling frequencies characterizing said dipolar couplings between said first and said second nucleus in said one or more pairs of sites, said analyzing comprising applying a REDOR transform to said time-domain data along said first time dimension.

In an embodiment this invention provides a method for determining one or more distances in a sample comprising one or more molecules, said one or more molecules comprising one or more pairs of sites, each said pair of sites comprising a first site and a second site, each said distance being between said first and said second site, said method comprising: generating NMR time-domain data from NMR active nuclei, wherein each pair of said one or more pairs of sites has said first site occupied by a first NMR active nucleus and has said second site occupied by a second NMR active nucleus, wherein said first NMR active nucleus is observed in said generating step and has a chemical shift, and said first and second NMR active nuclei form a pair of NMR active nuclei and have a dipolar coupling characterized by a dipolar coupling frequency responsive to the distance between said first and second sites, and said time-domain data is responsive along at least one first time dimension to said dipolar coupling of each said one or more pairs and is responsive along at least one second time dimension to said chemical shift of said first nucleus at said first sites of each said one or more pairs; and analyzing said NMR time-domain data to obtain spectral-domain data identifying said one or more dipolar coupling frequencies characterizing said dipolar couplings between said first and said second nucleus in said one or more pairs of sites, and identifying for each said dipolar coupling frequency the chemical shift of each said first nucleus with that dipolar coupling frequency, said analyzing comprising applying a dipolar-dephasing spectral transform to said time-domain data along said first time dimension and along other time dimensions as are responsive to said one or more dipolar couplings.

In an alternative to the previous embodiment this invention provides the method wherein said second NMR active nuclei at said second site of each said one or more pairs of sites has a chemical shift, wherein said generating step generates NMR time-domain data further responsive along at least one third time dimension to said chemical shift of said second NMR active nuclei at second sites of each of said one or more pairs of sites, and wherein said analyzing step further identifies for each said dipolar coupling frequency the one or more chemical shifts of said second nuclei with that dipolar coupling frequency.

In an embodiment this invention provides a method for determining predicted spectral-domain data values from experimental NMR time-domain data values from a sample according to a maximum entropy transform, said time-domain data values having at least one dimension of time variation responsive to one or more dipolar couplings between one or more pairs of NMR active nuclei in said sample, said method comprising: selecting default spectral-domain data values as M coefficients of basis functions for a quadrature technique; determining a value for a regularization parameter $\alpha$; and determining said predicted spectral-domain data values as M coefficients of basis functions for said quadrature technique as those values maximizing the expression $\alpha E - X^2/2$, wherein E is the entropy of said predicted spectral-domain data values with respect to said default spectral-domain data values, and wherein $X^2$ measures the difference normalized by experimental error estimates between said time-domain data values and time-domain data values determined from said predicted spectral-domain data.

In an embodiment this invention provides a method of analyzing NMR time-domain data values according to a REDOR transform, said time-domain data values being generated from a sample and having two or more dimensions of time variation, at least one of said dimensions being responsive to one or more dipolar couplings between one or more pairs of NMR active nuclei in said sample, said time-domain data values being determinable from spectral-domain data characterizing said dipole couplings by the technique of evaluating the equation $$S(t) = \int_0^\infty dD K(t, D) M(D),$$

wherein M(D) are said spectral-domain data values, S(t) are said time-domain data values, and K(t,D) is given by the equation $$K(t, D) = \frac{\pi}{2\sqrt{2}} J_{1/4}(\sqrt{2} Dt) J_{-1/4}(\sqrt{2} Dt),$$

said method comprising evaluating the equation $$M(D) = \int_0^\infty dt\, k(t, D) S(t)$$

according to a quadrature technique at said time-domain data values and wherein k(t,D) is given by the equation $$k(t, D) = -(Dt)^2 J_{-\frac{5}{4}}(Dt) J_{-\frac{1}{4}}(Dt) - (Dt)\left(J_{-\frac{1}{4}}(Dt)\right)^2 + (Dt)\left(J_{\frac{1}{4}}(Dt)\right)^2 +$$
$$(Dt)^2 J_{-\frac{3}{4}}(Dt) J_{\frac{1}{4}}(Dt) + (Dt)^2 J_{-\frac{1}{4}}(Dt) J_{\frac{3}{4}}(Dt) - (Dt)^2 J_{\frac{1}{4}}(Dt) J_{\frac{5}{4}}(Dt).$$

in order to determine predicted spectral-domain data values, M(D), from said time-domain data values.

In an embodiment this invention provides an apparatus for finding predicted spectral-domain data values, M(), from experimental NMR time-domain data values from a sample according to a maximum entropy transform, said time-domain data values having at least one dimension of time variation responsive to one or more dipolar couplings between one or more pairs of NMR active nuclei in said sample, said apparatus comprising: means for selecting default spectral-domain data values, m(), as M coefficients of basis functions for a quadrature technique in said spectral domain; means for determining a value for a regularization parameter $\alpha$; and means for determining said predicted spectral-domain data values as M coefficients of basis functions for said quadrature technique as those values maximizing the expression $\alpha E - X^2/2$ according to the Davidon-Fletcher-Powell method, (i) wherein E is the entropy of said predicted spectral-domain data values with respect to said default spectral-domain data values and is given by the equation $$E = \int_0^\infty d\nu \{M(\nu) - m(\nu) - M(\nu)\ln[M(\nu)/m(\nu)]\}$$

as evaluated by a quadrature technique at said grid of points, and (ii) wherein $X^2$ measures the difference normalized by experimental error estimates, $\sigma_i$, between said time-domain data values, $S_i$, and time-domain data values, $S'_i$, determined from said predicted spectral-domain data values, M(), according to a specified technique and is given by the equation $$\chi^2 = \sum_{i=0}^{N} (S_i - S'_i)^2 / \sigma_i^2,$$

wherein N+1 is the number of said time-domain data values.

In a embodiment this invention provides an apparatus for analyzing NMR time-domain data values according to a REDOR transform to determine predicted spectral-domain values, said apparatus comprising: means for generating said time-domain data values from a sample, wherein said time-domain data values have two or more dimensions of time variation, at least one of said dimensions being responsive to one or more dipolar couplings between one or more pairs of NMR active nuclei in said sample, and wherein said time-domain data values are determinable from spectral-domain data characterizing said dipole couplings by the technique of evaluating the equation $$S(t) = \int_0^\infty dD K(t, D) M(D),$$

wherein M(D) are said spectral-domain data values, S(t) are said time-domain data values, and K(t,D) is given by the equation $$K(t, D) = \frac{\pi}{2\sqrt{2}} J_{1/4}(\sqrt{2} Dt) J_{-1/4}(\sqrt{2} Dt);$$

and means for evaluating the equation $$M(D) = \int_0^\infty dt k(t, D) S(t)$$

according to a quadrature technique at said time-domain data values, and k(t,D) is given by the equation $$k(t, D) = -(Dt)^2 J_{-\frac{5}{4}}(Dt) J_{-\frac{1}{4}}(Dt) - (Dt)\left(J_{-\frac{1}{4}}(Dt)\right)^2 + (Dt)\left(J_{\frac{1}{4}}(Dt)\right)^2 +$$
$$(Dt)^2 J_{-\frac{3}{4}}(Dt) J_{\frac{1}{4}}(Dt) + (Dt)^2 J_{-\frac{1}{4}}(Dt) J_{\frac{3}{4}}(Dt) - (Dt)^2 J_{\frac{1}{4}}(Dt) J_{\frac{5}{4}}(Dt).$$

In a embodiment this invention provides a method for determining one or more distances in a sample comprising one or more peptides said one or more peptides comprising one or more pairs of sites, each said pair of sites comprising a first site and a second site, each said distance being between said first and said second site, said method comprising: labeling each of said one or more pairs of sites with said NMR active nuclei, whereby each said pair of sites becomes occupied by said first and said second NMR active nuclei; generating NMR time-domain data from NMR active nuclei, wherein each pair of said one or more pairs of sites has said first site occupied by a first NMR active nucleus and has said second site occupied by a second NMR active nucleus, wherein said first NMR active nucleus is observed in said generating step and has a chemical shift, said first and second NMR active nuclei have a dipolar coupling characterized by a dipolar coupling frequency responsive to the distance between said first and second sites, and said time-domain data is responsive along at least one first time dimension to said dipolar coupling of each said one or more site and is responsive along at least one second time dimension to said chemical shift of said first nucleus at said first sites of each said one or more sites; and analyzing said NMR time-domain data to obtain spectral-domain data identifying said one or more dipolar coupling frequencies characterizing said dipolar couplings between said first and said second nucleus in said one or more pairs of sites, and identifying for each said dipolar coupling frequency the one or more chemical shifts of each said first nucleus with that dipolar coupling frequency, said analyzing comprising applying a dipolar-dephasing spectral transform to said time-domain data along said first time dimension and along other time dimensions as are responsive to said one or more dipolar couplings.

This invention further provides a computer readable medium containing instructions for performing the method of claim 45, and a computer readable medium containing instructions for performing the method of claim 62.

4. BRIEF DESCRIPTION OF THE DRAWINGS

These and other objects, features, and advantages of the invention will become apparent to those of skill in the art in view of the accompanying drawings, detailed description, and appended claims, where:

5. DETAILED DESCRIPTION

Figure 1:
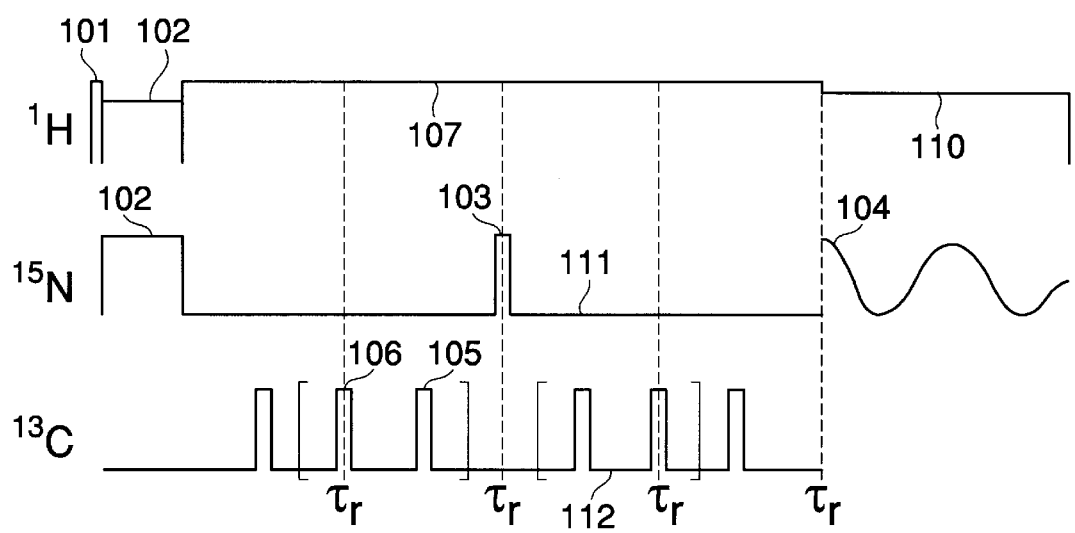
FIG. 1 illustrates an exemplary REDOR pulse-sequence.

Sec. 5.1 describes the basic solid state NMR experiment generating a signal responsive to the dipolar coupling and chemical shift of the observed nucleus. Sec. 5.2 describes the maximum entropy embodiment of the dipolar dephasing spectral transformation of this invention. Sec. 5.3 describes the REDOR transform embodiments of the dipolar dephasing spectral transformation of this invention. Sec. 5.4 describes a preferable TEDOR pulse sequence that is adaptable to this invention. Sec. 5.4 describes measurement and analysis of two- and three-dimensional NMR signals. Sec. 5.6 describes sample labeling, synthesis, and preparation methods to create samples for measurement and analysis according to the methods of this invention.

The methods of this invention are exemplified with peptide samples selectively labeled with $^{13}C$ and $^{15}N$. However, the methods are not limited to such samples nor to such labels. The methods of data collection and processing of this invention are general and apply to any samples that naturally possess, or can be selectively labeled with, NMR active nuclei.

Further, the methods of this invention are exemplified with samples labeled with two NMR active nuclei. However, the methods of this invention are not limited to such labeling. In particular multiple non-observed NMR active nucleus can be present in a sample peptide and the magnetic characteristics of such non-observed nuclei can be sampled by the techniques of multi-dimensional analysis as extended to more than three dimensions. For example, a time-domain NMR signal can be responsive to the dipolar coupling of an observed nucleus, its chemical shift, and the chemical shifts of all the non-observed nuclei to which it is dipolar coupled. Such signals can be generated by applying RF pulse subsequences in the frequency channels of all the nuclei to which the signal is sensitive. Conventional NMR instrumentation, however, generates only three channels of RF pulses.

5.1. THE DIPOLAR SPECTRUM AND DIPOLAR DEPHASING EXPERIMENTS

The methods for structure determination in the field of drug discovery set forth in this invention are based on NMR experiments known as dipolar-dephasing experiments and methods for improved analysis of the time-domain signals from these experiments into frequency domain or distance domain spectra. The preferred methods for performing these experiments permit accurate and rapid measurement of distances between NMR active nuclei, especially more than one distance at a time even arising from spins with degenerate chemical shift. These analysis methods enable more aggressive labeling schemes of molecules of interest. Moreover, the method represent an important step towards the development of reliable methods for biochemical and materials structure determinations.

NMR active nuclei are those nuclei that possess a non-zero nuclear magnetic dipole moment. Two such nuclei with non-zero dipole moments directly interact magnetically with a dipolar coupling frequency, D, which depends directly upon the internuclear distance, r, according to Eqn. 1.

$$D = \frac{2\pi \gamma_1 \gamma_2 \hbar}{r^3} = \frac{\Gamma}{r^3} \quad (1)$$

$$\Gamma = 2\pi \gamma_1 \gamma_2 \hbar$$

In this equation, $\hbar$ is Planck's constant divided by $2\pi$, and $\gamma 1$ and $\gamma 2$ are the gyromagnetic ratios of the interacting nuclei. The gyromagnetic ratio is an intrinsic physical property of the nucleus.

The NMR experiments contemplated by this invention generally include experiments on disordered solid state materials, either noncrystalline or microcrystalline. The materials are preferably organic compounds of biological interest in which NMR active nuclei have been specifically introduced by labeling. Experimental samples are spun in the magnetic field at the magic angle of approximately 54.7° ("magic angle spinning" or "MAS") and at high frequencies, typically greater than 3 Khz. (Munowitz, M., Coherence and NMR; John Wiley & Sons: New York, 1988, p. 289). Magic angle spinning averages out the anisotropic chemical shift as well as the nuclear dipolar coupling. The experiments considered are generally spin-echo experiments which are perturbed by various preparatory pulse sequences so that the resulting free induction decay ("FID") signals are at least responsive to selected dipolar couplings. The preparatory pulse sequences are arranged so that the selected dipolar couplings act to dephase additionally the spin-echo and thereby alter the FID signal.

Figure 6:
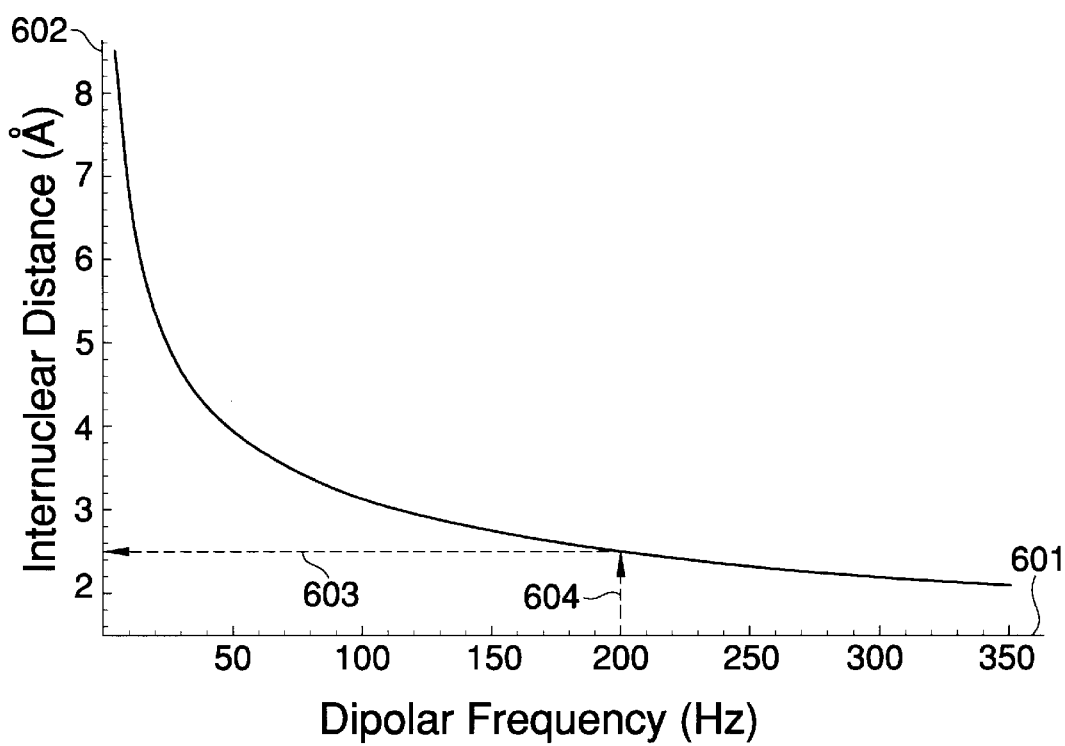
FIG. 6 illustrates a curve relating internuclear distance and dipolar-coupling frequency.

Measurement of dipolar coupling permits simple determination of internuclear distances. From Eqn. 1, a dipolar coupling frequency measured by the methods of this invention can be simply converted into the corresponding internuclear distance. FIG. 6 illustrates the curve of internuclear distance vs. dipolar frequency for the nuclear pair $^{13}C$-$^{15}N$, the most common pair of NMR active nuclei in biological applications, generated according to Eqn. 1. Horizontal axis 601 records dipolar coupling frequency in Hz, and vertical axis 602 records internuclear distance in Å. Dashed lines 603 and 604 demonstrate the ease in graphically converting a measured dipolar frequency (e.g. 200 Hz) into the corresponding internuclear distance in Angstroms (e.g. 2.5 Å). Also from Eqn. 1, it is apparent that given a smallest accurately measurable coupling frequency, D, the longest accurately measurable distance, R, can be determined. The currently smallest accurately measurable D is approximately 15 Hz. Thus, given $\gamma 1$ and $\gamma 2$, the longest accurately measurable distance is given approximately by Eqn. 2.

$$R = \left[ \frac{2\pi \gamma_1 \gamma_2 \hbar}{15 \text{ Hz}} \right]^{\frac{1}{3}} \quad (2)$$

As an example, for $^{13}C$ and $^{15}N$, the maximum measurable distance is approximately 6 Å (Hing et al., 1994, *Biochemistry* 33:8651–8661).

Values of the gyromagnetic ratio, $\gamma$, and maximum measurable distances, R, for other heteronuclear pairs, based on a 15 Hz dipolar coupling, are presented in Table 1. The units of the gyromagnetic ratio are Hz/Gauss.

TABLE 1

| MAXIMUM MEASURABLE INTERNUCLEAR DISTANCES | | | | |
|---|---|---|---|---|
| Nucleus ($\gamma$) | $^{13}C$ | $^{15}N$ | $^{31}P$ | $^{19}F$ |
| $^{13}C$(1070 Hz/G) | — | 6.0 Å | 9.3 Å | 12 Å |
| $^{15}N$(432 Hz/G) | 6.0 Å | — | 6.9 Å | 9.0 Å |
| $^{31}P$(1725 Hz/G) | 9.3 Å | 6.9 Å | — | 14.5 Å |
| $^{19}F$(4007 Hz/G) | 12 Å | 9.0 Å | 14.5 Å | — |

In more detail, the NMR techniques referred to here as dipolar-dephasing experiments comprise a class of solid-state NMR MAS techniques for measuring either homonuclear or heteronuclear dipolar interactions. They have been described in the literature. (Gullion et al., 1989, *Journal of Magnetic Resonance* 81:196–200; Gullion et al., 1989, *Advances in Magnetic Resonance* 13:57–83; Tycko et al., 1990, *Chemical Physics Letters* 173:461–465; Tycko et al., 1993, *Journal of Chemical Physics* 98:932–943; Sun et al., 1995, *Journal of Chemical Physics* 102:702–707; and Pan et al., 1990, *Journal of Magnetic Resonance* 90:330–340). These experiments generate time-domain signal data at discrete sample times, $S(t_i)$. Associated with this data are estimates of experimental error, $\sigma(t_i)$, which are obtained most preferably by performing several experiments and calculating $\sigma(t_i)$ as the standard deviation of the experimental data. Less preferably, the error can be estimated. These experiments typically generate data at the discrete times $n\tau_r$, $2n\tau_r$, $3n\tau_r$, ..., $Nn\tau_r$, where n is a small integer, typically smaller than 16, and $\tau_r$ is the time for one rotor cycle, and N is the maximum rotor cycle for which measurements are made. These discrete times are associated with the perturbing pulse sequences and carry the time-domain representation of the effects of the dipolar coupling. In these experiments, the signal at time 0 is known theoretically.

REDOR, as well as the other dipolar-dephasing experiments, are naturally at least two-dimensional experiments. One dimension is represented by incrementing of the number of rotor cycles; this dimension carries the dipolar coupling information. Another dimension is represented by the collection of the NMR free induction decay signal; this dimension carries chemical shift information. Both of these dimensions are functions of time, so we refer to the two-dimensional data set as a time-domain data set. Further, in certain cases the perturbing pulse sequence may have additional internal time parameters controlling its structure. These additional time parameters can be an additional dimension which carry additional information.

This invention is addressed in important aspects to the analysis of these one, two, and higher dimensional time-domain data sets. An important aspect of this analysis is transformation of spectral-domain data to time-domain data, called herein the "dipole-dephasing transformation." In one embodiment of this invention, the dipole-dephasing transformation is based on maximum entropy techniques. To apply this embodiment, nothing more need be known of the NMR experiment than how to calculate from spectral-domain data the corresponding time-domain data. Having such a method, the maximum entropy embodiment permits the calculation of the most likely spectral-domain data given observed time-domain data.

In another embodiment, the dipole-dephasing transformation is based on a direct analytic transform technique, known as the REDOR transform. This embodiment is applicable to all NMR experiments in which the dipole-dephasing angle has the functional form of Eqn. 3.

$$\Delta\Phi = 4\sqrt{2}\, nD\tau_r \sin\beta\cos\beta\cos\alpha \tag{3}$$

Here, D is the dipolar coupling, n is the number of rotor cycles, $\alpha$ and $\beta$ are the azimuthal and polar angles describing the orientation of the internuclear vector within the MAS rotor, and $\tau_r$ is the rotor period (the inverse of the MAS frequency). The rotational-echo double-resonance (REDOR) experiment has a dipolar dephasing of this form. Other experiments that possess the same form of dephasing include, but are not limited to, the homonuclear techniques of dipolar recoupling at the magic angle (DRAMA) (Tycko et al., 1990, *Chemical Physics Letters* 173:461–465; Tycko et al., 1993, *Journal of Chemical Physics* 98:932–943), dipolar recoupling with a windowless sequence (DRAWS) (Gregory et al., In 36th *Experimental Nuclear Magnetic Resonance Conference*; Boston, Mass., 1995; p. 289), melding of spin-locking and DRAMA (MELODRAMA) (Sun et al., 1995, *Journal of Chemical Physics* 102:702–707), and the symmetric version of transferred echo double resonance (TEDOR) (Hing et al., 1993, *Journal of Magnetic Resonance, Series A* 103:151–162; Hing et al., 1992, *Journal of Magnetic Resonance* 96:205–209), a heteronuclear technique.

Figure 2:
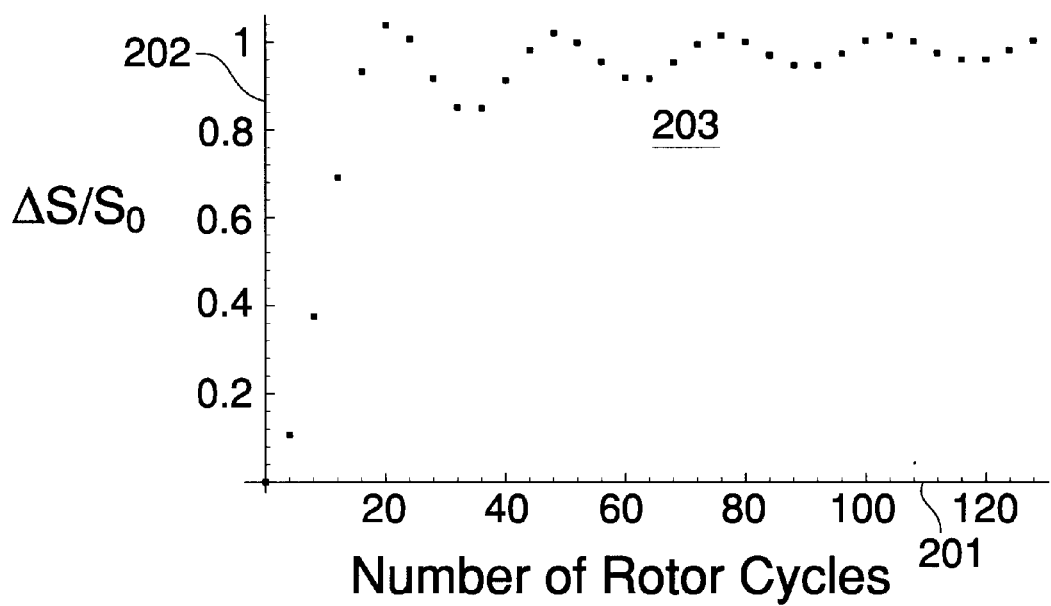
FIG. 2 illustrates an exemplary REDOR $\Delta S/S_0$ curve plotted as a function of the number of rotor cycles.
Figure 3:
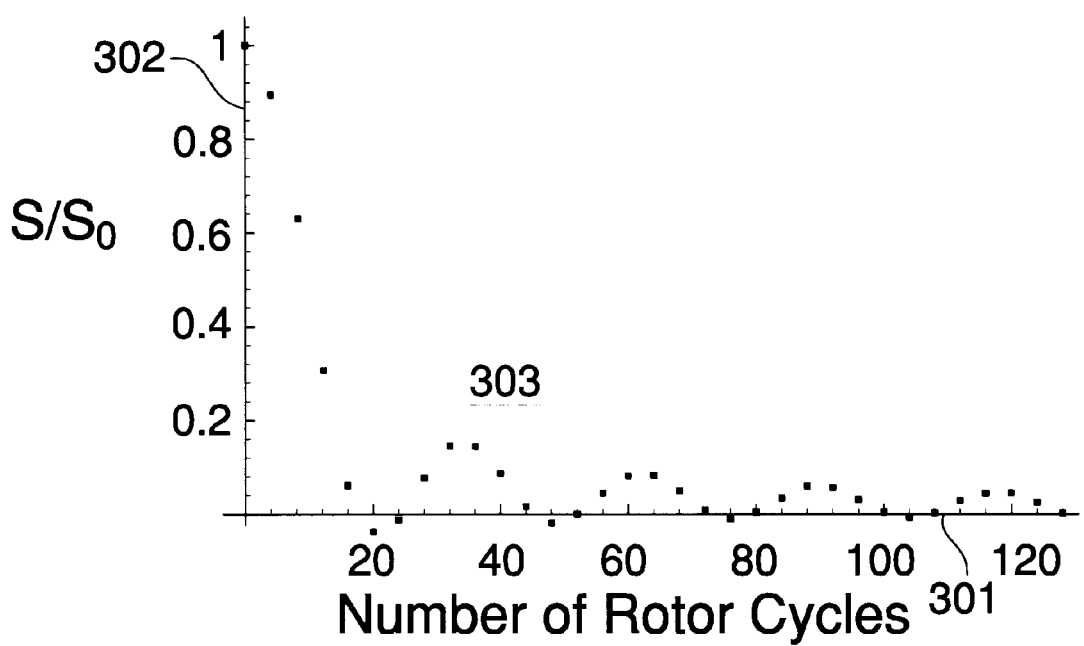
FIG. 3 illustrates an exemplary REDOR $S/S_0$ curve as a function of the number of rotor cycles.

As a more detailed illustration of these NMR techniques, consider rotational-echo-double-resonance (REDOR) and the generation of a one dimensional REDOR signal. In the REDOR experiment, two set of data, $S_0$, and $S$, are collected to arrive at a curve, $\Delta S/S_0$ (where $\Delta S$ is $S_0 - S$). Both data sets are collected at a specific magic angle spinning speed, referred to as the rotor speed. An exemplary pulse sequence for REDOR is illustrated in FIG. 1. In the $S_0$ experiment, refocusing RF (radio-frequency) pulses are applied to the observed channel (for example $^{15}$N) and no pulses are applied to the non-observed channel (for example $^{13}$C). In the absence of pulse on the non-observed channel, the heteronuclear dipolar coupling is averaged to zero by the magic angle spinning. A second set of data, termed S, is collected when RF pulses are applied to the observed and non-observed channel. The net effect of the RF pulses applied on the non-observed channel is to cancel the averaging of the heteronuclear dipolar coupling due to the magic angle spinning. In both the $S_0$ and S experiments, the pulses are applied synchronous with the rotor period. Thus $\Delta S/S_0$ curve, plotted as a function of the number of rotor cycles yields the REDOR curve, is responsive to the heteronuclear dipolar coupling. In the execution of the experiment, the individual $\Delta S/S_0$ points are collected at an arithmetically incremented number of rotor cycles. FIG. 2 illustrates data points 203 representing the results of a theoretical REDOR experiment, generated for a 400 Hz dipolar coupling, magic angle spinning at 5000 Hz, and collecting a $\Delta S/S_0$ point every 4 rotor cycles. Vertical axis 202 records the value of $\Delta S/S_0$, and horizontal axis 201 records the number of the rotor cycle. FIG. 3 illustrates $S/S_0$ data points 303, the inverse of the $\Delta S/S_0$ data points in FIG. 2. In that figure, vertical axis 302 records the value of $S/S_0$, and horizontal axis 301 records the number of the rotor cycle.

FIG. 1 illustrates one exemplary pulse sequence for the REDOR experiment. In that figure, curve 110 represents the RF radiation applied in the $^1$H frequency channel; curve 111 the RF radiation in the $^{15}$N frequency channel; and curve 112 that in the $^{13}$C channel. In more detail, and with reference to FIG. 1, the initial step in the pulse sequence for both the $S_0$ and S experiments is the application of $\pi/2$ pulse 101 to the $^1$H channel. Immediately following this pulse, continuous RF radiation 102 is applied to the $^1$H channel and the observed channel, here $^{15}$N, to transfer polarization from the $^1$H nuclei to the observed $^{15}$N nuclei via cross-polarization. The length of time that the cross-polarization rf fields are applied is determined empirically by searching for a cross-polarization maximum. Typically, the length of time that the cross-polarization rf fields are left on is on the order of 1 msec. For the remainder of the experiment, decoupling radiation 107 is applied in the $^1$H channel.

Next, collection of data for the $S_0$ experiment consists of performing a series of spin-echo experiments at an arithmetically increasing number of rotor cycles, n. The spin-echo is generated by the application of $\pi$ pulse 103 after n rotor cycles. Collection of FID 104, corresponding to the spin-echo, occurs at 2n rotor cycles. Since the REDOR experiment is performed while magic angle spinning, the $\pi$ pulse is applied synchronous with the rotor period. In the specific example put forth in this invention, n is incremented by 2, such that the data set consists of spin-echo FIDs collected at 4, 8, 12, . . . , 108, 112 rotor cycles.

Collection of data for the S experiment proceeds similarly to the $S_0$ experiment, a series of spin-echo experiments on the observed $^{15}$N channel, but with the perturbation of added rotor-synchronous $\pi$ pulses applied to the non-observed channel. The pulses on the non-observed channel in the S experiment are applied at every n/2 rotor period 105 and at multiples of the rotor period 106, with the exception of the rotor cycle when the pulse is applied on the observed channel and at the end of the last rotor cycle when data collection begins. The experiment proceeds with the collection of spin-echoes at the identical rotor cycles as in the $S_0$ experiment.

For one-dimensional processing the FIDs collected after the various number of rotor periods are Fourier transformed and the peak heights of selected observed channel chemical shift resonance is used as the S of $S_0$ value. These thus form two series of values, two values for each number of rotor periods. For two-dimensional processing all the data is retained. Thus there are two square arrays of data, one S array and one $S_0$ array. Each array has all the FIDs collected after the various numbers of rotor periods, and in turn each FID consists of the discrete time sampled free induction decay signal.

Data analysis according to this invention comprises primarily of associating a spectrum M(v) with the data S(t). The term v can refer either to a dipolar coupling, in which case the spectrum M(v) is in the frequency domain, or to a particular distance, in which case the spectrum M(v) is in the distance domain. Spectra in either domain are directly related by Eqn. 1. In either case, the spectral values represent densities in a distribution and therefore must be real, non-negative numbers.

In a preferred computer implementation, the spectrum $M(v)$ is represented as a set of values at a discrete series of points, either positions or frequencies, $v_0, v_1, \ldots, v_M$. In this discrete representation of $M(v)$, there an assumed maximum value $v_M$ beyond which $M(v)$ is zero. This maximum is preferably chosen much larger than any of the values expected to contribute to the experimental signal. It is possible to check a choice for a maximum by observing whether the final computed spectrum decays to zero before it reaches $v_M$. If not, the analysis can be repeated with a larger value for the maximum.

Standard quadrature techniques can be used to express integral over a continuous $M(v)$ as sums over values at these discrete points. That is, the integral of Eqn. 4 can be evaluated as the sum of Eqn. 5.

$$I = \int_0^\infty dv F(v) M(v) \tag{4}$$

$$I = \sum_{j=0}^M \Delta_j F(v_j) M_j \tag{5}$$

Here, $M_j$ is the value $M(v_j)$ of the spectrum at $v_j$, and the factor $\Delta_j$ is a distance measure that can be taken as $(v_{j+1} - v_{j-1})/2$. For the first position, it is preferable to use $(\Delta_0 = (v_1 - v_0)/2$, and for the last position, $\Delta_M = (v_M - v_{M-1})/2$. This choice corresponds to the trapezoidal rule. Other choices for the factors, $\Delta_j$, can be made according to Simpson's rule and Bode's rule. Preferably, the spacing between the discrete points is sufficiently small so that it performs as a reliable substitute for a continuous distribution. This condition may be checked in practice by doubling the number of points in the spectrum while decreasing the spacing between points and observing if there is a significant change in the final spectrum produced by the method. Preferably, the number of discrete points is at least 150 and more preferably it is 200 or more. Integrals over $S(t)$, or other quantities, can be processed similarly.

More generally, integrals of this invention can be evaluated by other quadrature techniques. For example, in such techniques $M(v)$ is represented as a sum of basis functions, such as $$M(v) = \sum_{j=0}^M M_j \phi_j(v), \tag{6}$$

and integrals, such as Eqn. 4, are evaluated as a sum of products, such as $$I = \sum_{j=0}^M M_j \Phi_j, \tag{7}$$

where $$\Phi_j = \int_0^\infty dv F(v) \phi_j(v) \tag{8}$$

are the quadrature weights. Such representations are well known to those of skill in the art (Press et al., 1994, *Numerical Recipes in C: The Art of Scientific Computing*, Cambridge Univ. Press, New York, chap. 4) Evaluation of integrals in this invention is adaptable to any such quadrature technique which closely approximates such integrals. The preferred representation described previously corresponds to taking the functions $\phi_j$ to be delta-functions centered at the points $v_j$.

Finally, as is known in the art, integrals, such as those of Eqns 4 and 6, and sums, such as those of Eqns. 5 and 7, are linear in the values of $M()$. That is multiplying all $M()$ values by a constant multiplies the integral or sum by the same constant, and the integral or sum of a sum of $M()$ and $M'()$ is the sum of the integral or sum of each of $M()$ and $M'()$ separately. For convenience herein, a function named 'F' can be represented simply by $F()$ in cases where the name of the bound or independent variable is not important.

Next, there must be a transformation that relates a spectrum $M(v)$ to its corresponding signal $S(t)$. For the maximum entropy embodiment it is preferable that this transformation be represented as a kernel. The kernel, denoted $K(t,v)$, is defined by Eqn. 9 or 10.

$$S(t) = \int_0^\infty dv K(t, v) M(v) \tag{9}$$

$$= \sum_{j=0}^M \Delta_j K(t, v_j) M_j. \tag{10}$$

The integral is truncated at a maximum value $v_M$ beyond which the spectrum is preferably taken to be zero. Alternately, and more generally, the integral of Eqn. 6 can be represented as a sum of products involving quadrature weights, which depend on the quadrature basis functions and the kernel $K(t,v)$.

When $v$ corresponds to a frequency, the kernel for a REDOR experiment is given by Eqn. 11.

$$K(t, v) = \frac{\pi}{2\sqrt{2}} J_{1/4}(\sqrt{2}\, vt) J_{-1/4}(\sqrt{2}\, vt) \tag{11}$$

When $v$ corresponds to a distance, it is given by Eqn. 12.

$$K(t, v) = \frac{\pi}{2\sqrt{2}} J_{1/4}(\sqrt{2}\, \Gamma t/v^3) J_{-1/4}(\sqrt{2}\, \Gamma t/v^3) \tag{12}$$

(Mueller, K. T., 1995, *Journal of Magnetic Resonance, Series A* 113:81–93). For the REDOR transform embodiment of this invention, the NMR experiment must be governed by a kernel of the form of Eqn. 11 or 12.

In the case of Eqn. 12, the kernel diverges to infinity in the limit that the distance $v$ approaches zero. This divergence is of no consequence, however, because nuclei in a molecule will be always be separated by a bonding distance of at least 1 Å or more. Thus, when using a distance-domain spectrum, it is preferable to use $v_0 = 0.5$ Å as a preferable lower limit for the first point in the discrete representation of the spectrum, and to take the spectrum to be zero for smaller distances. The relationship between $M(r)$ in the distance domain and $M(\omega)$ in the frequency domain is $$M(r) = 3\Gamma^{-4} M(\omega), \tag{13}$$

where $M(\omega)$ is evaluated at frequency $\Gamma/r^3$.

5.2. THE MAXIMUM ENTROPY EMBODIMENT

An embodiment of this invention for molecular structure determination, especially directed to the field of drug discovery, is based upon the principles of information theory. Information theory suggests choosing the spectrum that best reproduces the experimental data while also having the largest possible entropy relative to a predefined default, or expected, spectrum, $m(v)$. This choice is made by maximizing the quantity $\alpha E - X^2/2$ with respect to possible spectra and with respect to the regularization parameter α. Here, E is the entropy of a possible spectrum with respect to the default spectrum, and $X^2$ is a function that measures the closeness of the experimental data to that data predicted from the possible spectrum.

The only information about the NMR experiment needed by this embodiment is how to predict observed time-domain data from a spectral domain signal. If this can be done according to such equations as Eqns. 9 and 10, then all that is needed is a representation of the kernel, K(t,v). This representation can either be as a functional form or as a method for computing its numerical values.

The entropy E is given by Eqn. 14.

$$E = \int_0^\infty dv\{M(v) - m(v) - M(v)\ln[M(v)/m(v)]\}. \quad (14)$$

In a preferred discrete representation in which the spectrum is defined only at discrete values $v_j$, $m(v_j)$ is denoted $m_j$, $M(v_j)$ is denoted $M_j$. The entropy is now given by Eqn. 15.

$$E = \sum_{j=0}^{M} \Delta_j[M_j - m_j - M_j\ln(M_j/m_j)] \quad (15)$$

Here, the weights, $\Delta_j$, are those previously given according to the preferred trapezoidal rule quadrature technique. More generally, as described, it is possible to represent the integral of Eqn. 14 according to other quadrature techniques which are derived by representing M() and m() as sums of sets of basis functions other than the preferred delta-function basis. When $M(v)=m(v)$, the entropy takes on a maximum value of 0. The function $X^2$ is defined by Eqn. 16.

$$\chi^2 = \sum_{i=0}^{N} (S_i - S_i')^2 / \sigma_i^2. \quad (16)$$

Here, $S_i$ is the experimental measurement at time $t_i$ and $\sigma_i$ is the experimental error, or standard deviation, at time $t_i$. $S_i'$ is the data predicted from the spectrum, given in a continuous representation by Eqn. 17 and in a discrete representation by Eqn. 18.

$$S_i' = \int_0^\infty dv K(t_i, v)M(v) \quad (17)$$

$$= \sum_{j=0}^{M} \Delta_j K(t_i, v_j)M_j \quad (18)$$

The only information needed about the NMR experiment are the values of the kernels, or a method for computing these values, necessary to evaluate these equation. For a specified positive value of the regularization parameter α, a spectrum is obtained by maximizing $\alpha E - X^2/2$. In the preferred discrete representation, this maximization is over all non-negative values of each $M_j$.

Information theory also suggests a pair of self-consistent equations that are satisfied when a attains its most probable value. The first is the condition of classical maximum entropy given by Eqn. 19.

$$-2\alpha E = N_{good} \quad (19)$$

The second is the number of 'good' data points $N_{good}$ defined by Eqn. 20.

$$N_{good} = \sum_{j=0}^{M} \lambda_j / (\alpha + \lambda_j) \quad (20)$$

The values $\lambda_j$ are eigenvalues of the (M+1)×(M+1) matrix, C. This matrix in the preferred discrete representation is gaiven by Eqns. 21 and 22.

$$C_{jk} = \sqrt{M_j} \sqrt{M_k} \frac{\partial}{\partial M_j} \frac{\partial}{\partial M_j} \chi^2/2 \quad (21)$$

$$= \sqrt{M_j} \sqrt{M_k} \sum_{i=0}^{N} \Delta_j \Delta_K K(t_i, v_j)K(t_i, v_k)/\sigma_i^2 \quad (22)$$

The matrix C is the curvature of the function $X^2$ in the entropy metric.

Figure 15:
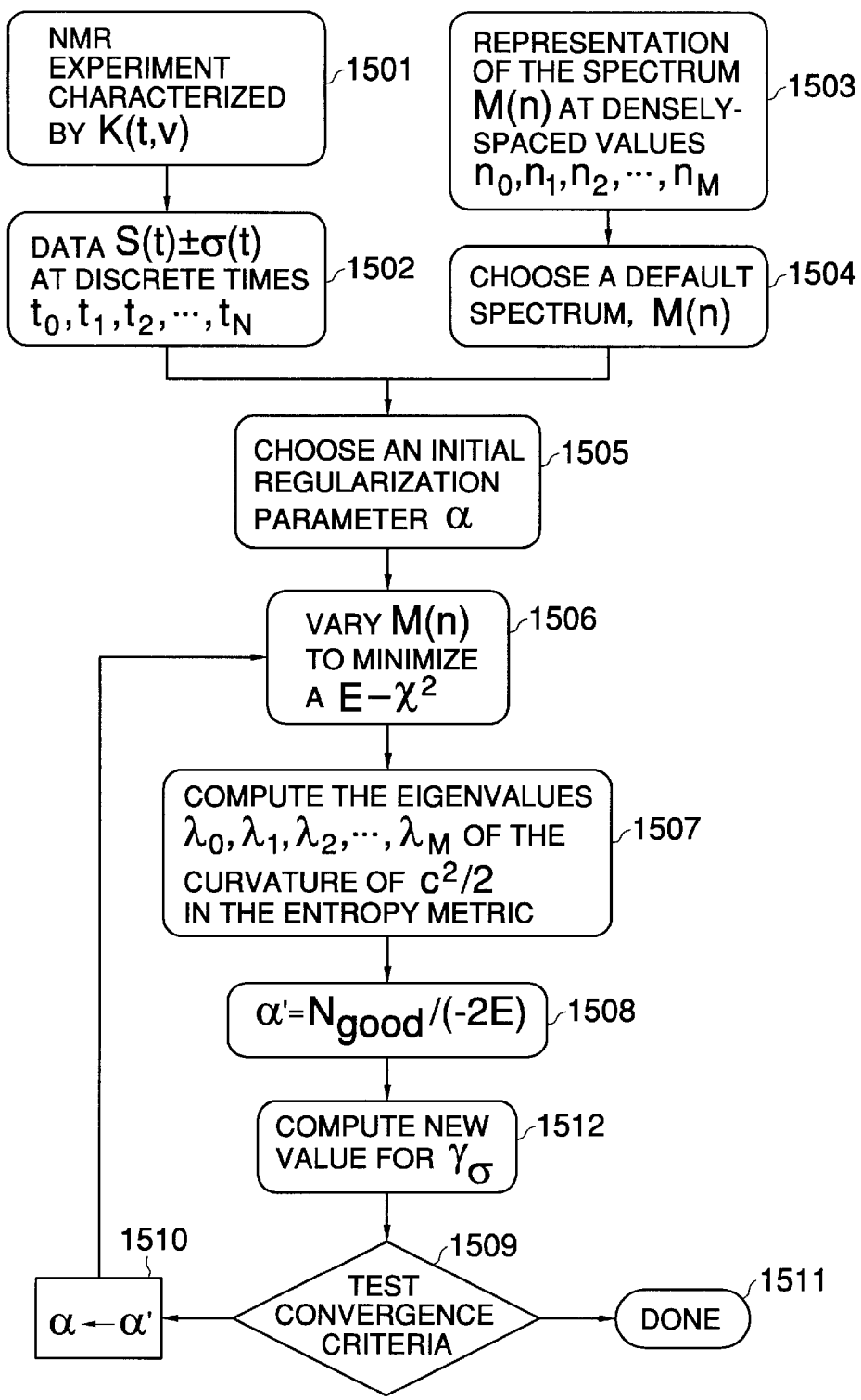
FIG. 15 illustrates a flow chart of the maximum entropy method.

Processing according to the maximum entropy embodiment is best understood with reference to FIG. 15, which illustrates a flowchart of the preferred implementation of the maximum entropy method. Note that in the current implementation step 1512 is not performed. In this implementation, the pair of self-consistent equations for the regularization parameter, α, are satisfied by iteration while the entropy maximizing spectrum for each value of α is determined by a direct maximization technique.

Several preliminary steps precede the principal calculation. Steps 1501 is an NMR experiment characterized by kernel K(t,v). It is performed at step 1502 to result in measurement data, $S_i=S(t_i)$, characterized by error estimates, $\sigma_i=\sigma(t_i)$. This embodiment is preferably applied to raw experimental data without any smoothing or baseline or offset correction. In the case of noisy data, an empirically determined amount of smoothing can be done to reduce artifacts in the resulting spectra, as is known in the art. Step 1503 selects a sufficiently dense discrete representation of the possible spectra. Step 1504 selects a default spectrum. In the preferred embodiment, the default spectrum is taken to be constant. Since this class of experiments also produces a normalized signal of 1 at time zero, and since $\lim_{t\to 0} K(t,v)=1$ for the preferred NMR experiments, the default spectrum, m(v), is preferably $1/v_M$, where $v_M$ is the largest frequency in the spectrum.

Finally, preliminary step 1505 chooses an initial value for the regularization parameter. Preferably, an initial value for α is chosen by maximizing $\alpha E - X^2/2$, as described subsequently, for a geometric series of values ranging from $N^{-3}$ to $N^3$, where N is the total number of data points. The initial value for α is that for which $N_{good}$ is closest to $-2\alpha E$. Preferably only a few evaluations are necessary, fewer than 20 and even fewer than 10. In an alternative preferred implementation, an initial value, for example 1, for α is arbitrarily chosen and initiates the iterative search for self-consistency. In this implementation, it is preferable to employ a convergence factor, as discussed subsequently, if the difference α'-α is large or if α<0 at any step.

The iteration begins a step 1505 which finds the spectrum maximizing $\alpha E - X^2/2$. Many maximization techniques are possible. The only requirement of the maximization technique is that it maintain positive values for the spectrum. The preferred technique employs the Davidon-Fletcher-Powell method, which requires the derivative of $\alpha E - X^2/2$ with respect to $M_j$. These derivatives are given by Eqn. 23.

$$(\partial/\partial M_j)(\alpha E - \chi_2/2) = \qquad (23)$$

$$-\Delta_j \ln(M_j/m_j) - \sum_{i=0}^{N}(S_i' - S_i)\Delta_j K(t_i, v_j)/\sigma_i^2.$$

A less preferred maximization technique is the Broyden-Fletcher-Goldfarb-Shanno method. This invention is adaptable to other maximization schemes, including those that require second derivatives. (Press et al. 1994, *Numerical Recipes in C: The Art of Scientific Computing*, Cambridge Univ. Press, New York, Chap. 10) It is also preferable to check after a maximization that each $M_j>0$. In actual use of the preferred technique, negative values have never been encountered. To avoid calculational instability, it is preferable every $M_j$ smaller than a cutoff value of, approximately, $10^{-60}$ is set to $10^{-60}$. This method is adaptable to any small cutoff value.

Step 1507 finds the eigenvalues of matrix C. Numerical technique for obtaining the eigenvalues of a real, symmetric matrix, like C, are well-known in the art and any one can be used. The preferred technique is the Jacobi method; a less preferred technique is the Givens-Householder method. (Press et al., Chap. 11)

Step 1508 then calculates a new value of a according to Eqn. 24 based on the current value of $\alpha$.

$$\alpha' = -(1/2E)\sum_{j=0}^{M}\lambda_j/(\alpha+\lambda_j). \qquad (24)$$

In this implementation, step 1512 is not performed.

Step 1509 test a convergence criterion on $\alpha$. The preferred criterion checks whether $|\alpha-\alpha'|$ is small relative to $\alpha$. Preferably, the ratio of these values is less than approximately $10^{-6}$. A less preferable convergence criterion is $10^{-4}$. If this criterion is met, the iteration is finished at step 1511 and the current value of the spectrum is the predicted best fit spectrum. If this criterion is not met, $\alpha$ is set to the new value $\alpha'$ and the process commences again at step 1506. For the next iteration step, it is preferable to use the old values of the spectrum as the starting point for the new calculation maximization. It is also preferable to add a small amount of random noise, preferably 1% relative to the value of the largest $M_j$, before starting the new iterations, in case the spectrum is trapped in a metastable maximum.

Alternatively, it is possible to use convergence factors to aid convergence if necessary. A preferable form for implementing a convergence factor is to replace $\alpha$ by $\alpha+f(\alpha'-\alpha)$, where the fraction $f$ is between 0 and 1.

Also alternatively, when the iteration is finished, a check can be performed on the likelihood that the experimental errors $\sigma_0, \sigma_1, \ldots, \sigma N$. The check is that the total number of data points, N, should equal the sum of $N_{good}$, the number of good data points defined by Eqn. 20, and $N_{bad}$, the number of bad data points defined as $X^2$.

$$N = N_{good} + N_{bad} = N_{good} + X^2 \qquad (25)$$

The sum $N_{good}+N_{bad}$ should be preferably within 10% of N. Alternative embodiment optimizing error estimates In an alternative and most preferable implementation of the maximum entropy embodiment, the regularization parameter $\alpha$ and the experimental error $\sigma_i$ at each experimental data point are jointly optimized. In this implementation, the error at each point is assumed to be of the form $\gamma_o\sigma_i$, where $\sigma_i$ are the initial estimates of the experimental error and $\gamma_o$ is an overall error scaling factor applied to each $\sigma_i$. The overall scaling factor $\gamma_o$ and the regularization parameter $\alpha$ are optimized simultaneously.

This optimization is also preferably performed iteratively according to the flowchart illustrated in FIG. 15. The preliminary steps 1501, 1502, 1503 and 1504 are performed substantially as in the previous implementation. Step 1505 initially sets $\alpha$ to a convenient value by the previously described methods. Alternately, any value, for example 1, in the range 1/N to N can be used. The initial value of $\gamma_o$ is also set to a convenient value. A preferred initial value for $\gamma_o$ is 1, which indicates that the error estimates are assumed initially correct.

Each iteration cycle performs, first, substantially the same calculations as the previous implementation. Step 1506 finds the spectrum maximizing $\alpha E - X^2/2$, and step 1507 computes the eigenvalues $\lambda_j$ of matrix C. Step 1508 sets the new value of $\alpha$ similarly to the previous implementation according to Eqn. 26.

$$\alpha = -(1/2E)N_{good}, \qquad (26)$$

where the entropy E is computed as previously. However, $N_{good}$ is differently defined according to Eqn. 27 and not according to Eqn. 20.

$$N_{good} = \sum_{j=0}^{M}\frac{\lambda_j}{\gamma_\sigma^2\alpha+\lambda_j}. \qquad (27)$$

Additionally, step 1512 is performed in this implementation to compute a new value for $\gamma_o$ according to Eqn. 28.

$$\gamma_\sigma = \sqrt{\chi^2/(N-N_{good})}. \qquad (28)$$

Eqn. 28 follows from the combination of the relationship $N=N_{good}+N_{bad}$ with the definition for the number of bad data points according to Eqn. 29.

$$N_{bad} = X^2/\gamma^2_\sigma, \qquad (29)$$

If $N_{good}>N$, which can occasionally happen at the start of iterations but not when the spectrum is close to convergence, the old value of $\gamma_o$ is retained for subsequent iterations.

As previously, test 1509 continues the iteration cycles until convergence criteria are satisfied. However, in this implementation the relative changes in the values of both $\alpha$ and $\gamma_o$ are preferably small. A preferable convergence criterion is a change in an iteration cycle of both $\alpha$ and $\gamma_o$ of 1 part in $10^{-6}$. A change of 1 part in $10^{-4}$ is less preferable.

The final, converged value of $\gamma_o$ indicates the likelihood that the initial error estimates are reasonable. Values of $\gamma_o$ between 0.3 and 3 are typical of initial error estimates that are reliable. In this case, the maximum entropy method provides no indication that the NMR experimental error estimates measurements, or the experiments themselves, need to be rechecked or redone. Values smaller than 0.09 or larger than 9 indicate that the initial error estimates are likely to be not reliable. In this latter case, the maximum entropy method suggests that at least NMR experimental error estimates measurements need to be rechecked or redone. Such a check can involve rechecking or redoing the experiments themselves.

Sec. 7 contains an implementation of both embodiments of the maximum entropy embodiment in computer program code in the C language. Various standard library routines are employed to obtain eigenvalues (routine eigrs), perform maximization (routine dfpmin), and compute parts of the REDOR-type kernel (routine bessjy). Exemplary routines are readily available (Press et al., 1992, *Numerical Recipes in C: The Art of Scientific Computing*, Cambridge University Press, New York, Chap. 6, 10, 11. Alternatively, other routines that perform substantially the same functions may also be used.

5.3. THE REDOR TRANSFORM EMBODIMENT

Another embodiment of this invention for molecular structure determination, especially directed to the field of drug discovery, is based upon inverting Eqns. 9 and 10 with the kernel of Eqns. 11 and 12. The transform inverting these equations converts time-domain NMR data to spectral-domain data representing the dipolar coupling frequency given by Eqn. 1. This transform, herein called the REDOR transform is given by Eqns. 30 and 31.

$$M(D) = \int_0^\infty dt\, k(t, D) \frac{S}{S_0}(t) \tag{30}$$

$$= \sum_{n=0}^{N} \Delta_j k(n\tau_r, D) \frac{S}{S_0}(n\tau_r) \tag{31}$$

Here, in the integral, D is the dipolar coupling, and k(t,D) is the kernel of the REDOR transform. The transform is applied to data in the form of $S/S_0$, which is the same as $1 - \Delta S/S_0$. In the discrete approximation, n is the rotor cycle number, N is the maximum rotor cycle number for which there is data, and $\tau_r$ is the inverse of the MAS spinning speed. The REDOR transform kernel is given by Eqn. 32.

$$k(t, D) = -(Dt)^2 J_{-\frac{5}{4}}(Dt) J_{-\frac{1}{4}}(Dt) - (Dt)\left(J_{-\frac{1}{4}}(Dt)\right)^2 + (Dt)\left(J_{\frac{1}{4}}(Dt)\right)^2 + \tag{32}$$
$$(Dt)^2 J_{-\frac{3}{4}}(Dt) J_{\frac{1}{4}}(Dt) + (Dt)^2 J_{-\frac{1}{4}}(Dt) J_{\frac{3}{4}}(Dt) - (Dt)^2 J_{\frac{1}{4}}(Dt) J_{\frac{5}{4}}(Dt)$$

Here, J is the cylindrical Bessel functions of first kind of the indicated fractional order. (Mueller et al., 1995, *Chemical Physics Letters* 242:535–542). Since this transform depends only on the functional form of the kernel of Eqns. 11 and 12, it is applicable to all NMR experiments measuring dipolar coupling and having the same functional form.

This embodiment includes the following steps in the preferred implementation. The first step constructs corrected $S/S_0$ data. These data are corrected to eliminate the effect of the observed nuclei, typically $^{15}N$ or $^{13}C$, at natural abundance with the same chemical shifts as the labeled sites. These natural abundance nuclei contribute unwanted signals to the $S_0$ and S data. The goal of the correction is to ensure that the $\Delta S/S_0$ curve goes to one at the largest rotor cycle number, and thus that the $S/S_0$ curve goes to zero. This is done by, first, converting the measured $S_0$ and S into $\Delta S/S_0$ data, then by multiplying the $\Delta S/S_0$ data with an appropriate factor to make them one at large rotor cycle number. After correction, $S/S_0$ are found from the relation in Eqn. 33.

$$S/S_0 = 1 - \Delta S/S_0 \tag{33}$$

FIG. 2 illustrates exemplary corrected $\Delta S/S_0$ data spanning a range from 0 to 130 rotor cycles. FIG. 3 illustrates the corresponding $S/S_0$ data points.

The next step smooths the $S/S_0$ data as necessary. As is known in the art, smoothing avoids unwanted artifacts due to noise in the signal, but too much smoothing broadens the spectrum. The exact amount of smoothing in any particular experiment can be determined by trial and error to be the least smoothing to avoid such artifacts. A preferred smoothing function is a 3-point Blackman-Harris function, which is given by Eqn. 34.

$$0.424 + 0.497\cos\left(\frac{\pi n}{N}\right) + 0.079\cos\left(\frac{2\pi n}{N}\right) \tag{34}$$

Here, N is the total number of rotor cycles, and n is the rotor cycle number of an individual data point. Other suitable smoothing functions include exponential line broadening, a Hamming window, given by Eqn. 35, $$0.54 + 0.46\cos\left(\frac{\pi n}{N}\right) \tag{35}$$

and a Kaiser window given by Eqn 36.

$$I_0\left\{\pi\sqrt{1 - (n/N)^2}\right\}[I_0(\pi)]^{-1} \tag{36}$$

Here, $I_0$ is the modified Bessel function of zero order.

Figure 4:
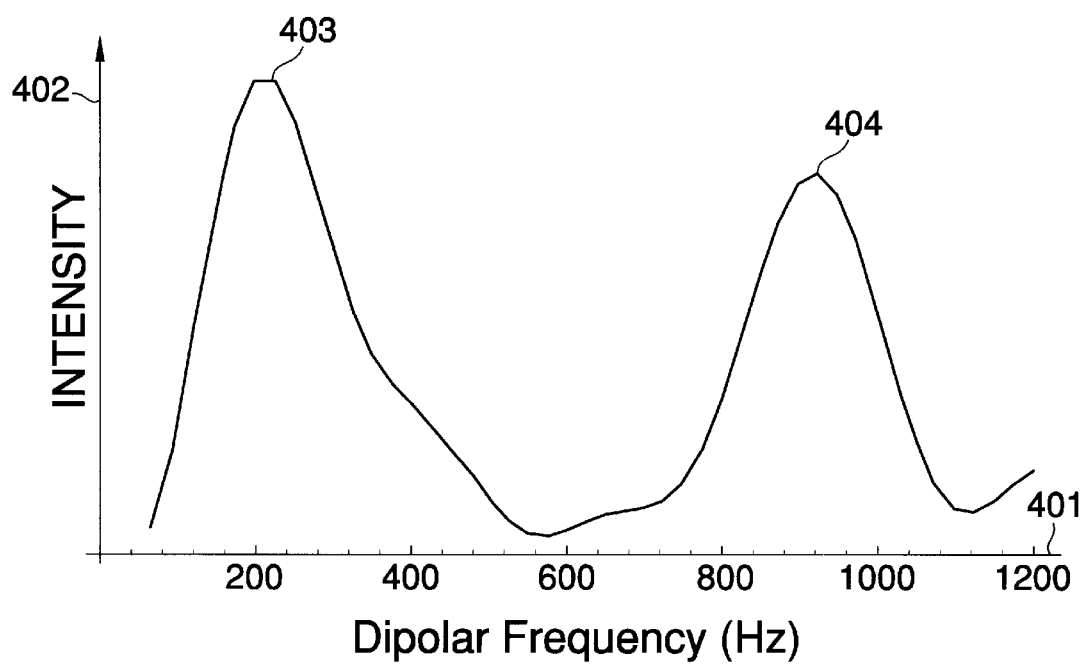
FIG. 4 illustrates a dipolar frequency spectrum obtained from a mixture of peptides by the REDOR transform embodiment.

The final steps calculate the spectrum by performing the approximate integral of Eqn. 31. A kernel table contains the values of the kernel of Eqn. 31 for the specific MAS spinning speed, the sampling increment (number of rotor cycles per point), and an appropriate range of dipolar couplings, which is from zero Hz to the frequency bandwidth of the spectrum. After transformation, the resultant spectrum of heteronuclear dipolar coupling versus intensity is plotted. FIG. 4 illustrates a spectrum of dipolar coupling obtained from experimental data. This figure is described in detail in the accompanying Examples section.

In a preferred implementation of this embodiment of the invention, the values of $S_0$ and S are then entered into and processed on the software program Mathematica (Wolfram Research, Inc.) (Wolfram, S., *Mathematica: A System for Doing Mathematics by Computer*; Second ed.; Addison-Wesley: New York, 1991) running on the Macintosh. Two Mathematica files, ONE-D-TRANSFORM, containing all of the described steps, and KERNEL, containing code for calculating the kernel table, are in Sec. 7. Other suitable methods of processing the data include programming in a language such as C.

Application of this method to heteronuclear and to homonuclear dipolar-dephasing methods other than REDOR will be apparent to those of skill in the art.

5.4. SYMMETRIC TEDOR

As discussed previously, signals from natural abundance nuclei are preferably removed from the NMR data, especially for the REDOR transform embodiment of this invention. It is preferable in this invention to use experimental designs that lessen or eliminate signals from natural abundance nuclei. Symmetric TEDOR is one such preferable experimental design that both eliminates natural abundance background signals and is amenable to the REDOR transform embodiment. TEDOR as it is generally practiced is not suitable for the REDOR transform embodiment because the functional form of the dipolar dephasing angle is not according to Eqn. 3 and is thus incorrect. However, the symmetric version of the TEDOR experiment has the correct functional form for the dipolar dephasing angle. Both embodiments of this invention are thus adaptable to symmetric TEDOR data.

Figure 7:
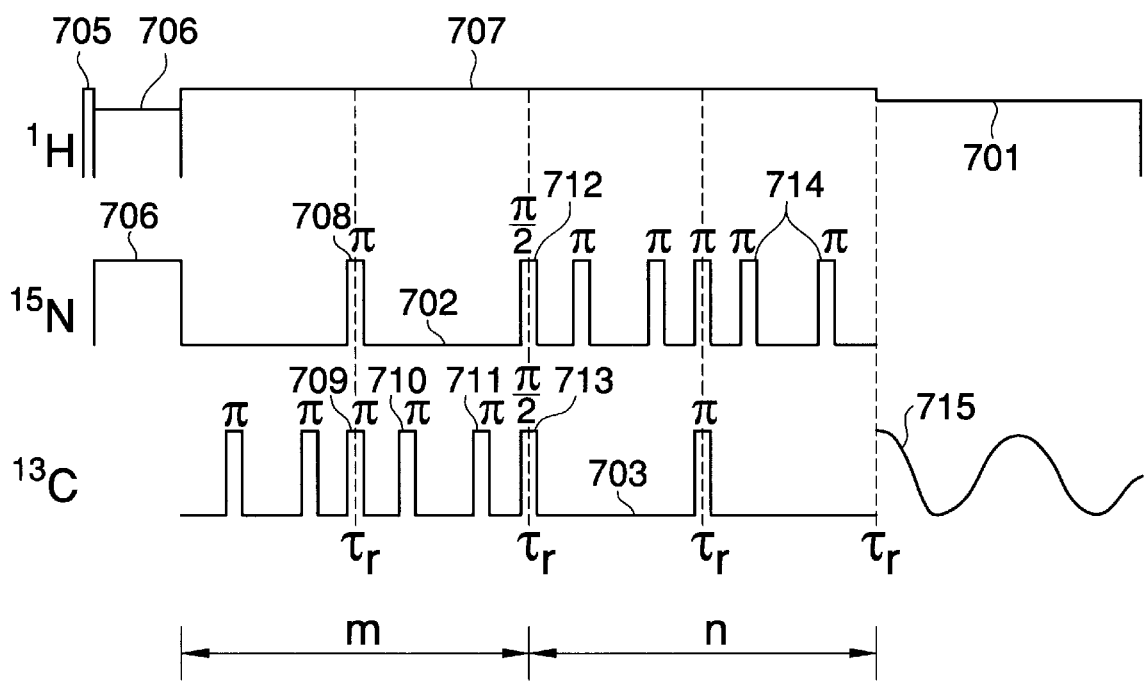
FIG. 7 illustrates a pulse-sequence for the TEDOR experiment.

FIG. 7 illustrates the pulse sequence used in the preferred embodiment of the symmetric TEDOR experiment. Other suitable TEDOR pulse sequences are known in the art. In that figure, curves 701, 702, and 703 represent the application of pulses of RF radiation in the $^1$H, $^{15}$N, and $^{13}$C frequency channels, respectively. In this exemplary TEDOR pulse sequence, $^{13}$C is the observed nucleus and $^{15}$N is the non-observed nucleus. It is apparent to those of skill in the art how to construct a similar pulse sequence in which $^{13}$C is the non-observed nucleus and $^{15}$N is the observed nucleus.

The TEDOR experiment collects only one set of data points, $S_k$, unlike the REDOR experiment which requires the collection of two complete data sets. The $S_k$ data set is acquired after additional rotor synchronous pulses are applied to both channels for varying numbers of cycles. Rotor cycle counts m and n in FIG. 7 represent the duration during which addition $\pi$ pulses are applied to the observed and to the non-observed channels, respectively. In the symmetric TEDOR experiment, the rotor cycle counts m and n are incremented by the same integer delta, for example k, in order to generate the separate observation data points, $S_k$. In the general TEDOR experiment m and n can be independently varied.

In detail, a TEDOR pulse sequence begins with the application of $\pi/2$ pulse 705 to the $^1$H channel. Immediately following this pulse, continuous RF radiation 706 is applied to the $^1$H channel and the non-observed channel to transfer polarization from the $^1$H nuclei to the non-observed nuclei via cross-polarization. The length of time that the cross-polarization rf fields are applied is determined empirically by searching for a cross-polarization maximum. Typically, the length of time that the cross-polarization rf fields are left on is on the order of 1 msec. For the remainder of the experiment, decoupling radiation 707 is applied in the $^1$H channel.

The experiment proceeds with the application of $\pi$ pulses 708 and 709 to both channels synchronous with and having the period of the MAS speed. Additional rotor synchronous $\pi$ pulses are applied to the observed channel, preferably two additional pulses, as at 710 and 711, per rotor period at ¼ and ¾ of the rotor period. The effect of the additional $\pi$ pulses applied to the observed channel is to generate a form of spin-coherence on the non-observed nuclei only when dipolar coupled to a heteronucleus. The additional pulses are applied for m rotor cycles. Then simultaneous $\pi/2$ pulses 712 and 713 are applied to both channels in order to transfer this spin-coherence to the dipolar coupled heteronucleus. After these pulses, which are effectively a polarization transfer, additional $\pi$ pulses, generally at 714, are applied to the non-observed channel for n cycles in the same manner as they were applied to the observed channel. These additional $\pi$ pulses convert the spin coherence into observable magnetization on the observed nuclei. The experiment and after m+n rotor cycles when FID 715 is collected. Collection of data for the symmetric TEDOR experiment consists of performing a series of experiments at rotor cycles counts, m+k and n+k, where m and n are constant and k is incremented.

The effect of this symmetric TEDOR pulse sequence is that the magnetization on the observed nuclei at the time that FID 715 is collected arises only from observed nuclei that are dipolar coupled to non-observed nuclei.

Therefore, there is no natural abundance contribution to the NMR data points. This data can be analyzed according to the REDOR transform embodiment without the need for the first step of correcting the data to eliminate the offset due to the natural abundance signal. The data can be transformed directly after any necessary smoothing. Alternately, the raw data can be analyzed according to the maximum entropy embodiment of this invention.

5.5. MULTIDIMENSIONAL ANALYSIS METHODS

It is advantageous to measure and process the NMR data according to the multidimensional methods described in this section in order to determine fully the nuclei contributing to observed dipolar coupling resonances. The dipolar dephasing data is inherently two-dimensional and is advantageously so processed. Further, NMR pulse sequences of this invention result in three-dimensional time-domain data that is advantageously processed according to three-dimensional methods.

In the following, the term dipolar dephasing spectral transform refers to the transform from time-domain data responsive to nuclear dipolar coupling to spectral data representing this coupling, either in the frequency domain or in the distance domain. This transform can be implemented either by the maximum entropy embodiment of this invention or, for appropriate pulse sequences, by the REDOR transform embodiment of this invention.

In this section, one, two, and three dimensional data generation and analysis methods are described. These are based on techniques in which the observed magnetization is responsive to the dipolar coupling of the observed nucleus, its chemical shifts, and, optionally, also to the chemical shifts of the non-observed nucleus. Such responsiveness is represented by independent dimension of time variability in the time-domain data. These are based on pulse subsequences for making the magnetization responsive to the dipolar coupling, for creating the spin-echo FID signal, and for transferring the magnetization from the non-observed nucleus to the observed nucleus. It will be apparent to those of skill in the art how these pulse subsequences can be combined in further ways to create time-domain NMR signals with higher dimensions of time variability, such as four, five, or more dimensions of time variability. Further, the described subsequences can be combined with other subsequences known in the art to craft time-domain NMR signals responsive to further aspects of the nuclear magnetic environment. Such higher dimensional signals can be analyzed by extensions of the methods described herein that will be apparent to those of skill in the art. In particular, time dimensions sensitive to dipolar couplings generated by dephasing pulse subsequences are preferably analyzed by applying the dipolar dephasing spectral transformation in that time dimension. Time dimensions sensitive to chemical shifts of various nuclei are preferably analyzed by applying Fourier transformations in that time dimension.

5.5.1. TWO-DIMENSIONAL ANALYSIS METHODS

It is advantageous to process and present NMR data in a two-dimensional fashion. Such a presentation correlates multiple dipolar coupling frequencies, and therefore multiple distances, to each chemically shifted spin (Ernst et al., 1990, *Principles of Nuclear Magnetic Resonance in One and Two Dimensions*, Clarendon Press, Oxford, Vol. 14:610). The preferred method of two-dimensional analysis of the time-domain dipolar-dephasing data is to transform jointly both time dimensions of the data by Fourier transforming the FID dimension, which carries chemical shift information, and dipolar dephasing spectral transforming the rotor cycle dimension, which carries dipolar coupling information. A resulting spectrum is typically presented as a two dimensional plot, one axis representing the frequency components (typically in ppm) in each FID signal collected during the REDOR experiment and the other axis representing the dipolar coupling frequency components (typically in Hz) at each chemical shift. Although the description herein is in terms of the REDOR experiment, adaptation of two-dimensional analysis methods involving the dipolar dephasing spectral transformation to heteronuclear and homonuclear dipolar-dephasing experiments other than REDOR will be apparent to one of skill in the art.

Two-dimensional analysis involves three principal steps, first, two-dimensional time-domain data collection, second, Fourier transforming the time-domain data, and third, dipolar dephasing spectral transforming the Fourier transformed data. The first two-dimensional time-domain data collection step is performed according to Sec. 5.1. The resulting time-domain data is a two-dimensional matrix of 2m×p values, where m is the number of $S_0$ (and S) points, and p the number of samples in each FID. The second step is Fourier transforming each FID, which may be done by any Fourier transform technique known in the art. (Press et al. 1992, *Numerical Recipes in C: The Art of Scientific Computing*, Cambridge Univ. Press, New York, Chap. 13) The Fourier transformed data is a two-dimensional matrix of 2m×p points, where m is the number of $S_0$ (and S) points, and p the number of points in the chemical shift spectra.

Finally, the third step is applying the dipolar dephasing spectral transform to the p sets of the 2m $S_0$ and S data points. First, each set of 2m $S_0$ and S values is converted to an $S/S_0$ curve. This data is input to the maximum entropy embodiment of the dipolar dephasing transform, in case that embodiment is selected, preferably without further manipulation. In case the REDOR transform embodiment is selected, the p $S/S_0$ sets of data are offset corrected, in the form $\Delta S/S_0$, as described in Sec. 5.3. For each of the $S/S_0$ set, particularly those that correspond to a peak in the chemical shift spectrum, a separate offset correction is preferably performed to take into account the difference in natural abundance at each particular site. Next the $S/S_0$ data sets are uniformly smoothed sufficiently, also as described in Sec. 5.3. Lastly the REDOR transform is applied to the p corrected smoothed data sets. After either embodiment of the dipolar dephasing spectral transformation the result data is a m×p matrix that is the two-dimensional spectrum having p heteronuclear dipolar coupling values correlated with m chemical shift values for the observed nucleus.

In summary, the difference between the one-dimensional processing as described above and the two-dimensional processing is that in one-dimensional processing all time-domain data is converted into only one set of $S/S_0$ data, each data value corresponding to the peak heights of the selected chemical shift resonance at varying rotor cycle numbers, which is then transformed. However, in two-dimensional processing, p sets of $S/S_0$ data are retained, each set corresponding to each point in the spectra, which are then all transformed. Thus, for each of the p points in the chemical shift spectra generated after the Fourier transform a separate dipolar coupling spectra is generated.

Figure 9A:
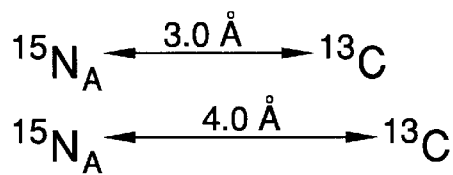
FIG. 9A, FIG. 9B and FIG. 9C illustrate an exemplary two-dimensional spectrum correlating chemical shift and heterocnuclear dipolar coupling.
Figure 9B:
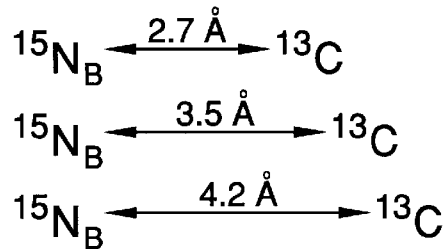
Figure 9C:
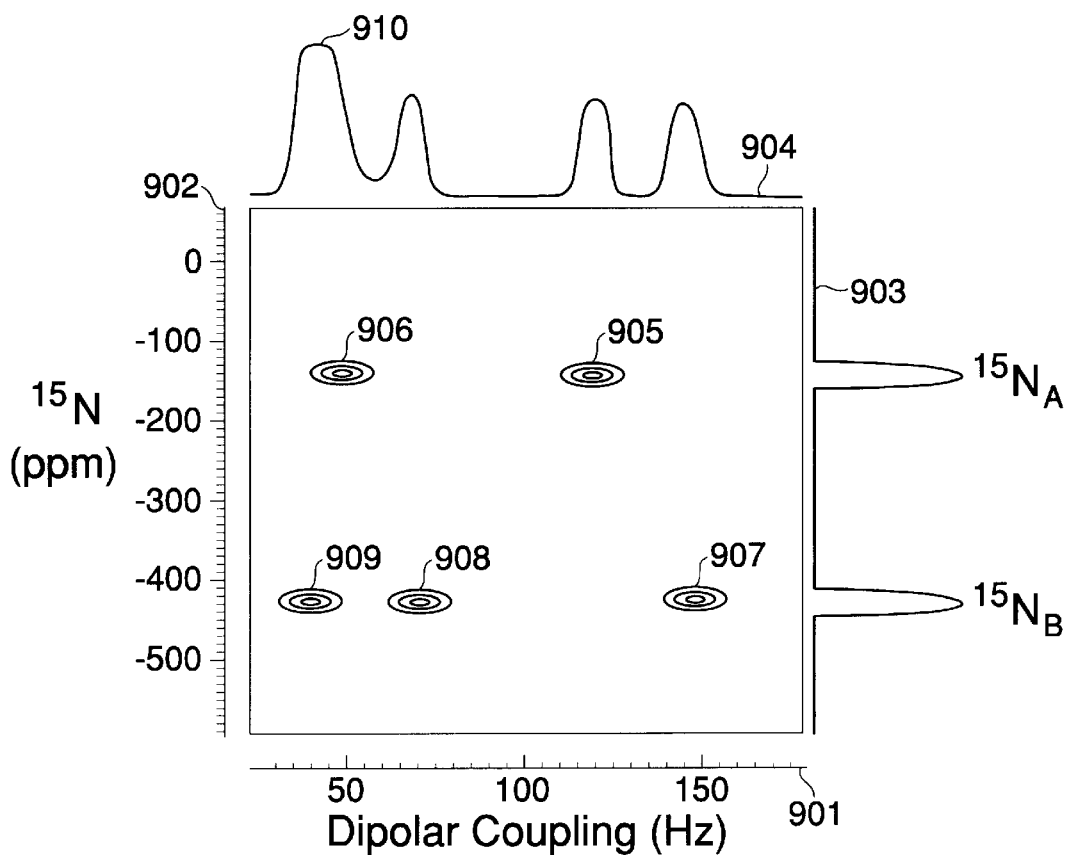

FIGS. 9A, 9B, and 9C is an exemplary illustration of two differently chemically shifted observed nuclei, $^{15}N_A$ and $^{15}N_B$, dipolar coupled to two and three $^{13}C$ heteronuclei that can be present in one molecule. FIG. 9A illustrates the dipolar coupling of $^{15}N_A$ with a chemical shift of approximately 140 ppm to two $^{13}C$ nuclei at 3.0 Å and 4.0 Å distances with coupling frequencies of approximately 120 Hz and 50 Hz, respectively, according to Eqn. 1. FIG. 9B illustrates the dipolar coupling of $^{15}N_B$ with a chemical shift of approximately 430 ppm to three $^{13}C$ nuclei at 2.7 Å, 3.5 Å, and 4.2 Å distances with coupling frequencies of approximately 150 Hz, 70 Hz, and 40 Hz, respectively, according to Eqn. 1. FIG. 9C illustrates the resulting two-dimensional spectrum. In that figure, horizontal axis 901 represents the dipolar coupling frequency, and axis 902 represents the chemical shift. Peaks 905 and 906 originate from the $^{15}N_A$ observed nucleus's dipolar couplings. Peaks 907, 908, and 909 originate from the $^{15}N_B$ observed nucleus's dipolar couplings. Spectrum 903 is the one-dimensional chemical shift spectrum. Spectrum 904 is the one-dimensional dipolar coupling spectrum that would be obtained ignoring information in the FID, such as by summing all FID data to generate $S/S_0$ data. It can be seen that in this one-dimensional spectrum peak 910 is an unresolved peak due to the overlap of dipolar coupling 906 of $^{15}N_A$ at 50 Hz and dipolar coupling 909 of $^{15}N_B$ at 40 Hz. Although unresolved in the one-dimensional spectrum, they are clearly resolved in the two-dimensional spectrum since they have clearly non-degenerate chemical shifts of 140 ppm and 430 ppm, respectively. Thus it can be appreciated how a two-dimensional spectra can help resolve ambiguities in the one-dimensional spectra.

5.5.2. QUASI THREE-DIMENSIONAL CORRELATION ANALYSIS METHODS

The one- and two-dimensional analysis methods have certain limitations which are overcome by further methods of this invention, the quasi and the full three dimensional analysis methods. One limitation of the one-dimensional and two-dimensional analysis methods is a lack of information relating to the site of the non-observed nuclei. From either one- or two-dimensional spectra alone, the identity of the non-observed nuclei giving rise to a particular peak in the dipolar spectrum is unknown. The NMR signals previously described are not responsive to characteristics of the non-observed nucleus. A further limitation of the previous analysis methods is an inability to distinguish the dipolar couplings of observed nuclei with degenerate chemical shifts. As is well known in the art, the observed nuclei with differing chemical shifts can be unambiguously identified. However, dipolar couplings of observed nuclei with degenerate chemical shifts cannot be distinguished.

Occasionally, degenerate observed nuclei and non-observed nuclei can be identified by considering the geometry of the molecule in view of the measured distances. In a particular molecule of limited complexity, a particular distance between nuclei of known types may uniquely identify the sites of the nuclei in the molecule. But when identification of these specific nuclei is ambiguous, the preferred embodiment of this invention involves analysis according to the further methods of quasi or full three dimensional analysis.

Quasi-three-dimensional analysis is a simplified form of three-dimensional analysis appropriate to situations in which all the dipolar couplings are resolved and not degenerate. In this situation, this method determines the chemical shift of both coupled heteronuclei. Quasi-three-dimensional analysis proceeds by measuring according to the previously described methods of this invention the two-dimensional spectrum for each nuclei of the pair of heteronuclei. In the exemplary and common case where a molecule of interest is labeled with $^{15}N$ and $^{13}C$, a two-dimensional spectrum of $^{15}N$ and a two-dimensional spectrum of $^{13}C$ is measured. Each two-dimensional spectrum correlates the chemical shift of the observed nucleus with its chemical shift. Further, peaks in both two-dimensional spectra that have the same dipolar coupling frequency represent the same pair of coupled nuclei. Therefore, the chemical shifts of both heteronuclei coupled with a particular coupling frequency can be determined from their individual two-dimensional spectra. As is known in the art, identification of molecular sites of the coupled nuclei proceeds from their chemical shifts.

Figure 10:
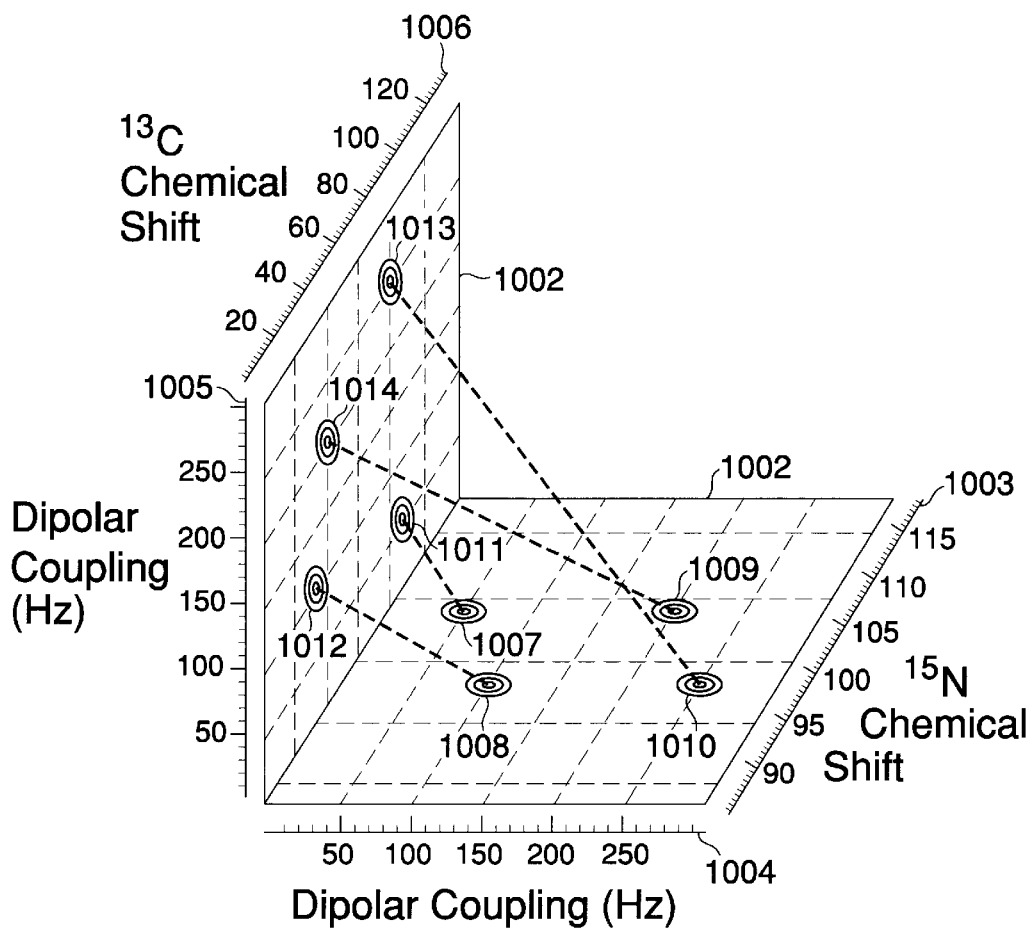
FIG. 10 illustrates quasi-three dimensional processing.

FIG. 10 is an exemplary illustration of the quasi-three-dimensional method applied to a molecule labeled with $^{15}N$ and $^{13}C$. $^{15}N$ two-dimensional spectrum 1001 is drawn horizontally, and $^{13}C$ two-dimensional spectrum is drawn vertically. Axis 1003 is the $^{15}N$ chemical shift, and axis 1004 is the correlated dipolar coupling frequency. similarly, axis 1006 is the $^{13}C$ chemical shift, and axis 1005 is the correlated dipolar coupling frequency. The particular labeling of the molecule of interest results in four pairs of dipolar coupled nuclei. In the $^{15}N$ two-dimensional spectrum, these are dipolar resonances 1007 at 50 Hz, 1008 at 100 Hz, 1009 at 200 Hz and 1010 at 250 Hz. The chemical shifts of the involved $^{15}N$ nuclei can be read from axis 1003, and the molecular sites identified from these chemical shifts. In the $^{13}C$ two-dimensional spectrum, resonance 1011 at 50 Hz represents the same coupled heteronuclear pair as resonance 1007. Similarly, resonances 1012, 1013, and 1014 represent the same coupled pair as resonances 1008, 1010, and 1009, respectively. This relationship is indicated by the lines joining the related resonances. The chemical shifts of the $^{13}C$ involved in the coupled pair can be read from axis 1006, and the molecular site identified. For example, the 250 Hz dipolar coupling frequency resonance involves a $^{15}N$ with a chemical shift of about 98 ppm and a $^{13}C$ of about 80 ppm. According to Eqn. 1 or FIG. 6, these heteronuclei are about 2.2 Å apart. In this manner, quasi-three dimensional analysis can uniquely determine the heteronuclei involved in non-degenerate dipolar couplings.

5.5.3. THREE-DIMENSIONAL ANALYSIS METHODS

Full three-dimensional experiment and analysis methods are the more preferred embodiment of the invention for the unambiguous site identification of both heteronuclei, even with degenerate chemical shifts or with degenerate dipolar coupling frequencies. The three-dimensional methods include heteronuclear and homonuclear pulse sequences that generate NMR signals with three time dimensions that are responsive to the chemical shifts of both dipolar coupled nuclei and also to the strength of the dipolar coupling. These methods further include analysis methods applying the dipolar dephasing spectral transform, in either embodiment as appropriate, to generate three-dimensional spectra correlating the dipolar coupling to the chemical shifts of the coupled nuclei. From the chemical shifts, the molecular identities of the coupled nuclei can be determined by methods known in the art.

Heteronuclear three-dimensional methods

Figure 11:
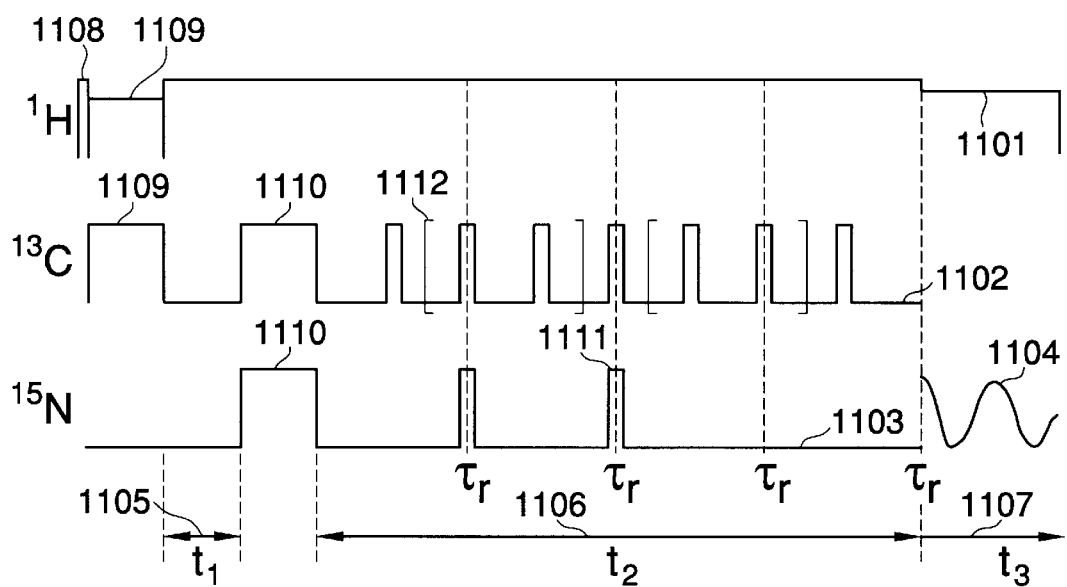
FIG. 11 illustrates an exemplary pulse sequence for a three-dimensional experiment correlating $^{13}C$ chemical shift, $^{15}N$ chemical shift, and dipolar coupling.

Heteronuclear three-dimensional pulse sequences generate NMR data responsive to three time dimensions, two of the three dimensions representing the chemical shifts of dipolar coupled nuclei and the third dimension representing the strength of the dipolar coupling. FIG. 11 illustrates an exemplary three-dimensional pulse sequence. In that figure, curve 1101 represents the RF radiation applied in the $^1H$ frequency channel; curve 1103 the RF radiation in the $^{15}N$ frequency channel; and curve 1102 that in the $^{13}C$ channel. In FIG. 11, $^{15}N$ is the observed nucleus and $^{13}C$ is the non-observed nucleus. it will be apparent to one of skill in the art how to modify the exemplary pulse sequence so that $^{13}C$ is the observed nucleus and $^{15}N$ is the non-observed nucleus.

FIG. 11 illustrates generally that the exemplary pulse sequence is divided into three time periods, $t_1$, $t_2$, and $t_3$, indicated generally at 1105, 1106 and 1107, all of which are independently variable to generate the three-dimensional time-domain NMR signal. In period $t_3$, the time evolution of the FID signal 1104 is, as is known to those of skill in the art, responsive to the chemical shift of the $^{15}N$ nucleus. In period $t_1$, the pulse sequence is designed so that the signal is responsive to the chemical shift of the $^{13}C$ nucleus. Finally in period $t_2$, the pulse sequence is designed so that the signal is responsive to the strength of the dipolar coupling between the $^{15}N$ and the $^{13}C$ nuclei. Any pulse sequences in periods $t_1$ and $t_2$ meeting these requirements can be used. In particular, any pulse sequence capturing dipolar coupling and having a method for computing the time-domain signal from the frequency-domain signal can be used in period $t_2$ in the case where the dipolar-dephasing spectral transform is implemented according to the maximum entropy embodiment of this invention. In the case where the dipolar-dephasing spectral transform is implemented according to the REDOR transform embodiment of this invention, the dephasing angle must evolve according to Eqn. 3 generating kernels of the form of Eqns. 11 and 12. Such pulse sequences includes the symmetric version of the TEDOR sequence described in Sec. 5.4. In FIG. 11 and in the following, the three-dimensional pulse sequence is described where period $t_2$ uses the REDOR pulse sequence of FIG. 1. This is without limitation, as this invention is adaptable to any of the previously described dipolar dephasing pulse sequences.

In more detail, and with reference to FIG. 11, for each time period $t_1$, the exemplary three-dimensional experimental method measures a complete two-dimensional REDOR spectrum in times periods $t_2$ and $t_3$. This involves, for each $t_1$, collecting a complete set of S and $S_0$ data points, and for each such data point, collecting sampled FID signal 1104. The complete two-dimensional spectrum is measured for time periods, $t_1$, extending from 0 out to a maximum time period in successive increments. The increments and the maximum time period are selected, as is well known in the art, such that the Nyquist sampling bandwidth fully encompasses the section of interest in the $^{13}C$ chemical shift spectrum. For each so selected $t_1$, the exemplary three-dimensional experiment begins with the application of $\pi/2$ pulse 1108 to the $^1H$ channel. Immediately following this pulse, continuous RF radiation 1109 is applied to the $^1H$ channel and the non-observed channel, here $^{13}C$, to transfer polarization from the $^1H$ nuclei to the non-observed $^{13}C$ nuclei via cross-polarization. This differs from the one- and two-dimensional experiments in which magnetization is directly transferred to the observed nucleus from the $^1H$. The length of time that these cross-polarization RF fields, and also the subsequently cross-polarization transfer from the $^{13}C$ to the $^{15}N$, are applied is determined empirically by searching for a cross-polarization maximum. Typically, the length of time that the cross-polarization rf fields are left on is on the order of 1 msec. After the polarization transfer from $^1H$, magnetization on the $^{13}C$ nuclei is allowed to evolve for time, $t_1$, under the influence of the $^{13}C$ chemical shift. In this time period the three-dimensional NMR signal becomes responsive to the non-observed nucleus' chemical shift. Following time period $t_1$, magnetization is transferred by cross-polarization RF fields 1110 from the non-observed $^{13}C$ to the observed $^{15}N$. Next, in time periods $t_2$ and $t_3$, the two-dimensional REDOR experiment is carried out as described in Sec. 5.1 and with reference to FIG. 1. Briefly, as previously explained, the $S_0$ experiment is carried out as a series of spin-echo experiments at an arithmetically increasing number of rotor cycles. Rotor synchronous $\pi$ pulse 1111 is applied at n rotor cycles on the observed channel and the FID is observed after 2n rotor cycles. The S experiment is a similar series of spin-echo experiments with the exception of the addition of rotor synchronous dephasing pulses, indicated generally at 1112, applied to the non-observed channel.

In order to obtain a spectrum of the non-observed nucleus with the proper quadrature detection, incrementing of $t_1$, is performed in conjunction with cycling of the phase of the cross-polarization pulse prior to the $t_1$, period in time proportional phase incrementation (TPPI) method (Ernst et al, 1990, *Principles of Nuclear Magnetic Resonance in One and Two Dimensions*; Clarendon Press: Oxford, Vol. 14, pp. 610). In the TPPI method, the phase of the cross-polarization pulse is incremented by 90° with each successive $t_1$, increment. To achieve an appropriate bandwidth for the $^{13}C$ spectrum in the TPPI method, $t_1$ should be incremented somewhere on the order of every 25 μsec. The TPPI method will yield an effective sampling rate of half the true sampling increment (therefore 25 μsec becomes 50 μsec) and thus a spectral bandwidth of 20 kHz. The choice of bandwidth for the spectrum of the non-observed nucleus is selected empirically. An important alternate embodiment of this invention employs 'the method of States' (Ernst et al, Vol. 14, pp. 610) instead of the TPPI method to obtain a spectrum of the non-observed nucleus with the proper quadrature detection.

The three-dimensional NMR signal is then processed according to the preferable three-dimensional analysis method. The complete three-dimensional NMR signal generated by the exemplary experiment is a three-dimensional matrix of k×2m×p points, where k is the number of $t_1$ points, m is the number of $S_0$ and S points, and p is the number of FID samples. Briefly, the three-dimensional analysis method, first, forms a series of complete two-dimensional spectra, one for each $t_1$ time value, and second, Fourier transforms along the $t_1$ dimension all corresponding points in this series of two-dimensional spectra. Thus, for each of the k $t_1$ values and according to the previously described methods, a two-dimensional matrix of 2m×p points is converted into a m×p matrix, which is the two-dimensional spectrum of heteronuclear dipolar coupling correlated to chemical shift of the observed nucleus. After this step, the intermediate data matrix is a three-dimensional matrix of k×m×p, where k is the number of $t_1$ points, m is the number of points in the heteronuclear dipolar coupling spectra, and p is the number of points in the chemical shift spectrum of the observed nucleus.

The final step of the three-dimensional analysis method is the conversion of the intermediate data into the three-dimensional spectrum by Fourier transformation along time dimension $t_1$. This Fourier transformation recovers the chemical shift spectrum of the non-observed nucleus. Prior to Fourier transformation, the data is labeled as real and imaginary according to the TPPI method in order that the resulting spectrum has the proper phase relationships. Thus, every two-dimensional spectrum corresponding to an odd numbered $t_1$ point is labeled as real data, and every two-dimensional spectrum corresponding to an even numbered $t_1$ point is labeled as imaginary data. The resulting data matrix is now effectively k/2×m×p, since the $t_1$ dimension was cut in half by the real and imaginary labeling. Finally, all m×p points in each two-dimensional spectra are Fourier transformed. The final three-dimension spectra is a k/2×m×p matrix, where k/2 is the number of points in the chemical shift spectrum of the non-observed nucleus, m the number of points in the heteronuclear dipolar coupling spectra, and p is the number of points in the chemical shift spectrum of the observed nucleus.

Figure 12:
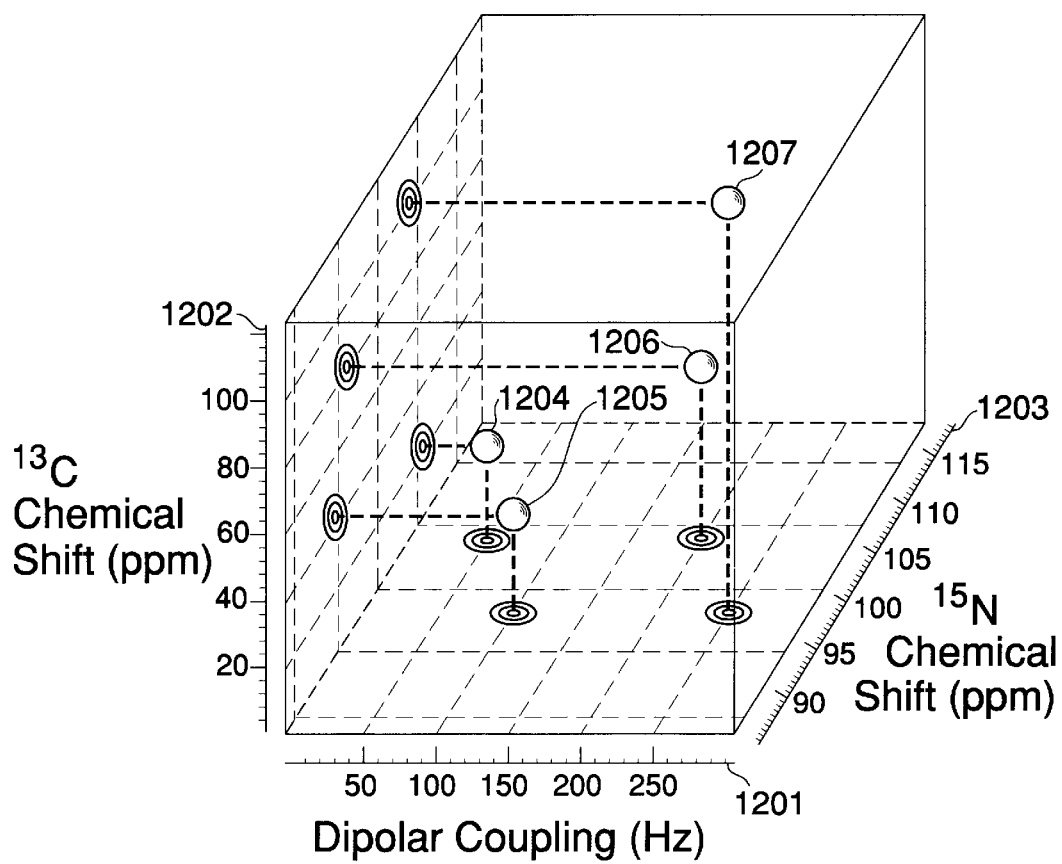
FIG. 12 illustrates an exemplary three-dimensional correlation of $^{13}C$ and $^{15}N$.

FIG. 12 illustrates a plot of an exemplary, sample three-dimensional spectrum for the previously described three-dimensional experiment. In that figure, along axis 1201 is plotted the dipolar coupling dimension of the three-dimensional matrix, along axis 1202 is plotted the chemical shift of the non-observed $^{13}C$ nuclei, and along axis 1203 is plotted the chemical shift of the observed $^{15}N$ nuclei. This plot illustrates the correlation of the chemical shift spectrum of the non-observed nucleus with the heteronuclear dipolar coupling frequency and with the chemical shift spectrum of the observed nucleus that is present in the three-dimensional spectrum. The molecule as labeled has generated four spectral resonances generally indicated at 1204, 1205, 1206, and 1207. For example, resonance 1207 occurs at a dipolar coupling frequency of 250 Hz, corresponding to a 2.2 Å internuclear separation, with a $^{13}C$ nucleus having a chemical shift of approximately 100 ppm coupled to a $^{15}N$ nucleus having a chemical shift of approximately 98 ppm. From this information, the molecular identities of the particular $^{15}N$ nucleus coupled to the particular $^{13}C$ nucleus can be determined by those of skill in the art.

Perspective plots, such as that of FIG. 12, in which the three dimensional spectrum is presented in perspective on a two dimensional surface are advantageous. Such perspective plots permit rapid apprehension of the structure and content of the three dimensional spectrum.

Homonuclear three-dimensional methods

Figure 13:
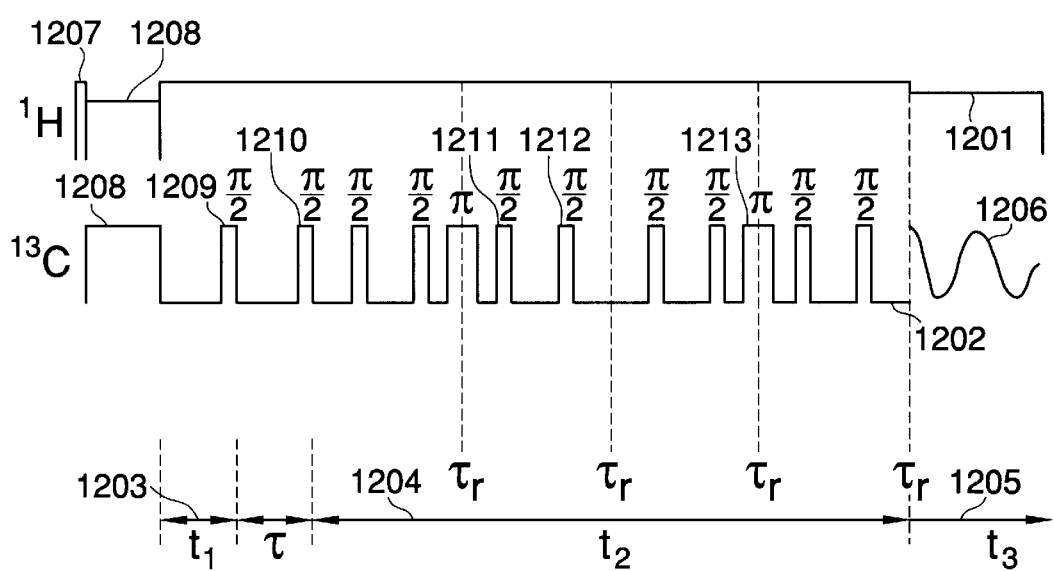
FIG. 13 illustrates a pulse sequence for a three-dimensional experiment correlating $^{13}C$ chemical shifts and homonuclear dipolar coupling.

The homonuclear three-dimensional methods apply analysis methods identical to the heteronuclear case to three-dimensional, time-domain NMR data generated from different pulse sequences. As in the heteronuclear case, the homonuclear three-dimensional pulse sequences generate NMR data responsive to three time dimensions, two of the three dimensions representing the chemical shifts of dipolar coupled nuclei and the third dimension representing the strength of the dipolar coupling. FIG. 13 illustrates an exemplary three-dimensional homonuclear pulse sequence. In that figure, curve 1201 represents the RF radiation applied in the $^1H$ frequency channel, and curve 1202 the RF radiation applied in the $^{13}C$ channel. In compounds of biological interest, and especially in those relevant to drug discovery, the observed nucleus is typically $^{13}C$, and in this section $^{13}C$ is described as the observed nucleus without limitation. It will be apparent to one of skill in the art how to modify the exemplary pulse sequence so that $^{15}N$ or any other NMR active nucleus is the observed nucleus.

FIG. 13 illustrates generally that the exemplary homonuclear pulse sequence is also divided into three time periods, $t_1$, $t_2$, and $t_3$, indicated generally at 1203, 1204 and 1205, all of which are independently variable to generate the three-dimensional time-domain NMR signal. In period $t_3$, the time evolution of the FID signal 1206 is, as is known to those of skill in the art, responsive to chemical shifts of $^{13}C$ nuclei. In period $t_1$, the pulse sequence is designed so that the signal is also responsive to chemical shifts of $^{13}C$ nuclei. Finally in period $t_2$, the pulse sequence is designed so that the signal is responsive to the strength of any dipolar couplings between $^{13}C$ nuclei. Any pulse sequences in periods $t_1$ and $t_2$ meeting these requirements can be used. In particular, any pulse sequence capturing dipolar coupling and having a method for computing the time-domain signal from the frequency-domain signal can be used in period $t_2$ in the case where the dipolar-dephasing spectral transform is implemented according to the maximum entropy embodiment of this invention. In the case where the dipolar-dephasing spectral transform is implemented according to the REDOR transform embodiment of this invention, the dephasing angle must evolve according to Eqn. 3 generating kernels of the form of Eqns. 11 and 12. In FIG. 13 and in the following, the three-dimensional pulse sequence is described where period $t_2$ uses the dipolar recovery at the magic angle (DRAMA) pulse sequence (Tycko et al., 1990, Chemical Physics Letters 173:461–465; Tycko et al., 1993, Journal of Chemical Physics 98:932–943). This is without limitation, as this invention is adaptable to any of the homonuclear dipolar dephasing pulse sequences known in the art.

In more detail, and with reference to FIG. 13, for each time period $t_1$, the exemplary three-dimensional experimental method measures a complete two-dimensional homonuclear spectrum in times periods $t_2$ and $t_3$. This involves, for each $t_1$, collecting a complete set of dipolar dephasing time-domain data points, and for each such data point, collecting sampled FID signal 1206. The complete two-dimensional spectrum is measured for time periods, $t_1$, extending from 0 out to a maximum time period in successive increments. The increments and the maximum time period are selected, as is well known in the art, such that the Nyquist sampling bandwidth fully encompasses the section of interest in the $^{13}C$ chemical shift spectrum. For each so selected $t_1$, the exemplary three-dimensional experiment begins with the application of π/2 pulse 1207 to the $^1H$ channel. Immediately following this pulse, continuous RF radiation 1208 is applied to the $^1H$ channel and the non-observed channel, here $^{13}C$, to transfer polarization from the $^1H$ nuclei to the observed $^{13}C$ nuclei via cross-polarization. The length of time that these cross-polarization RF fields are applied is determined empirically by searching for a cross-polarization maximum. Typically, the length of time that the cross-polarization rf fields are left on is on the order of 1 msec. Incrementing $t_1$ is done in conjunction with cycling of the phase of the cross-polarization RF pulse prior to the $t_1$ period according to time proportional phase incrementing (TPPI) method. Alternatively, this invention is adaptable to the 'method of States' instead of the TPPI method in order to obtain a spectrum of the non-observed nucleus with the proper quadrature detection.

After the polarization transfer from $^1H$, magnetization on the $^{13}C$ nuclei is allowed to evolve for time, $t_1$, under the influence of the $^{13}C$ chemical shift. In this time period the three-dimensional NMR signal becomes responsive to that chemical shift. In order to terminate the $t_1$ evolution of the magnetization, it is flipped along the z-axis in the laboratory frame, that is parallel to the applied, static magnetic field. This is accomplished by applying two π/2 pulses separated by time interval τ, chosen to be longer than the transverse relaxation $T_2$ of the $^{13}C$ nuclei. Typical values for τ are on the order of 1 msec. Next, the two-dimensional homonuclear spectrum is measured by applying the DRAMA pulse sequence for a variable number of rotor cycles, from 0 out to a maximum number m of rotor cycles. After this pulse sequence, FID signal 1206 is sampled at p time positions. The DRAMA pulse sequence includes two rotor synchronous π/2 pulses applied every cycle at 0.25, pulse 1211, and 0.75, pulse 1212, in the cycle. Additionally, at every other rotor cycle, pulses 1213 are applied at the start of the cycle.

The exemplary pulse sequence of FIG. 13 generates a three-dimensional matrix of k×m×p points, where k is the number of $t_1$ points, m is the maximum number of rotor cycles during which the DRAMA pulse sequence was applied, and p is the number of FID samples. This data is processed by the same methods as for the heteronuclear case to result in a three-dimensional spectrum of k/2×m×p points, where k/2 is the number of points in the chemical shift spectrum of one dipolar coupled observed nucleus, m is the number of points in the heteronuclear dipolar coupling spectra, and p is the number of points in the chemical shift spectrum of the other dipolar coupled observed nucleus.

The resulting three-dimensional spectrum correlates the chemical shift spectrum of both dipolar coupled nuclei with the homonuclear dipolar coupling frequency. It can be plotted in a three-dimensional perspective fashion as for the heteronuclear case. From this information, the molecular identities of the coupled nuclei as well as the distance of those nuclei can be determined. Each coupled homonuclear pair gives two resonances, unless the nuclei have degenerate chemical shift. In the degenerate case, there is a single resonance.

Although homonuclear dipolar dephasing pulse sequences have been described here only in their application to three dimensional analysis, such pulse sequences have application to analyses of other dimensions. For example, by omitting the $t_1$ periond, the pulse sequence described herein generates two dimensional data advantageously analyzed by the previously described two dimensional methods. Such two dimensional data can also be analyzed, as previously described, to yield simply a one dimensional spectrum. Thus homonuclear dipolar dephasing pulse sequences can be applied to generate data for analysis by one, two, and three dimensional methods. Additionally, as described, this invention is not limited to data generated by the DRAMA pulse sequence. Any dipolar dephasing homonuclear pulse sequence can be used to generate date for analysis of any dimensionality.

5.6. SAMPLE LABELING METHODS

The methods of this invention permit measurement of internuclear distances and assignment of measured distances to identified nuclei in complex samples. Complex samples are those that contain a plurality of chemically shifted observed nuclei dipolar coupled to other chemically shifted nuclei. This invention is advantageously applied to any complex sample. In a particular application to biological samples of interest, NMR active nuclei are generally introduced through selective labeling. Experiments performed on multiply labeled samples shorten the time required for molecular structure determination. NMR sample preparation, therefore, preferably includes three principal steps, choice of a labeling strategy, synthesis of samples labeled according to that strategy, and preparation of samples for an NMR experiment according to this invention.

Although this invention is generally applicable to any simple or complex sample, in this section sample preparation is described without limitation for a particular case of interest in biology, and especially, in drug design. This case is the determination of the structure of organic molecules, such as molecule screened from a diversity library to have a pharmacological property of interest. This invention is applicable to all such organic diversity libraries and is described without limitation with respect to peptides. For such samples, this section describes general labeling protocols, methods of synthesis, and sample preparation. To extract the most information on molecular structure most rapidly and with least expense of labeled amino acids preferably requires careful labeling. Labeling should preferably be done to obtain the most information possible about particular molecular regions of interest. Such regions include, but are not limited to, regions where the peptides bind to a target of interest, such regions perhaps defining a pharmacophore. In such regions of interest, general labeling strategies include backbone labeling and side chain labeling. Backbone labeling, for example, labels the amide nitrogen atom (N) of one amino acid and one of the backbone carbon atoms (C) of a next adjacent or more distant amino acid. Backbone labeling is typically done in the backbone in the vicinity of a molecular region of interest of a potential pharmacophore. Side chain labeling strategies vary with the chemical structure of the region of interest. If a side chain N is available, an adjacent side chain or backbone C can be labeled. If not, the side chain C and backbone amino N can be labeled. Side chain labeling is preferably done on side chains in the molecular region of interest, or candidate pharmacophore. In summary, preferred labeling in a molecular region of interest is either a backbone N and a nearby backbone C or a side chain C or, if available, a side chain N and an adjacent or nearby side chain C.

It is often advantageous to label multiple pairs of nuclei in an NMR experimental sample. Samples with two or more labeled nuclear pairs can be prepared either by mixing molecules with one labeled distance in each sample or by labeling multiple distances in one molecule. Molecules with multiple labeled distances can also be mixed in one NMR sample. In the case of multiple labeled distances in one molecule, the choice of where to place the multiple labels follows the methods described above, with the added constraint that homonuclear couplings be minimized. As is well known in the art, homonuclear couplings can be minimized or eliminated by following certain guidelines. The first guideline is that homonuclear spins, if placed on one molecule, should be far removed from one another in space. Separating homonuclear spins by approximately 2–3 times the heteronuclear distance to be measured is sufficient. At this distance homonuclear dipolar couplings are minimized since they are averaged to zero by magic angle spinning and also decay with an $r^{-3}$. A second guideline is that homonuclear spins can be placed close to one another if their chemical shifts are degenerate, or if the chemical shift difference between spins is greater than the dipolar coupling between the spins. Under these conditions, homonuclear dipolar coupling is averaged to zero by the MAS. A third guideline is that for spins that are chemically shifted from one another, yet close to one another in space, the condition of rotational resonance must be avoided. Rotational resonance, or magic angle spinning at a frequency that matches integer multiples of the chemical shift frequency difference between two homonuclei, prevents the averaging to zero of magic angle spinning.

In the case where a multiply labeled peptide sample results from mixing labeled peptides, to avoid unwanted intermolecular dipolar couplings, experiments are preferably not performed on the pure, labeled peptide. To minimize intermolecular dipolar couplings, the labeled peptides are preferably diluted in a matrix of either unlabeled peptide or another inert material, such as milk protein. Labeled materials are preferably diluted to approximately 10% by weight of the total material. At this level of dilution, intermolecular dipolar couplings are minimized. However, dilution of the peptide decreases the signal-to-noise resulting since the fewer labeled nuclei are present in the sample to generate measured NMR signals. Thus dilution should be just enough to minimize intermolecular dipolar couplings but not enough to adversely effect the signal-to-noise ratio.

The short peptides contemplated in this application of the methods of this invention can be synthesized by any method of protein synthesis known in the art from commercially available labeled peptides. (Peptide Chemistry, a Practical Textbook, 2nd Ed., M. Bodanszky, Springer-Verlag, New York, 1993.) Examples Sec. 6.4 describes an exemplary synthesis of a short peptide attached to a synthesis resin using a combination of standard tBOC and FMOC techniques.

A labeled peptide can be prepared as an NMR sample by several techniques. A sample synthesized on a synthesis resin at a sufficient dilution to minimize intermolecular dipole couplings can be used as synthesized. Alternatively, the sample can be cleaved from the synthesis resin and mixed with unlabeled material in a similar sufficient dilution. The preferred technique for sample preparation binds the peptide to its protein target prior to NMR measurement. In cases where samples consist of non-peptide molecules capable of binding to protein targets, the preferred sample preparation for such molecules also binds them to their protein targets. For example, such non-peptide molecules include those from organic diversity libraries. Further, this invention is applicable to targets other than protein. Such targets include nucleic acids, lipids, proteoglycans, and so forth. When the sample is prepared by this method, measured distances are assured to be those of the active structure of the bound peptide. This is an important consideration because, as is known in the art, the structure of a bound molecule is often modified upon binding to a target protein. To prepare a sample of a peptide bound to its target protein, a solution of the protein is titrated with a 3:1 molar excess of peptide. Upon binding of the peptide to the protein, the excess peptide is removed by washing with a 100-fold excess volume of water. Also, samples with different labelings can be mixed for NMR measurement either attached to synthesis resins, free, or bound to their respective targets.

A final preferable step in NMR sample preparation is quick freezing and lyophilization, where appropriate because the sample is prepared as an aqueous solution. The active structure is preferably maintained by addition of lyoprotectant sugars to an aqueous solution prior to freezing and lyophilization (Dabulis et al., 1993, *Biotechnology Bioengineering* 41:566–571; Burke et al., 1992, *Journal of Biological Chemistry* 267:20057–20064). For the sample to be suitable for NMR measurements, the mixture is quick-frozen prior to lyophilization. Quick freezing is accomplished by freezing the solution in small aliquots of 200 µL volume (Christensen et al., 1993, *Biochemistry* 32:2868–2873; Lazo et al., 1993, *Biochemical and Biophysical Research Communications*, 197:904–909) in liquid nitrogen. After lyophilization, the resultant lyophilized powder is ready for NMR experiments. For an accurate representation of the biologically active structure, it is known in the art that the resulting lyophilate is preferably partially hydrated (Lazo et al., 1993, *Biochemical and Biophysical Research Communications* 197:904–909; Dabulis et al., 1993, *Biotechnology Bioengineering* 41:566–571; Burke et al., 1992, *Journal of Biological Chemistry* 267:20057–20064; Desai et al., 1994, *Journal of the American Chemical Society* 116:9420–9422; and Griebenow et al., 1994, *Proceedings of the National Academy of Science* 92:10969–10976).

The lyophilized or partially hydrated lyophilized sample is suitable for NMR measurement.

In the preferred technique of sample preparation where the peptide is bound to a target protein, the target protein is needed in a quantity sufficient for the solid state NMR experiments. The quantity of protein needed is determined principally by the sample volume of the MAS rotor. The Chemagnetics standard 5 mm Pencil rotor has a volume of 0.14 cubic centimeters; thin-walled rotors have a volume of 0.21 cubic centimeters. The total mass of a material that will pack into the two versions of the rotor are approximately 100 mg and 150 mg for the standard and thin-walled rotors, respectively.

Target proteins can be prepared by the following exemplary methods from their cDNAs. Other expression systems known in the art can also be employed to synthesize target proteins. cDNAs for target proteins of interest can be obtained by standard methods known in molecular biology, (Recombinant DNA, 2nd Edition, J. D. Watson et al., W. H. Freeman & Co., New York, 1992). Target proteins, for example ras, raf, vEGF and KDR, can be expressed in the Pichia pastoris expression system (Invitrogen, San Diego, Calif.) and as glutathione-S-transferase (GST)-fusion proteins in E. coli (Guan et al., 1991, Analytical Biochemistry 192:262–267).

For the Pichia pastoris expression system, the cDNAs of target proteins are cloned in the Pichia expression vectors pHIL-S1 and pPIC9 (Invitrogen). Polymerase chain reaction (PCR) is used to introduce six histidines at the carboxy-terminus of these proteins, so that this His-tag can be used to affinity-purify these proteins. The recombinant plasmids are used to transform Pichia cells by the spheroplasting method or by electroporation. Expression of target proteins is inducible in Pichia in the presence of methanol. The cDNAs cloned in the pHIL-S1 plasmid are expressed as a fusion with the PHO1 signal peptide and hence are secreted extracellularly. Similarly cDNAs cloned in the pPIC9 plasmid are expressed as a fusion with the α-factor signal peptide and hence are secreted extracellularly. Thus, the purification of target proteins is simpler as it merely involves affinity purification from the growth media. Purification is further facilitated by the fact that Pichia secretes very low levels of homologous proteins and hence the heterologous protein comprises the vast majority of the protein in the medium. The expressed target proteins are affinity purified onto an affinity matrix containing nickel. The bound target proteins are then eluted with either EDTA or imidazole and are further concentrated by the use of centrifugal concentrators.

As an alternative to the Pichia expression system, the target proteins are expressed as glutathione-S-transferase (GST) fusion proteins in E. coli. The target protein cDNAs are cloned into the pGEX-KG vector (Guan et al., 1991, Analytical Biochemistry 192:262–267) in which the protein of interest is expressed as a C-terminus fusion with the GST protein. The pGEX-KG plasmid has an engineered thrombin cleavage site at the fusion junction that is used to cleave the target protein from the GST tag. Expression is inducible in the presence of IPTG, since the GST gene is under the influence of the tac promoter. Induced cells are broken up by sonication and the GST-fusion protein is affinity purified onto a glutathione-linked affinity matrix. The bound protein is then cleaved by the addition of thrombin to the affinity matrix and recovered by washing, while the GST tag remains bound to the matrix. Milligram quantities of recombinant protein per liter of E. coli culture are expected to be obtainable in this manner.

Further methods for sample labeling and methods for application of molecular structure determination to drug design are found in applicants' copending U.S. patent application Ser. No. 08/418,992, filed Mar. 31, 1995, for Consensus Configuration Bias Monte Carlo Method And System For Pharmacophore Structure Determination.

NMR SAMPLE SIZE AND EXPERIMENT TIMINGS

An advantage of this invention is that the measured protein samples do not have strict size limitation as in solution-state NMR. In solution-state NMR, the maximum size of the protein is determined by the ability to resolve the overlapping lines in the NMR spectrum. The maximum size of a resolvable protein in solution-state NMR is approximately 25 kDaltons (Clore et al., 1994, Protein Science 3:372–390). In the methods of this invention, the maximum size of the protein target is limited by the signal-to-noise ratio of the NMR signal. The signal-to-noise ratio is approximately determined by the number of observed nuclei present in the sample, the gyromagnetic ratio of the detected nucleus, and by the sensitivity of the NMR instrumentation. The major contributor to the sensitivity of the NMR instrumentation is the strength of the magnetic field.

In the application of the invention described in the accompanying Examples, the magnetic field is 7.05 Tesla, and the sample volume of the 5 mm Pencil rotor is 140 $\mu$L. Chemagnetics plans to introduce a thin-walled rotor that will increase the sample volume to 210 $\mu$L. Table 2 gives approximate $^{15}$N detected experiment times for a peptide of 900 D (an approximate mass for a cyclic octomer) bound to proteins of various sizes.

TABLE 2

| EXPERIMENT TIMES FOR $^{15}$N DETECTION | | |
|---|---|---|
| Protein MW | 140 $\mu$L rotor | 210 $\mu$L rotor |
| 10 kD | 4 days | 3.2 days |
| 20 kD | 16 days | 12.8 days |
| 40 kD | 64 days | 51.2 days |

Table 3 presents the same information for a $^{13}$C detected experiment.

TABLE 3

| EXPERIMENT TIMES FOR $^{13}$C DETECTION | | |
|---|---|---|
| Protein MW | 140 $\mu$L rotor | 210 $\mu$L rotor |
| 10 kD | 6 hours | 4.8 hours |
| 20 kD | 1 day | 19 hours |
| 40 kD | 4 days | 3.2 days |

Both tables assume that the data collection includes 28 S/S$_0$ points. The values in the tables are based upon empirical experimental sensitivity of the instrumentation described in the accompanying Examples, and upon the principles of sensitivity and signal-to-noise in solid-state NMR (Mehring, 1983, Principles of High Resolution NMR in Solids, Springer-Verlag, Berlin, Chap 4).

These tables indicate the advantages of measuring multiple distances in one NMR sample in order to determine molecular structure more rapidly and a less expense.

As is known in the art of solution-state NMR, larger biological molecules can be investigated by using higher magnetic field strengths. The reason is that the resolution, the limit on maximum size of a molecule amenable to study, is determined principally by the chemical shift dispersion, which scales linearly with the applied magnetic field strength, B$_0$. Similarly, the size of the biological molecules amenable to the solid-state NMR techniques described in this invention increases with the applied magnetic field strength. Because the limiting factor in the size of the solid-state NMR techniques is sensitivity, the gain in sensitivity should increase more quickly than the solution-state NMR case because sensitivity increases as B$_0^{3/2}$. The current state of the art in high-resolution NMR magnets is approximately 18.8 Tesla, with 14.1 Tesla magnets common (Oxford Instruments, Oxford, United Kingdom).

6. EXAMPLES

The section describes an example of NMR data collection using the REDOR pulse sequence and its one- and two-dimensional analysis according to the maximum entropy and REDOR transform embodiments of this invention. Also described are the sample labeling and synthesis methods.

6.1. REDOR DATA COLLECTION

The NMR experiment that collected the data described in these Examples was performed on a Chemagnetics CMX300 spectrometer (Otsuka Electronics, Fort Collins, Colo.) with a Chemagnetics 5 mm triple-resonance MAS (magic angle spinning) Pencil probe. This instrument includes a 7.05 Tesla magnet from Oxford Instruments (Oxford, United Kingdom) and RF pulse excitation and receiving hardware conventional in the NMR art. The resonance frequencies for the nuclei were: $^1H$ 299.991 MHz; $^{15}N$ 30.401 MHz; $^{13}C$ 75.442 MHz. Other spectrometers such as those from Varian Instruments (Palo lto, Calif.) or Bruker Instruments (Billerica, Mass.) are suitable substitutes for the Chemagnetics spectrometer. Other sources of magic angle spinning probes include Doty Scientific Inc. (Columbia, S.C.).

Prior to the experiment, several standard instrument calibrations were made. The magic angle was adjusted by observing the time-domain signal of $^{79}Br$ in KBr. The magnetic field was shimmed on natural abundance $^{13}C$ in adamantane to a residual line width of 10 Hz. The $^{13}C$ π pulse width was 8.8 μsec; the $^{15}N$ π pulse width was 12.2 μsec, and the $^1H$ π/2 pulse width was 3.0 μsec. An exemplary means to determine the pulse times is to change the pulse width in a single pulse experiment on either $^{15}N$ or $^{13}C$ in labeled glycine until a null is reached. In a similar manner, water was used to determine the $^1H$ pulse width by searching for the null. The null corresponds to the π pulse. As is well known in the art, short pulse widths on the $^{13}C$ and $^{15}N$ channels are important for accurate distance measurements. For REDOR performed with magic angle spinning less than 10 kHz, pulses 15 μsec or less are suitable. The optimal level for the cross-polarization from the $^1H$ to the $^{15}N$ was set by an empirical evaluation of the cross-polarization efficiency at different $^1H$ power levels. The optimal cross-polarization time of 1 msec was set by empirical evaluation of the cross-polarization efficiency.

The pulse-sequence used in this embodiment of the REDOR experiment is illustrated in FIG. 1, other suitable pulse-sequences are known in the art. The pulse-sequence details the application of pulses on the $^1H$, $^{15}N$, and $^{13}C$ channels and was described in detail in Sec. 5.1 and with reference to FIG. 1. In this specific embodiment of the REDOR experiment, $^{15}N$ is the observed nucleus and $^{13}C$ is the non-observed nucleus. An alternate embodiment of the invention treats $^{13}C$ is the observed nucleus and $^{15}N$ as the non-observed nucleus. For each $S_0$ and S data point 4096 averages were recorded with a delay time between acquisitions of 2 seconds. The number of averages for each $S_0$ and S data point was chosen empirically to ensure an acceptable level of signal-to-noise ratio. The length of the FID collected for each $S_0$ and S data point was 1024 points. Proton decoupling of 90 kHz (corresponds to $^1H$ π/2 pulse width of 2.7 μsec) was used during the REDOR dephasing period and 70 kHz decoupling (corresponds to $^1H$ π/2 pulse width of 3.5 μsec) during the acquisition period. Decoupling of 90 kHz or above during the REDOR dephasing period is required for accurate distance measurements.

The sample from which the data reported in these Examples was generated was a 1:1 physical mixture of two cyclic peptides, identical except in their labeling. Both peptides were Cys-Asn-Thr-Leu-Lys-*Gly-Asp-Cys-Gly, bound to mBHA synthesis resin via the terminal G. The peptides were cyclized via a disulfide bond. This cyclic peptide was previously shown by O'Neil et al. (O'Neil et al., 1993, *Proteins: Structure, Function, and Genetics* 14:509–515) to bind to the glycoprotein IIb/IIIa and therefore act as a competitive inhibitor against binding with fibrinogen. As a result, the peptide is a strong inhibitor of platelet aggregation. One peptide was labeled with $^{15}N$, 1-$^{13}C$ glycine; the other with $^{15}N$, 2-$^{13}C$ glycine. The synthesis resin (Advanced ChemTech) had 0.1 meq of populated mBHA surface sites/g of polystyrene resin. No further dilution of the peptides was necessary, as they were naturally diluted by the presence of the synthesis resin, thus eliminating intermolecular dipolar couplings. From the peptide molecular weight of 890 g/mol, and the density of populated surface sites on the mBHA resin, this gives us 0.09 g of peptide/1 g of resin. Approximately 85 mg of the peptide-resin sample, and therefore ~7 mg of peptide, was packed into a 5 mm Chemagnetics Pencil rotor. Prior to packing into the rotor, a physical mixture was made by weighing out equal masses (50 mg) of the two peptide-resin samples. These two peptideresin samples were added together and gently mixed with a spatula. The peptides were synthesized by Multiple Peptide Systems, San Diego, Calif., via a combination of FMOC and tBOC chemistry, with labeled amino acids from Isotec (Miamisburg, Ohio). Details of sample labeling and synthesis are described in Sec. 6.4.

The data were collected from this sample in this NMR machine once every four rotor cycles while spinning at 6000 Hz using XY-4 phase cycling. The spinning speed was regulated with a Chemagnetics spin-speed regulator to within 10 Hz over the course of the experiment. This sampling rate, 6000 Hz divided by data sampling once every four rotor cycles, gives a frequency bandwidth of approximately 1500 Hz. 28 $S/S_0$ points were collected, resulting in a digital resolution of 54 Hz/point. The digital resolution is determined by dividing the frequency bandwidth by the number of $S/S_0$ points. The error estimates, σ, for these data points range from 0.01 for the first point to 0.1 for the last point with a linear increase between the first and last points.

Figure 5:
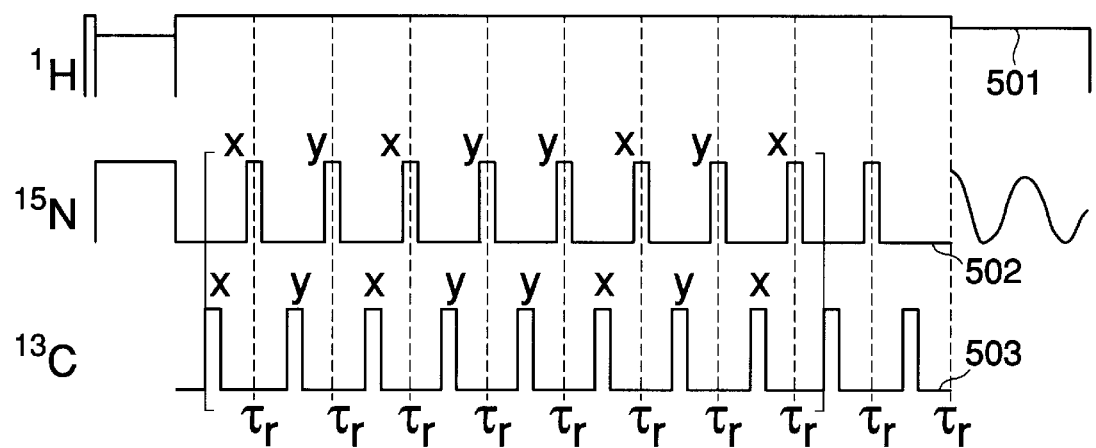
FIG. 5 illustrates an alternative REDOR pulse-sequence preferred for measuring $^{13}C$-$^{15}N$ distances longer than 3 Å.

Alternatively, sampling may be done at other rotor cycle increments. For example, sampling every 16 rotor cycles enables use of the preferred pulse program shown in FIG. 5 and XY-16 (or higher order) phase cycling (Gullion et al., 1990, *Journal of Magnetic Resonance* 89:479–484). FIG. 5 illustrates the RF pulses applied in the 1H channel, pulse sequence 501, in the 15N channel, pulse sequence 502, and in the 13C channel, pulse sequence 503.

6.2. ONE-DIMENSIONAL REDOR DATA ANALYSIS

The data measured according to Sec. 6.1 was analyzed by one-dimensional analysis methods using the REDOR transform and the Maximum Entropy embodiments of this invention. Both embodiments give distance measurements corresponding to those obtained with other measurement techniques. Thereby, the validity of the methods of this invention are confirmed.

REDOR TRANSFORM EMBODIMENT

The 28 $S_0$ and 28 S FID's were baseline corrected by averaging the values of a number of data points (in this specific case 100 points) at the end of the FID's where the data has decayed to the level of the noise. This average value was subtracted from the entire FID such that the FID decays to zero. After baseline correction the FID's were linebroadened to 500 Hz with an exponential and Fourier transformed. The choice of how many Hz of line-broadening to apply was done empirically by looking for the minimum amount of broadening necessary to smooth the Fourier transformed resonance line. After transformation, the spectrum was phase-corrected to achieve a smooth baseline and all peaks in pure absorption mode. The values of $S_0$ and S were determined from peak heights of the labeled $^{15}N$ resonance in the spectra. NMR data processing in this example was performed with the Macintosh (Apple Computer, Cupertino, Calif.) software program RMN (available free from Dr. Philip J. Grandinetti, Department of Chemistry, Ohio State University. e-mail: grandinetti.1@osu.edu). Other suitable NMR data processing programs include, but are not limited to, the software pre-loaded on the Chemagnetics, Varian, and Bruker spectrometers.

Figure 14:
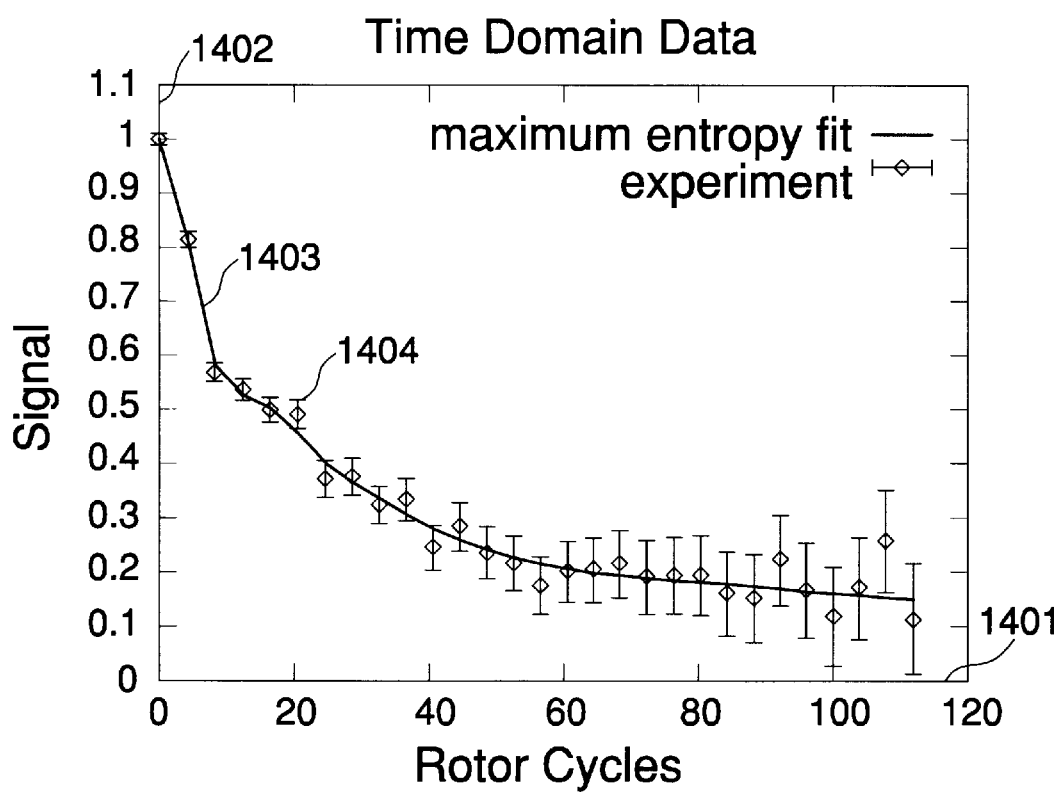
FIG. 14 illustrates exemplary measured REDOR data.

FIG. 14 illustrates the results of this pre-processing. In that figure, axis 1401 represents the number of rotor cycles, and axis 1402 represents the value of $S/S_0$, starting from a known value of 1.0 and 0 rotor cycles. Data points with likely error bars are shown, as at data point 1404. Curve 1403 illustrates the maximum entropy fit to this input data, as described subsequently.

After this pre-processing, the REDOR transform embodiment of the dipolar dephasing spectral transformation was applied to this input data according to the method described in Sec. 6.3. FIG. 4 illustrates the resulting dipolar coupling frequency spectrum. In that figure, axis 401 is the dipolar coupling frequency, and axis 402 is the intensity of the spectrum. The transformed data shows two strong peaks, peak 403 at a frequency of approximately 200±54 Hz and peak 404 at a frequency of approximately 900±54 Hz. As determined from Eqn. 1, these frequencies correspond to distances of 2.5±0.3 Å for peak 403 and 1.50±0.03 Å for peak 404. Within the resolution constraints imposed upon the signal due to the large sweep width and limited data sampling, the results agree well with x-ray crystallographic data of pure glycine. The $^{15}N$, $1$-$^{13}C$ crystallographic distance in pure glycine is 1.49 Å and the $^{15}N$, $2$-$^{13}C$ crystallographic distance in pure glycine is 2.47 Å.

To a first approximation, the frequency resolution of the spectrum is determined by the number of $S/S_0$ points collected, and the frequency bandwidth of the spectrum. The frequency resolution in FIG. 4 results from collection of 28 $S/S_0$ points while sampling once every 4 rotor cycles and spinning at 6000 Hz. This combination of rotor frequency and sampling corresponds to a spectral bandwidth of 1500 Hz (=6000 Hz/4). The sampling corresponds to a resolution of 54 Hz per $S/S_0$ point (=1500 Hz/28).

Alternately, the distance resolution is improved by changing the experimental parameters of spectral bandwidth and the number of $S/_0$ data points. The 200 Hz frequency measured with the same number of $S/S_0$ data points but with a smaller sweep width of 375 Hz (=6000 Hz/16) leads to a marked improvement in the experimental distance resolution, to 2.48±0.05 Å. This smaller bandwidth of 375 Hz (a bandwidth that corresponds to an lower limit for the $^{13}C$-$^{15}N$ distance of 2.0 Å) is obtained while spinning at 6000 Hz and sampling every 16 rotor cycles. With that bandwidth, every $S/S_0$ point corresponds to 13 Hz (=375 Hz/28). Also, increasing the number of $S/S_0$ points increases the resolution of the spectrum.

MAXIMUM ENTROPY EMBODIMENT

The first alternative embodiment of maximum entropy, in which the error estimates are not simultaneously optimized, was applied in both the dipolar frequency and the internuclear distance domains to the same data. It is preferable that the maximum entropy method be applied to raw measurement data without any pre-processing. The error estimate σ is 0.01 for the first point and increasing linearly to 0.1 for the last point.

Figure 16A:
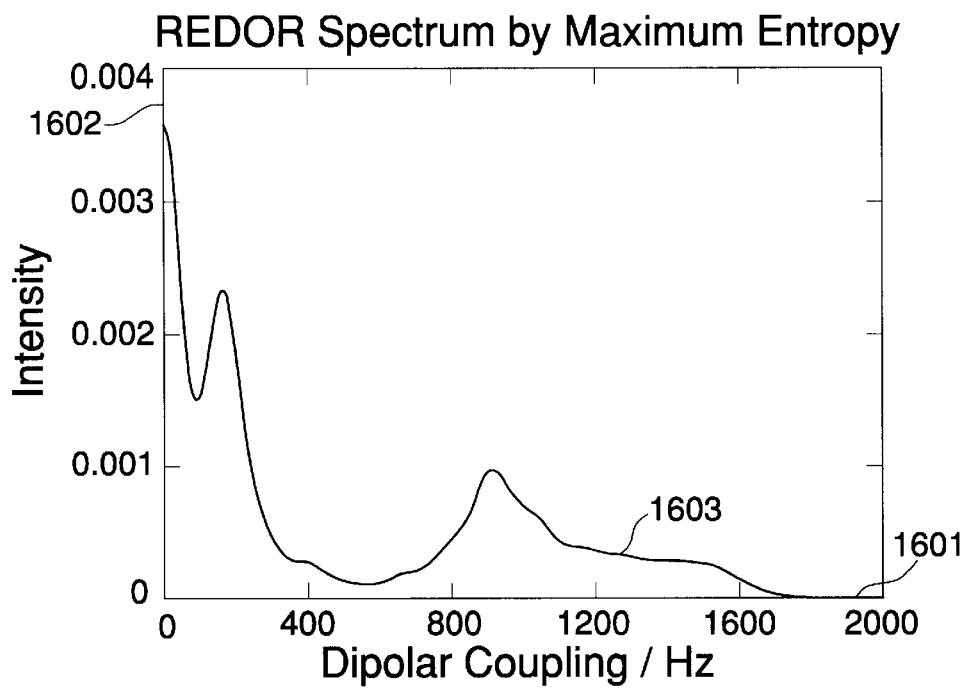
FIG. 16A and FIG. 16B illustrate an exemplary application of the maximum entropy method.

FIG. 16A illustrates the maximum entropy dipolar frequency spectrum. In this figure, axis 1601 is dipolar coupling frequency, and axis 1602 is spectral intensity. Curve 1603 is the determined spectrum. The spectrum was determined on a grid of 200 points with a spacing of 12.5 Hz between points. Two peaks are apparent, one at approximately 150 Hz and another at approximately 900 Hz. $N_{good}$ was found to be 12.39, and $N_{bad}$ to be 8.48. Therefore, the sum of $N_{good}$ and $N_{bad}$ is 20.87, smaller than the total number of data points 29. This difference indicates that the error estimates from the measurement should be re-checked. Turning to FIG. 14, curve 1403 is the input time-domain data as predicted from the frequency-domain spectrum. The predicted and actual time-domain data are close, falling within the error bars of the experimental measurement at all points.

Figure 16B:
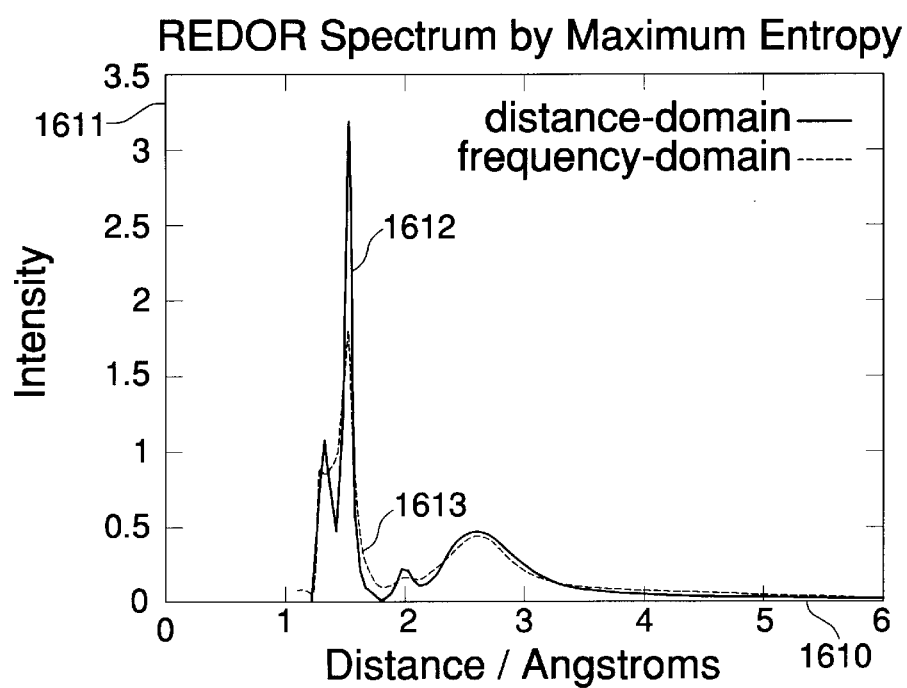

FIG. 16B illustrates the maximum entropy method applied in the internuclear distance-domain. In this figure, axis 1610 is the internuclear distance in Å, and axis 1611 is the spectral intensity. Curve 1612 is the determined distance domain spectra. The spectrum was determined on a grid of 200 points with the first point at 0.5 Å, a separation between points of 0.05 Å, and the last point at 10.45 Å. Two peaks are evident, one at approximately 1.5 Å and the other at approximately 2.5 Å. The most probable value for α was found to be 1.8744, yielding an $N_{good}$ of 4.70 and an $N_{bad}$ of 6.73. The sum of $N_{good}$ and $N_{bad}$ is less than the total N, again indicating that the experimental error estimates should be rechecked. Curve 1613 is a distance-domain spectrum obtained by transforming the frequency-domain spectrum according to Eqn. 10. It is evidently close to the directly determined distance-domain spectrum.

The maximum entropy embodiment was also performed on the same measurement data in the alternative embodiment in which the error estimates are jointly optimized along with the spectrum. In this embodiment, both a frequency-domain and a distance-domain spectrum were directly determined. The frequency-space transform used a grid with a frequency spacing of 10 Hz and a high-frequency maximum of 2000 Hz. The final values for the regularization parameter α, the error scaling $\gamma_\sigma$, $N_{good}$, and $N_{bad}$ are shown in Table 2. The distance-space transform used a grid with a distance spacing of 0.05 Å, a minimum grid point of 0.5 Å, and a maximum grid point at 10.45 Å. The final values for α, $\gamma_\sigma$, $N_{good}$, and $N_{bad}$ are also shown in Table 2.

Both spectra determined by this embodiment of maximum entropy do not perceptibly differ from the spectra determined previously. For both the frequency-space and distance-space transforms, $N_{good}$ and $N_{bad}$ sum to 29, the total number of data points, as required by the algorithms employed. The precise values of $N_{good}$ and $N_{bad}$ differ between the two transforms, as do the values of the other parameters α and $\gamma_\sigma$.

TABLE 2

CONVERGED PARAMETER VALUES

| Parameters | Frequency-space | Distance-space |
| --- | --- | --- |
| α | 11.4 | 2.46 |
| $\gamma_\sigma$ | 0.747 | 0.549 |
| $N_{good}$ | 12.5 | 5.91 |
| $N_{bad}$ | 15.5 | 23.1 |

6.3. TWO-DIMENSIONAL REDOR DATA ANALYSIS

The data collected in Sec. 6.1 was also subject to two-dimensional analysis. This data was processed according to the methods of Sec. 5.5.1. with the exception that the length of the FID's was truncated to a fewer number of points. FID truncation was done simply to shorten computation time. As is well known in the art, Fourier Transformation of an FID with more points results in an improved digital resolution in the spectrum. This increased digital resolution is useful in many instances when two or more chemically shifted observed nuclei are present in the spectrum. In the data of this Example, only one chemical shift is present and increased resolution is unnecessary. The FID's were truncated to 32 points.

Following the truncation, processing was according to Sec. 5.5.1. The FID's were baseline corrected, line-broadened by 500 Hz with an exponential, Fourier transformed, and phased with the Macintosh software program, RMN. Because there is only one chemical shift resonance in the spectrum, a uniform offset correction was applied to the 32 $\Delta S/S_0$ curves. Further, prior to the REDOR transform, for each of the 32 points in the chemical shift spectra generated after the Fourier transform, a $\Delta S/S_0$ curve was generated. Then, all 32 $\Delta S/S_0$ curves were offset corrected for the natural abundance background, converted into $S/S_0$ curves and smoothed with a 3-point Blackman-Harris function as in the one-dimensional case. The two-dimensional data matrix was 32×56, in which a 32 point FID spectrum was present for each of the 28 $S_0$ and 28 S points. This was then REDOR transformed in Mathematica according to the Mathematica file 2-D-PROCESS, which is included in Sec. 7. Only the real data was transformed, the imaginary data being set to zero. The 32×28 point data matrix, in which a 32 point chemical shift spectra is correlated to a 28 point dipolar coupling spectra, was output and plotted.

Figure 8:
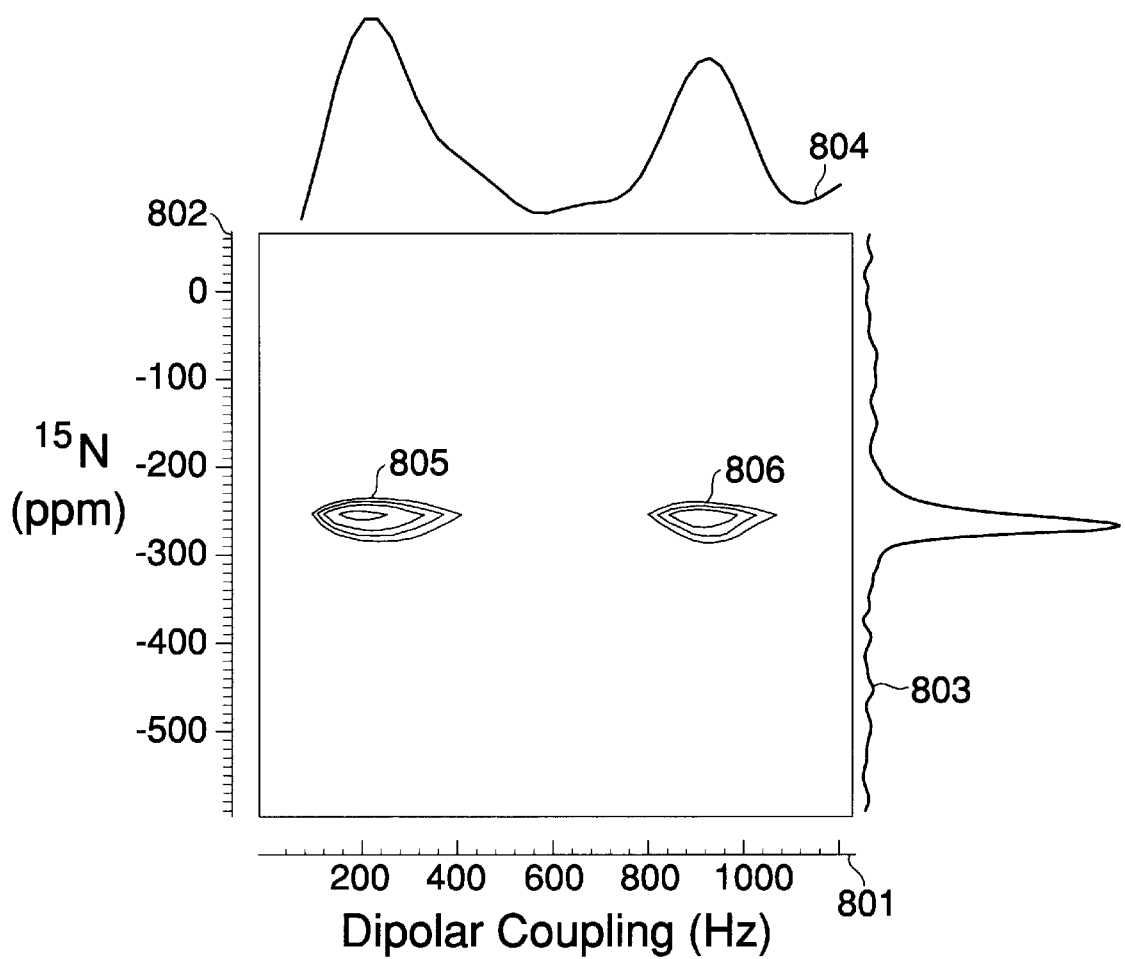
FIG. 8 illustrates the two-dimensional spectrum of the data of FIG. 4 correlating chemical shift and the dipolar coupling.

FIG. 8 illustrates a two-dimensional plot of the resulting two-dimensional spectra. In this figure, axis 801 is the dipolar coupling frequency, and axis 802 is the chemical shift of the observed $^{15}N$ nuclei. Curve 803 is the chemical shift spectrum of the $^{15}N$. Curve 804 is the dipolar coupling frequency spectrum of the $^{15}N$. Spectral peaks 805 and 806 represent the two-dimensional spectrum correlating chemical shift to dipolar coupling.

6.4. SAMPLE LABELING

The labeled peptides used in the previously described Examples were Cys-Asn-Thr-Leu-Lys-($^{15}N$, 2-$^{13}C$)Gly-Asp-Cys-Gly-mBHA resin, and Cys-Asn-Thr-Leu-Lys-($^{15}N$, 1-$^{13}C$)Gly-Asp-Cys-Gly-mBHA resin, where a glycine linker attached the peptide of interest to the mBHA resin.

These peptide resins were synthesized by solid phase synthesis on p-MethylBenzhydrilamine (mBHA) resin using a combination of tBOC and FMOC chemistry. MethylBenzhydrilamine resin (Subst. 0.1 meq/g) was purchased from Advanced Chem Tech (Louisville, Ky.). FMOC($^{15}N$, 2-$^{13}C$)Gly, and FMOC($^{15}N$, 1-$^{13}C$)Gly were prepared from HCl, ($^{15}N$, 2-$^{13}C$)Gly, ($^{15}N$, 1-$^{13}C$)Gly (Isotec Inc., Miamisburg, Ohio) and FMOC-OSu. tBOC-Gly, (Trt), FMOC-Asp (OtBu), FMOC-Lys(tBOC), FMOC-Leu, FMOC-Thr (OtBu), FMOC-Asn and tBOC-Cys(Acm) were purchased from Bachem (Torrance, Calif.). Reagent grade solvents were purchased from Fisher Scientific, Diisopropylcarbodiimide (DIC), Trifluoroacetic acid (TFA) and Diisopropyl-ethylamine (DIEA) were purchased from Chem Impex (Wooddale, Ill.). Nitrogen, HF were purchased from Air Products (San Diego, Calif.).

The first step was the synthesis of tBOC-Cys(ACM)-Asn-Thr(OtBu)-Leu-Lys(tBOC)-Gly-Asp(OtBu)-Cys(Trt)-Gly-mBHA resin. 1.11 g (0.11 meq) of mBHA resin were placed in a 150 ml reaction vessel (glass filter at the bottom) with Methylene Chloride ($CH_2Cl_2$) ["DCM"] and stirred 15 min with a gentle bubbling of Nitrogen in order to swell the resin. The solvent was drained and the resin was neutralized with DIEA 5% in DCM (3×2 min). After washes with DCM, the resin was coupled 60 min with tBOC-Gly (0.280 g-1.6 meq-4 fold excess-0.1 M) and DIC (0.25 ml-1.6 meq-4 fold excess-0.1 M) in DCM. Completion of the coupling was checked with the Ninhydrin test. After washes, the resin was stirred 30 min in TFA 55% in DCM in order to remove the tBOC protecting group. The resin was then neutralized with DIEA 5% in DCM and coupled with FMOC-Cys(Trt)(0.937 g-1.6 meq-4 fold excess-0.1 M) and DIC (0.25 ml-1.6 meq-4 fold excess-0.1 M) in DCM/DMF (50/50). After washes the resin was stirred with Piperidine 20% in DMF (5 min and 20 min) in order to remove the FMOC group. After washes, this same cycle was repeated with FMOC-Asp(OtBu), FMOC ($^{15}N$, 2-$^{13}C$)Gly or FMOC($^{15}N$, 1-$^{13}C$)Gly (2 fold excess only), FMOC-Lys(tBOC), FMOC-Leu, FMOC-Thr(OtBu), FMOC-Asn and tBOC-Cys(Acm). After the last coupling, the tBOC group was left on the peptide. The resin was washed thoroughly with DCM and dried under a nitrogen stream. Yield was 1.49 g (Expected: ~1.7 g).

The next step was cyclization of the tBOC-Cys-Asn-Thr (OtBu)-Leu-Lys(tBOC)-Gly-Asp(OtBu)-Cys-Gly-mB HA resin. 600 mg of protected peptide resin were sealed in a polypropylene mesh packet. The bag was shaken in a mixture of solvent (DCM/Methanol/Water-640/280/47) in order to swell the resin. The bag was then shaken 20 min in 100 ml of a solution of iodine in the same mixture of solvent (0.4 mg $I_2$/ml solvent mixture). This operation was performed 4 times. No decoloration was observed after the third time. The resin was then thoroughly washed with DCM, DMF, DCM, and methanol successively.

The last step was side-chain deprotection of the Cys-Asn-Thr-Leu-Lys-Gly-Asp-Cys-Gly-mBHA resin. After cyclization the resin in the polypropylene bag was reacted 1.5 hour with 100 ml of a mixture TFA/p-Cresol/Water (95/2.5/2.5). After washes with DCM and Methanol, the resin was dried 48 hours under vacuum. Yield was 560 mg.

The resulting peptide resin was analyzed for its purity and the presence of the disulfide bridge after cleavage from the synthesis resin. To cleave the peptide from the resin, 40 mg of resin were sealed in a propylene mesh packet and treated with HF at 0° C. for 1 hour in presence of anisole (HF/Anisole: 90/10). The scavenger and by-products were extracted from the resin with cold ethyl ether. The peptide was extracted with 10% Acetic Acid and lyophilized 36 hours. The dry isolated peptide was characterized by PDMS (mass spectrography) and HPLC (high performance liquid chromatography). This analysis demonstrated that greater than 95% of the product peptide was of the correct amino acid composition, having a disulfide loop and without intermolecular disulfide dimers.

7. COMPUTER PROGRAM CODE

The section contains implementations of the methods of this invention. Sec. 7.1 contains an implementation of the maximum entropy embodiment of the dipolar dephasing spectral transform of this invention as a program in the C language. Sec. 7.2 contains an implementation of the REDOR transform embodiment of the dipolar dephasing spectral transform of this invention as a programs in the Mathematica language. The latter section contains separate programs for the one-dimensional REDOR transform, for generating a table of values of the REDOR kernel of Eqn 29, and for the two-dimensional transform.

This code can run on any computers having these languages and of adequate performance. Such computers include PowerPC™ based Macintosh type computers and Pentium™ based PC type computers.

7.1. FOR THE MAXIMUM ENTROPY EMBODIMENT

```
/* copyright curagen corp. 1995
   use maximum entropy to extract a frequency spectrum from
redor data
   D_i = data at time i with uncertainty +/- sigma_i
   M_j = map (frequency spectrum) at frequency j
   K_ij = kernel
   D_i = sum_j K_ij M_j
   find the best M_j according to maximum entropy
   S = entropy = sum_j (M_j - s_j) - M_j ln(M_j/s_j)
   s_j = a priori guess for M_j, use s_j = s for all j
   get s from sum rule: sum_j s_j = 1, so s_j = 1 / N_freq
   chi^2 = sum_i (D_i - K_ij M_j)^2/(sigma_i^2)
   for a given regularization parameter alpha,
   find the {M} that maximizes alpha S - chi^2/2
   the best alpha is at the corner of a log-log plot of -S
           vs. chi^2
```

```
        find the {M} at the best alpha
        modified to use a non-uniform grid
        modified to use a variable metric minimization method
        jan 1996 modified to choose the regularization parameter
    alpha
                 according to classical maximum entropy
5       jan 1996 modified to use a distance-domain spectrum
                 in addition to a frequency-domain spectrum
        mar 1996 modified to optimize the error bars also
    */ include <stdio.h>
    #include <float.h>
    #include <math.h>
10  #include <fcntl.h>
    #include <stdio.h>
    #include <memory.h>
    #include <malloc.h>
    #include <string.h>
    #include <search.h>
    #include <stdlib.h>
15  #include <errno.h>
    #include <string.h>
    #include <time.h>
    #include <varargs.h>
    /* for the cpu timer */
    #include <sys/types.h>
    #include <sys/times.h>
20  #include <limits.h> define ABS(x)   ((x)>0?(x):-(x))
    #define MAX(x,y) ((x)>(y)?(x):(y))
    #define MIN(x,y) ((x)<(y)?(x):(y))
    #define PI 3.14159265358979323846
    #define EPS 1.e-60
    #define GAMMAFAC 3063.529 /* freq = (gammafac)/(r^3) for r in
25  A */ define MAXDATA 128
    #define MAXMAP 256
    #define MAXALPHA 50 define FREQ_DOMAIN 0
30  #define DIST_DOMAIN 1 typedef struct {
      double t;    /* time */
      double d;    /* data */
      double sigsq;  /* statistical uncertainty */
    } data_type;

35  /* the data */
    double t[MAXDATA];       /* time in sec for each data point */
    double tweight[MAXDATA]; /* weight for integration */
    double data[MAXDATA];    /* data at each time */
```

```
       double mdata[MAXDATA]; /* the data generated by the map */
       double sigma[MAXDATA],sigsq[MAXDATA]; /* sigma and sigma^2
       for the data */
       double tmax,dt;
       int ndata;

5  /* the map */
       int domain;   /* frequency domain or distance domain */
       double freq[MAXMAP]; /* frequency in sec^(-1) */
       double fweight[MAXMAP]; /* weight for integration */
       double map[MAXMAP];  /* the value of the map, i.e. the
       spectrum */
       double sstar[MAXMAP]; /* the starting value of the map;
                               it maximizes the entropy */
   10  double fmax,df;
       int nmap;

/* a trial map for a given alpha */
       typedef struct {
         double a;   /* alpha */
         double s;   /* entropy */
   15    double chisq;  /* chisquare residual norm */
         double fn;  /* -alpha*s + 0.5*chisq */
         int niter; /* number of iterations, negative if diverging
       */
         double m[MAXMAP];   /* save the map at each grid point */
         double d[MAXDATA];  /* save the data corresponding to the
       map */
         double lambda[MAXMAP]; /* eigenvalues of the curvature
   20                             in the entropy metric */
         double ngoodlam; /* number of good data points
                         calculated from the eigenvalues */
         double ngoods; /* number of good data points from - 2aS */
       } trial_type;

double rotor_speed,tau_rotor;
   25
       trial_type grid[MAXALPHA];
       trial_type best;
       int ntrial = 8;
       int do_grid = 0;
       double alpha;

/* the kernel to go from map to data */
   30  double kernel[MAXDATA][MAXMAP];

/* curvebase is the base matrix for the curvature of the
       likelihood (chi-sq)
           it is the second derivative of (chi-sq/2) with respect to
       the map
           (and is identical to the base matrix for a newton-raphson
   35  minimization)
           curvature is curvebase in the entropy metric
           lambda are the eigenvalues */
       double **curvebase, **curvature, *lambda;
```

- 84 -

```
/* error rescaling parameter is gama (gamma conflicts with
math.h) */
double gama = 1.;
int rescale_error = 1;

void get_data(void)
5 {
   char line[200],filename[200];
   FILE *datafile;
   int i;
   double x;
   printf("Enter the rotor speed in Hz: ");
   fgets(line,sizeof(line),stdin);
10 sscanf(line,"%lf",&rotor_speed);
   tau_rotor = 1. / rotor_speed;
   printf("rotor speed = %lf  tau_rotor =
%lf\n",rotor_speed,tau_rotor);
   printf("Getting data.\n"
          "Format of data:\n"
          "One or more lines with n d s\n"
          "meaning data(n rotor cycles) = d +/- s\n"
15        "Enter filename: ");
   fgets(line,sizeof(line),stdin);
   sscanf(line,"%s",filename);
   datafile = fopen(filename,"r");
   if (!datafile) {
      printf("Exit: could not open %s\n",filename);
      exit(0);
   }
20 i = 0;
   while (fgets(line,sizeof(line),datafile)) {
      sscanf(line,"%lf %lf %lf",&t[i],&data[i],&sigma[i]);
      t[i] *= tau_rotor;   /*  convert from rotor cycles to sec
*/
      ++i;
      if (i >= MAXDATA) {
25       printf("Error: too many data items, increase MAXDATA
from %d\n",MAXDATA);
         exit(0);
      }
   }
   fclose(datafile);
   ndata = i;
   /* create error bars if not provided */
30 if ((sigma[0] == 0.) && (sigma[ndata-1] == 0.)) {
      printf("Enter sigma for t = 0 and t = tmax: ");
      fgets(line,sizeof(line),stdin);
      sscanf(line,"%lf %lf",&sigma[0],&sigma[ndata-1]);
      printf("Linearly scaling error bars\n"
             "from %lf at point 1\n"
             "to   %lf at point %d\n",
35           sigma[0],sigma[ndata-1],ndata);
      for (i = 1; i < ndata-1; ++i) {
         sigma[i] = sigma[0] +
```

```
              (sigma[ndata-1]-sigma[0])*((double)
    i)/((double)(ndata-1));
        }
      }
      /* get error bars, or create them if not provided */
      for (i = 0; i < ndata; ++i) {
5       if (sigma[i] == 0) {sigma[i] = sigma[0];}
        sigsq[i] = sigma[i]*sigma[i];
      }
      if ((t[0] == 0.) && (data[0] != 1.)) {
        printf("WARNING: for most application, data[0] should be
    1.\n"
               "This assumes\n"
10             "(1) a sum rule for data[0], and\n"
               "(2) a normalized map.\n"
               );
      }
      /* get dt and time weights for trapezoidal rule
         might as well give the last point full weight
         */
      tweight[0] = 0.5 * (t[1] - t[0]);
15    for (i = 1; i < ndata-1; ++i) {
        tweight[i] = 0.5 * (t[i+1] - t[i-1]);
      }
      tweight[ndata - 1] = tweight[ndata - 2];
      tmax = t[ndata - 1];
      dt = tmax/((double)(ndata - 1));
    }

20  void put_data(void)
    {
      int i;
      FILE *fp;
      printf("Writing data to data.out\n");
      fp = fopen("data.out","w");
      fprintf(fp,"# time data +/- sigma   weight\n");
25    for (i = 0; i < ndata; ++i) {
        fprintf(fp,"%lf %lf %lf
    %lf\n",t[i],data[i],sigma[i],tweight[i]);
      }
      fclose(fp);
    }

30  void put_map(int k)
    {
      FILE *fp;
      char filename[200];
      int i,j;

sprintf(filename,"map_%d",k);
      fp = fopen(filename,"w");
35    for (j = 0; j < nmap; ++j) {
        fprintf(fp,"%lf %lf\n",freq[j],grid[k].m[j]);
      }
      fclose(fp);
```

```
      sprintf(filename,"data_%d",k);
      fp =  fopen(filename,"w");
      for (i = 0; i < ndata; ++i) {
        fprintf(fp,"%lf %lf %lf\n",
    t[i]/tau_rotor,grid[k].d[i],grid[k].d[i]-data[i]);
      }
      fclose(fp);

} void put_best(void)
    {
      FILE *fp;
      char filename[200];
      int i,j;
      fp = fopen("map_best","w");
      for (j = 0; j < nmap; ++j) {
        fprintf(fp,"%lf %lf\n",freq[j],best.m[j]);
      }
      fclose(fp);
      fp =  fopen("data_best","w");
      for (i = 0; i < ndata; ++i) {
        fprintf(fp,"%lf %lf %lf\n",
                t[i]/tau_rotor,best.d[i],best.d[i]-data[i]);
      }
      fclose(fp);
    } void put_lcurve(void)
    {
      int i;
      FILE *fp;
      fp = fopen("lcurve","w");
      for (i = 0; i < ntrial; ++i) {
        fprintf(fp,"%g %g %g %d %d\n",
    grid[i].chisq,-grid[i].s,grid[i].a,grid[i].niter,i);
      }
      fclose(fp);
    }
    void get_domain(void)
    {
      char line[200];
      printf("Enter 0 for frequency domain\n"
             "    or 1 for distance domain: \n");
      fgets(line,sizeof(line),stdin);
      sscanf(line,"%d",&domain);
      if (domain == FREQ_DOMAIN) { printf("Frequency domain selected.\n"); }
```

```
      else if (domain == DIST_DOMAIN) { printf("Distance domain
   selected.\n"); }
      else {
        printf("Error, domain = %d not defined.\n",domain);
        exit(1);
      }
   } void get_freq_map(void)
   {
     int i,j;
     int choice;
     char line[200];
     double sum;

/*  nmap = ndata;
         fmax = 0.5 / dt;
         df = fmax / ((double) nmap);
     */
     nmap = 200;
     fmax = 2000.;
     df = fmax / ((double) nmap);
     printf("Basing frequency-domain map paramters on data
   parameters\n"
            "t_max = %lf\n"
            "dt    = %lf\n"
            "ndata = %d\n",
            tmax,dt,ndata);
     choice = 1;
     while (choice) {
       choice = 0;
       printf("Current map parameters:\n"
              "f_max = %lf\n"
              "df    = %lf\n"
              "nmap  = %d\n"
              "f_max * dt = %lf\n"
              "t_max * df = %lf\n",
              fmax,df,nmap,fmax*dt,tmax*df);
       printf("Enter 0 to accept\n"
              "1 to change maximum frequency (fmax)\n"
              "2 to change delta frequency (df)\n"
              "3 to change number of frequencies (nmap)\n"
              "Choice? ");
       fgets(line,sizeof(line),stdin);
       sscanf(line,"%d",&choice);
       switch (choice) {
       case 1:
         printf("Enter new fmax: ");
         fgets(line,sizeof(line),stdin);
         sscanf(line,"%lf",&fmax);
         df = fmax / ((double)nmap);
         break;
       case 2:
         printf("Enter new df: ");
         fgets(line,sizeof(line),stdin);
```

```
            sscanf(line,"%lf",&df);
            fmax = df * nmap;
            break;
          case 3:
            printf("Enter new nmap: ");
            fgets(line,sizeof(line),stdin);
 5          sscanf(line,"%d",&nmap);
            fmax = df * nmap;
            break;
          default:
            choice = 0;
            break;
        }
      }
10    if (nmap > MAXMAP) {
        printf("Error, nmap too large.  Change MAXMAP from
      %d.\n",MAXMAP);
        exit(0);
      }
      printf("Values accepted.\n");
      for (j = 0; j < nmap; ++j) {
15      freq[j] = j * df;
        fweight[j] = df;
      }
      fweight[0] *= 0.5;
      /* use a sum rule to get sstar */
      sum = 0.;
      for (j = 0; j < nmap; ++j) {
        sum += fweight[j];
20    }
      for (j = 0; j < nmap; ++j) {
        sstar[j] = 1./sum;
      }
    }

25  void get_dist_map(void)
    {
      int i,j;
      int choice;
      char line[200];
      double sum;
      double f0;

30    /* use default distance parameters
         200 points
         spacing of 0.05 A
         grid from 0.5 A to 10.5 A
         */
      nmap = 200;
      f0 = 0.5;
35    df = 0.05;
      fmax = f0 + (nmap-1)*df;
      printf("Default parameters for a distance map:\n"
             "r_0    = %lf\n"
```

```
              "r_max = %lf\n"
              "dr    = %lf\n"
              "nmap = %d\n",
              f0,fmax,df,nmap);
      choice = 1;
      while (choice) {
5        choice = 0;
         printf("Current parameters for a distance map:\n"
              "r_0   = %lf\n"
              "r_max = %lf\n"
              "dr    = %lf\n"
              "nmap = %d\n",
              f0,fmax,df,nmap);
         printf("Enter 0 to accept\n"
10               "1 to change minimum distance (r_0)\n"
                 "2 to change maximum distance (r_max)\n"
                 "3 to change delta distance (dr)\n"
                 "4 to change number of distances (nmap)\n"
                 "Choice? ");
         fgets(line,sizeof(line),stdin);
         sscanf(line,"%d",&choice);
15       switch (choice) {
         case 1:
           printf("Enter new r_0: ");
           fgets(line,sizeof(line),stdin);
           sscanf(line,"%lf",&f0);
           fmax = f0 + (nmap-1)*df;
           break;
         case 2:
20         printf("Enter new r_max: ");
           fgets(line,sizeof(line),stdin);
           sscanf(line,"%lf",&fmax);
           df = (fmax - f0)/((double) nmap - 1);
           break;
         case 3:
           printf("Enter new dr: ");
25         fgets(line,sizeof(line),stdin);
           sscanf(line,"%lf",&df);
           fmax = f0 + df * nmap;
           break;
         case 4:
           printf("Enter new nmap: ");
           fgets(line,sizeof(line),stdin);
           sscanf(line,"%d",&nmap);
30         fmax = f0 + df * (nmap - 1);
           break;
         default:
           choice = 0;
           break;
         }
      }
35    if (nmap > MAXMAP) {
         printf("Error, nmap too large.  Change MAXMAP from %d.\n",MAXMAP);
         exit(0);
```

```
      }
      printf("Values accepted.\n");
      for (j = 0; j < nmap; ++j) {
        freq[j] = f0 + j * df;
        fweight[j] = df;
      }
  5   fweight[0] *= 0.5;
      /* use a sum rule to get sstar */
      sum = 0.;
      for (j = 0; j < nmap; ++j) {
        sum += fweight[j];
      }
      for (j = 0; j < nmap; ++j) {
        sstar[j] = 1./sum;
 10   }
    }

/* get pointers for matrices */
    void get_ptrs(void)
    {
 15   int i;
      curvebase = (double **)malloc(nmap * sizeof(double *));
      for (i = 0; i < nmap; ++i) {
        curvebase[i] = (double *)malloc(nmap * sizeof(double));
      }
      curvature = (double **)malloc(nmap * sizeof(double *));
      for (i = 0; i < nmap; ++i) {
        curvature[i] = (double *)malloc(nmap * sizeof(double));
 20   }
      lambda = (double *)malloc(nmap * sizeof(double));
    }

/* get the kernel for the transformation
       data_j = sum_j kernel_ij map_j df
 25   */
    void get_kernel(void)
    {
      int i,j,k,index,index1,index2;
      double xnu,c,s,x,rj,ry,rjp,ryp,arg;
      void bessjy(double, double, double *, double *, double *,
    double *);
      /*
 30      redor kernel is (sqrt(2) pi/4) J_(1/4)(x) J_(-1/4)(x)
         J_-v = cos(v pi) J_v - sin(v pi) Y_v
         */
      xnu = 0.25;
      c = cos(xnu*PI);
      s = sin(xnu*PI);
      for (j = 0; j < nmap; ++j) {
 35     for (i = 0; i < ndata; ++i) {
          /*
             kernel[i][j] = df*cos(2.*PI*data[i].t*map[j].f);
             */
```

```
        if (domain == FREQ_DOMAIN)
           { x = sqrt(2)*t[i]*freq[j]; }
        else if (domain == DIST_DOMAIN)
           { x =
  sqrt(2)*t[i]*GAMMAFAC/(freq[j]*freq[j]*freq[j]); }
        if (x == 0) {
          arg = 1.;
        }
        else {
          bessjy(x,xnu,&rj,&ry,&rjp,&ryp);
          arg = 0.25 * sqrt(2) * PI * rj * (c*rj - s*ry);
        }
        kernel[i][j] = arg;
      }
    }
    /* get the curvature in the non-entropy metric */
    for (j = 0; j < nmap; ++j) {
      for (k = 0; k <= j; ++k) {
        curvebase[j][k] = 0.;
        for (i = 0; i < ndata; ++i) {
          curvebase[j][k] +=
  (kernel[i][j]*fweight[j])*(kernel[i][k]*fweight[k])
            /sigsq[i];
        }
      }
    }
    for (j = 0; j < nmap; ++j) {
      for (k = j + 1; k < nmap; ++k) {
        curvebase[j][k] = curvebase[k][j];
      }
    }
  }

/* take a step in the maximization of
     alpha*s - chisq/2
     where
     alpha = regularization parameter
     s = entropy
     chisq = residual
     the values returned for s and chisq are for the map passed
  to the routine
     not for the new values of the map after the step
  */

/* mapfn determines entropy and chisq for a map */
  void mapfn(double p[], double *entropy, double *chisq)
  {
    int i,j;
    double x;
    /* copy p to map */
    for (j = 0; j < nmap; ++j) {
      map[j] = p[j+1];
      if (map[j] < EPS ) { map[j] = EPS; }
    }
    /* compute the entropy
```

```
             s = (df) sum_j m_j - s_j - m_j ln(m_j/s_j)
          */
       *entropy = 0.;
       for (j = 0; j < nmap; ++j) {
           *entropy += fweight[j]*(map[j] - sstar[j] -
     map[j]*log(map[j]/sstar[j]));
5      }
       /* compute the data points predicted from the map */
       for (i = 0; i < ndata; ++i) {
         mdata[i] = 0.;
         for (j = 0; j < nmap; ++j) {
           mdata[i] += kernel[i][j]*map[j]*fweight[j];
         }
10     }
       /* compute the difference between predicted and actual data
          compute the residual chisq
          */
       *chisq = 0.;
       for (i = 0; i < ndata; ++i) {
         x = mdata[i] - data[i];
         *chisq += x*x/sigsq[i];
15     }
     }

/* dfuncmin computes g = (d/dM_j) [-alpha S + chi^2/2] */
     void dfuncmin(double p[], double g[])
     {
       int i,j;
       double fac[MAXDATA];
20     dcuble sum;
       /* copy p to map and check for small values */
       for (j = 0; j < nmap; ++j) {
         map[j] = p[j+1];
         if (map[j] < EPS) { map[j] = EPS; }
       }

25     /* -dS/dM_j = -d/dMj sum_j df_j [M_j - s_j - M_j ln (M_j /
     s_j)]
             = ln(M_j/s_j)
          */
       for (j = 0; j < nmap; ++j) {
         g[j+1] = alpha * fweight[j] * log(map[j]/sstar[j]);
       }

30     /* (1/2)d/dM_j chi^2 = (1/2) d/dM_j sum_i
     (D_i'-D_i)^2/sig^2
             = sum_i (D_i' - D_i) sig^-2 dD_i'/dM_j
             = sum_i (D_i' - D_i) sig^-2 df_j kernel_ij
          */
       /* first compute the data points predicted from the map */
       for (i = 0; i < ndata; ++i) {
35       mdata[i] = 0.;
         for (j = 0; j < nmap; ++j) {
           mdata[i] += kernel[i][j]*map[j]*fweight[j];
         }
```

```
      }
      /* now compute (D_i' - D_i)/sig^2 and store */
      for (i = 0; i < ndata; ++i) {
        fac[i] = (mdata[i] - data[i])/sigsq[i];
      }
      for (j = 0; j < nmap; ++j) {
5       for (i = 0; i < ndata; ++i) {
          g[j+1] += fac[i] * fweight[j] * kernel[i][j];
        }
      }
    }

10  double funcmin(double p[])
    {
      double entropy,chisq,result;
      mapfn(p,&entropy,&chisq);
      result = -alpha*entropy + 0.5*chisq;
      return(result);
    }

15  /*
        find the map that maximizes alpha*s - chisq/2
        for a given value of alpha
        start with the current map
        */
    void get_map(trial_type *trial)
    {
       /* dfpmin is a numerical recipes routine for
20  davidon-fletcher-powell
            minimization */
       void dfpmin(double p[], int n, double gtol, int *iter,
    double *fret,
                  double(*func)(double []), void (*dfunc)(double
    [], double []));
       double *dvector(long nl, long nh);
25     void free_dvector(double *v, long nl, long nh);
       void eigrs(double **curvature, double *lambda, int nmap,
    int do_vectors);

double *p;
       int n;
       double gtol;
30     int iter,total_iter;
       double fret;
       int i,j,k;
       double entropy,chisq;
       /* allocate the vector p[1..n] */
       n = nmap;
       p = dvector(1,n);
       for (i = 1; i <= n; ++i) {
35       p[i] = map[i-1];
       }
       gtol = EPS;
```

```
      alpha = trial->a;
      total_iter = 0;
      while (total_iter < 10) {
        dfpmin(p,n,gtol,&iter,&fret,funcmin,dfuncmin);
        total_iter += iter;
      }
 5    iter = total_iter;
      /* load map and mdata with the proper values */
      for (i = 1; i <= n; ++i) {
        if (p[i] < 0.) {
          /*
             printf("negative value: map[%d] = %lf\n",i,p[i]);
           */
          ;
10      }
      }
      mapfn(p,&entropy,&chisq);
      trial->s = entropy;
      trial->chisq = chisq;
      trial->niter = iter;
      trial->fn = fret;
15    /* copy p back to trial */
      for (j = 0; j < nmap; ++j) {
        trial->m[j] = p[j+1];
      }
      for (i = 0; i < ndata; ++i) {
        trial->d[i] = mdata[i];
      }
      free_dvector(p,1,n);
20    /* compute the eigenvalues of the curvature in the entropy
   metric */
      for (j = 0; j < nmap; ++j) {
        for (k = 0; k <= j; ++k) {
          curvature[j][k] = sqrt(fabs(trial->m[j] *
   trial->m[k]))*curvebase[j][k];
        }
25    }
      for (j = 0; j < nmap; ++j) {
        for (k = j + 1; k < nmap; ++k) {
          curvature[j][k] = curvature[k][j];
        }
      }
      eigrs(curvature,trial->lambda,nmap,0);
      trial->ngoodlam = 0.;
30    for (j = 0; j < nmap; ++j) {
        trial->ngoodlam += trial->lambda[j] /
          (gama*gama*(trial->a) + trial->lambda[j]);
      }
      trial->ngoods = -2. * (trial->a) * (trial->s);
   }

35 /*
      determine the residual and the entropy
      for a number of regularization parameters
      fill a grid from alpha = 1/ndata^2 through alpha = data^2
```

- 95 -

```
       alpha_k = alpha_0 r^k
       alpha_0 = 1/ndata^3
       alpha_(ntrial-1) = ndata^3
       */
   void get_grid(void)
   {
     int i,j,k;
     int niter;
     double r,sum;
     if (ntrial > MAXALPHA) {
       printf("Error, ntrial too large, change MAXALPHA from
   %d.\n",MAXALPHA);
       exit(0);
     }
     r = pow((double)ndata,6/((double)ntrial-1));
     for (k = 0; k < ntrial; ++k) {
       grid[k].a = pow(r,k)/(ndata*ndata*ndata);
     }
     /* initialize the map */
     for (j = 0; j < nmap; ++j) {
       map[j] = sstar[j];
     }
     /* use the current value of the map as the starting point
        */
     printf("%10s %10s %10s %10s %10s %10s\n", "trial","alpha","iterations","chisq","ngoods","ngoodlam");
     for (k = 0; k < ntrial; ++k) {
       get_map(&grid[k]);
       printf("%10d %10lf %10d %10lf %10lf %10lf\n",
              k,grid[k].a,grid[k].niter,grid[k].chisq,
              grid[k].ngoods,grid[k].ngoodlam);
       put_map(k);
     }
   }

/* use the information from the grid as a starting point
      to get the best map */
   void get_best(void)
   {
     int j,k,bestk;
     double alpha,diff,bestdiff;
     int iterations,done;
     double nbad;
     double gama_old;

if (do_grid) {
       /* as alpha increases, ngoods increases and ngoodlam
   decreases
          look for a change of sign in ngoods - ngoodlam to
   bracket the best alpha
          */
       bestdiff = 1.e10;
       bestk = -1;
       for (k = 0; k < ntrial; ++k) {
```

- 96 -

```
          diff = grid[k].ngoods - grid[k].ngoodlam;
          if (fabs(diff) < bestdiff) {
            bestdiff = fabs(diff);
            bestk = k;
          }
        }
5       if (bestk < 0) {
          printf("Error, the grid looks bad.\n");
          exit(1);
        }
        alpha = grid[bestk].a;
        for (j = 0; j < nmap; ++j) {
          map[j] = grid[bestk].m[j];
        }
10      }
        else {
          alpha = 1.;
          for (j = 0; j < nmap; ++j) {
            map[j] = sstar[j];
          }
        }
15      /* now do iterations to find a self-consistent alpha */
        done = 0;
        iterations = 0;
        best.a = alpha;
        printf("%5s %10s %10s %10s %10s %10s\n",
               "i","alpha","gama","ngood_s","ngood_lam","nbad");
        while (!done) {
          gama_old = gama;
20        best.a = alpha;
          get_map(&best);
          diff = best.ngoods - best.ngoodlam;
          alpha = best.ngoodlam / (-2.*best.s);
          nbad = ndata-best.ngoods;
          if (rescale_error && (nbad > 0.)) {
            gama = sqrt(best.chisq/nbad);
25        }
          ++iterations;
          done = (((fabs(alpha-best.a) <
    1.e-6)&&(fabs(gama-gama_old) < 1.e-6)))
               || (iterations > 50);
          printf("%5d %10lf %10lf %10lf %10lf %10lf\n",
30    iterations,best.a,gama,best.ngoods,best.ngoodlam,nbad);
        }
      } main()
      {
35      printf("Redor transform by maximum entropy!\n");
        get_data();
        put_data();
        get_domain();
```

```
     if (domain == FREQ_DOMAIN) {get_freq_map();}
     else {get_dist_map();}
     get_ptrs();
     get_kernel();
     if (do_grid) {
       get_grid();
5    }
     get_best();
     put_best();
     put_lcurve();
   }
```

7.2. FOR THE REDOR TRANSFORM EMBODIMENT CODE

ONE-D-TRANSFORM

```
   (*copyright curagen corp. 1995*)
   (*Enter the data as a list of lists where the*)
15 (*first number is the rotor cycle, the second number is *)
   (*the value of the S or So data*)

So ={{first rotor cycle, first data point},
               .
               .
               .
          {last rotor cycle, last data point}};
20 S ={{first rotor cycle, first data point},
               .
               .
               .
          {last rotor cycle, last data point}};

curve = Table[{So[[i]][[1]],
     ((So[[i]][[2]]-S[[i]][[2]])/So[[i]][[2]])},
25 {i,1,Length[So]}]

(*choose OFFSET so that the data settles to one*)
   curvebc = Table[{curve[[i]][[1]], (curve[[i]][[2]] *
   OFFSET)},
   {i,1,Length[curve]}]

(*convert the deltaS/So curve to S/So*)
30 inversecurve = Table[{curvebc[[i]][[1]], (1 -
   curvebc[[i]][[2]])},
   {i,1,Length[curvebc]}]
   datsmooth[dat_, b_] := Table[{dat[[i,1]], N[0.424+
   0.497 Cos[Pi i/b] +0.079 Cos[2 Pi i/b]] dat[[i,2]]},
   {i, 1, Length[dat]}];

35 data0smoothp = datsmooth[inversecurve, Length[inversecurve]]
   calcspecnewer[data_, ktable_, ntot_, dint_, dinc_, npts_] :=
        Do[ kern = ktable[[k]];
```

```
        integr = N[Sum[data[[j,2]] kern[[j,2]], {j,1,npts,1}]];

Print[{dint + dinc (k-1),integr}, ","],
        {k, 1, ntot, 1}]
     (*the values of 'dint' and 'dinc' must be the*)
     (*same as in the kernal*)
5    calcspecnewer[data0smoothp, kerntab, Length[kerntab], 0.0005,
     25,
     Length[inversecurve]]

spec1 = {INSERT RESULT FROM PREVIOUS LINE HERE};

psp1 = ListPlot[spec1, PlotJoined->True,
10   PlotRange->All, AxesOrigin -> {0, 0}]

KERNEL TABLE 15   (*copyright curagen corp. 1995*)
     kernmodd[d_, t_] := N[8 d t ((BesselJ[1/4, Sqrt[2] d
     t]*BesselY[-1/4,
     Sqrt[2] d t]) + (Sqrt[2]/2 d t*(BesselJ[-3/4, Sqrt[2] d t] -
     BesselJ[5/4, Sqrt[2] d t])*BesselY[-1/4, Sqrt[2] d t]) +
       (Sqrt[2]/2 d t *BesselJ[1/4, Sqrt[2] d t]*(BesselY[-5/4,
       Sqrt[2] d t] - BesselY[3/4, Sqrt[2] d t])))];

20   krealmod[d_, tr_, ii_, if_, iinc_] := Table[{i, kernmodd[d, i
     tr]},
     {i, ii, if, iinc}];

makekernmod[dinit_, dfinal_, dinc_, tr_, ii_, if_, iinc_] :=
     Table[krealmod[d, tr, ii, if, iinc], {d, dinit, dfinal,
     dinc}];
25
     (*the following kerntab will be for 1200 Hz, in 25 Hz steps*)

(*spinning at 6000 Hz, sampling every four rotor cycles, 128
     total*)

kerntab = makekernmod[0.0005, 1200.0005, 25, 0.0001666671, 4,
30      4 * 32, 4]

2-D-PROCESS 35   (*copyright curagen corp. 1995*)
     OpenRead["FILENAME"]

dat1 = ReadList["FILENAME", Table[Number, {LENGTH OF FID}]];
```

```
   dat2 = Table[Table[{4 i,
   ((dat1[[2 i - 1,j]]- dat1[[2 i, j]]/dat1[[2 i - 1,j]])},
   {j, 1, LENGTH OF FID}], {i, 1, LENGTH OF REDOR CURVE}];

Length[dat2[[1]]]

5 dat3 = Transpose[dat2];

(*choose OFFSET so that the data settles to one*)
   dat4 = Table[Table[{dat3[[i,j,1]],dat3[[i,j,2]] * OFFSET},
   {j,1,LENGTH OF REDOR CURVE}], {i, 1, LENGTH OF FID}];

(*convert the deltaS/So curve to the S/So curve*)
   dat4inv = Table[Table[{dat4[[i,j,1]],1 - dat4[[i,j,2]]},
10 {j,1,LENGTH OF REDOR CURVE}], {i, 1, LENGTH OF FID}];

datsmooth[dat_, b_] := Table[{dat[[i,1]],
   N[0.424+0.497 Cos[Pi i/b] +0.079 *
   Cos[2 Pi i/b]] dat[[i,2]]}, {i, 1, Length[dat]}];

dat5 = Table[datsmooth[dat4inv[[i]],LENGTH OF REDOR CURVE],
15 {i, 1, LENGTH OF FID}];

calcspecscale[data_, ktable_, ntot_, dint_, dinc_, npts_] :=
       Do[ kern = ktable[[k]];
       integr = N[Sum[data[[j,2]] kern[[j,2]], {j,1,npts,1}]];
       Print[integr, ","],
       {k, 1, ntot, 1}]
20
   (*the values of 'dint' and 'dinc' must be the same*)
   (* as in the kernal*)
   Do[ calcspecscale[dat5[[p]], kerntab, Length[kerntab],
   0.0005, 25, LENGTH OF REDOR CURVE],{p, 1, LENGTH OF FID}]

dat2da = {INSERT RESULT FROM DO LOOP HERE};
   Length[dat2da]
25 Length[dat2da]/LENGTH OF FID dat2db = Partition[dat2da, OUTPUT OF PREVIOUS LINE];

ListPlot3D[dat2db, PlotRange->All]

stmp = OpenWrite["OUTPUT FILENAME"]
30
   Do[Write[stmp, dat2da[[i]]];
       Write[stmp, 0.0],
       {i, 1, Length[dat2da]}];

dat2da[[1]]

Close[stmp]
35
```

- 100 -

8. SPECIFIC EMBODIMENTS, CITATION OF REFERENCES

The present invention is not to be limited in scope by the specific embodiments described herein. Indeed, various modifications of the invention in addition to those described herein will become apparent to those skilled in the art from the foregoing description and accompanying figures. Such modifications are intended to fall within the scope of the appended claims.

Various publications are cited herein, the disclosures of which are incorporated by reference in their entireties.

What is claimed is:

1. A method for determining one or more distances in a solid-state sample comprising one or more molecules, said one or more molecules comprising one or more pairs of sites, each said pair of sites comprising a first site and a second site, each said distance being between said first and said second site, said method comprising:
   a. generating NMR time-domain data from NMR active nuclei, wherein each pair of said one or more pairs of sites has said first site occupied by a first NMR active nucleus and has said second site occupied by a second NMR active nucleus, wherein said first NMR active nucleus is observed in said generating step and said second NMR active nucleus has a chemical shift, and said first and second NMR active nuclei have a dipolar coupling characterized by a dipolar coupling frequency responsive to the distance between said first and second sites, and said time-domain data is responsive along at least one first time dimension to said dipolar coupling of each said one or more pairs and along at least one second time dimension to said chemical shift of said second NMR active nuclei at said second site of said one or more pairs of sites;
   b. analyzing said NMR time-domain data to obtain spectral-domain data identifying said one or more dipolar coupling frequencies characterizing said dipolar couplings between said first and said second nuclei in said one or more pairs of sites, said analyzing comprising applying a maximum entropy transform to said time-domain data along said first time dimension;
   c. identifying, for each said dipolar coupling frequency, said one or more chemical shifts of each said second NMR active nucleus with that dipolar coupling frequency; and
   d. calculating one or more distances between said pairs of sites based on said one or more dipolar coupling frequencies.

2. The method according to claim 1 wherein one or more of said one or more molecules is a peptide.

3. The method according to claim 1 wherein one or more of said one or more molecules is bound to one or more target compounds.

4. The method according to claim 1 wherein said one or more pairs of sites are a plurality of pairs of sites and said one or more dipolar coupling frequencies are a plurality of dipolar coupling frequencies.

5. The method according to claim 1 further comprising prior to said generating step a step of labeling each of said one or more pairs of sites with said NMR active nuclei, whereby each said pair of sites becomes occupied by said first and said second NMR active nuclei.

6. The method according to claim 1 wherein one or more pairs of said pairs of sites has said first and said second NMR active nuclei of the same isotope.

7. A method for determining one or more distances in a solid-state sample comprising one or more molecules, said one or more molecules comprising one or more pairs of sites, each said pair of sites comprising a first site and a second site, each said distance being between said first and said second site, said method comprising:
   a. binding one or more of said one or more molecules to one or more target compounds;
   b. generating NMR time-domain data from NMR active nuclei, wherein each pair of said one or more pairs of sites has said first site occupied by a first NMR active nucleus and has said second site occupied by a second NMR active nucleus, wherein said first NMR active nucleus is observed in said generating step and said second NMR active nucleus has a chemical shift, and said first and second NMR active nuclei have a dipolar coupling characterized by a dipolar coupling frequency responsive to the distance between said first and second sites, and said time-domain data being is responsive along at least one first time dimension to said dipolar coupling of each said one or more pairs and along at least one second time dimension to said chemical shift of said second NMR active nuclei at said second site of said one or more pairs of sites;
   c. analyzing said NMR time-domain data to obtain spectral-domain data identifying said one or more dipolar coupling frequencies characterizing said dipolar couplings between said first and said second nuclei in said one or more pairs of sites, said analyzing comprising applying a REDOR transform to said time-domain data along said first time dimension;
   d. identifying, for each said dipolar coupling frequency, said one or more chemical shifts of each said second NMR active nucleus with that dipolar coupling frequency; and
   e. calculating one or more distances between said pairs of sites based on said one or more dipolar coupling frequencies.

8. A method for determining one or more distances in a solid-state sample comprising one or more peptides, said one or more peptides comprising one or more pairs of sites, each said pair of sites comprising a first site and a second site, each said distance being between said first and said second site, said method comprising:
   a. generating NMR time-domain data from NMR active nuclei, wherein each pair of said one or more pairs of sites has said first site occupied by a first NMR active nucleus and has said second site occupied by a second NMR active nucleus, wherein said first NMR active nucleus is observed in said generating step and said second NMR active nucleus has a chemical shift, and said first and second NMR active nuclei have a dipolar coupling characterized by a dipolar coupling frequency responsive to the distance between said first and second sites, and said time-domain data being is responsive along at least one first time dimension to said dipolar coupling of each said one or more pairs and along at least one second time dimension to said chemical shift of said second NMR active nuclei at said second site of said one or more pairs of sites;
   b. analyzing said NMR time-domain data to obtain spectral-domain data identifying said one or more dipolar coupling frequencies characterizing said dipolar couplings between said first and said second nuclei in said one or more pairs of sites, said analyzing comprising applying a REDOR reform to said time-domain data along said first time dimension;
   c. identifying, for each said dipolar coupling frequency, said one or more chemical shifts of each said second NMR active nucleus with that dipolar coupling frequency; and d. calculating one or more distances between said pairs of sites based on said one or more dipolar coupling frequencies.

9. The method according to claim 8 wherein said one or more pairs of sites are a plurality of pairs of sites and said one or more dipolar coupling frequencies are a plurality of dipolar coupling frequencies.

10. A method for determining a plurality of distances in a solid-state sample comprising one or more molecules, said one or more molecules comprising a plurality of pairs of sites, each said pair of sites comprising a first site and a second site, each said distance being between said first and said second site, said method comprising:

a. generating NMR time-domain data from NMR active nuclei, wherein each pair of said one or more pairs of sites has said first site occupied by a first NMR active nucleus and has said second site occupied by a second NMR active nucleus, wherein said first NMR active nucleus is observed in said generating step and said second NMR active nucleus has a chemical shift, and said first and second NMR active nuclei have a dipolar coupling characterized by a dipolar coupling frequency responsive to the distance between said first and second sites, and said time-domain data is responsive along at least one first time dimension to said dipolar coupling of each said one or more pairs and along at least one second time dimension to said chemical shift of said second NMR active nuclei at said second site of said one or more pairs of sites;

b. analyzing said NMR time-domain data to obtain spectral-domain data identifying said one or more dipolar coupling frequencies characterizing said dipolar couplings between said first and said second nuclei in said one or more pairs of sites, said analyzing comprising applying a REDOR transform to said time-domain data along said first time dimension;

c. identifying, for each said dipolar coupling frequency, said one or more chemical shifts of each said second NMR active nucleus with that dipolar coupling frequency; and d. calculating one or more distances between said pairs of sites based on said one or more dipolar coupling frequencies.

11. The method according to claim 10 wherein one or more of said one or more molecules is a peptide.

12. The method according to claim 10 further comprising prior to said generating step a step of labeling each of said plurality of pairs of sites with said NMR active nuclei, whereby each said pair of sites becomes occupied by said first and said second NMR active nuclei.

13. A method for determining one or more distances in a solid-state sample comprising one or more molecules, said one or more molecules comprising one or more pairs of sites, each said pair of sites comprising a first site and a second site, each said distance being between said first and said second site, said method comprising:

a. generating NMR time-domain data from NMR active nuclei, wherein each pair of said one or more pairs of sites has said first site occupied by a first NMR active nucleus and has said second site occupied by a second NMR active nucleus, wherein said first NMR active nucleus is observed in said generating step and has a chemical shift, and said first and second NMR active nuclei form a pair of NMR active nuclei and have a dipolar coupling characterized by a dipolar coupling frequency responsive to the distance between said first and second sites, and said time-domain data is responsive along at least one first time dimension to said dipolar coupling of each said one or more pairs and is responsive along at least one second time dimension to said chemical shift of said first nucleus at said first sites of each said one or more pairs;

b. analyzing said NMR time-domain data to obtain spectral-domain data identifying said one or more dipolar coupling frequencies characterizing said dipolar couplings between said first and said second nuclei in said one or more pairs of sites, and identifying for each said dipolar coupling frequency the chemical shift of each said first nucleus with that dipolar coupling frequency, said analyzing comprising applying a dipolar-dephasing spectral transform to said time-domain data along said first time dimension and along other time dimensions as are responsive to said one or more dipolar couplings; and c. calculating one or more distances between said pairs of sites based on said one or more dipolar coupling frequencies.

14. The method according to claim 13 wherein said analyzing further comprises applying a Fourier transform to said time-domain data along said second time dimension and along other time dimensions as are responsive to said one or more chemical shifts.

15. The method according to claim 13 wherein said NMR time-domain data has one time dimension responsive to said one or more dipolar couplings and one time dimension responsive to said one or more chemical shifts.

16. The method according to claim 13 wherein said NMR time-domain data has a plurality of time dimensions responsive to said one or more dipolar couplings.

17. The method according to claim 13 wherein said dipolar-dephasing spectral transform is a maximum entropy transform or a REDOR transform.

18. The method according to claim 13 wherein one or more of said one or more molecules is a peptide.

19. The method according to claim 18 wherein one or more of said one or more peptides is bound to one or more target compounds.

20. The method according to claim 13 wherein one or more of said one or more molecules is bound to one or more target compounds.

21. The method according to claim 13 where said one or more molecules comprises a first molecule and a second molecule, and wherein one or more of said one or pairs of sites have said first site in said first molecule and said second site in said second molecule.

22. The method according to claim 13 wherein said one or more pairs of sites is a plurality of pairs of sites and said one or more dipolar couplings is a plurality of dipolar couplings.

23. The method according to claim 13 wherein said NMR active nuclei are selected from the group consisting of $^{13}$C, $^{15}$N, $^{31}$P and $^{19}$F.

24. The method according to claim 13 wherein one or more pairs of said pairs of sites has said first and said second NMR active nuclei of the same isotope.

25. The method according to claim 13 further comprising prior to said generating step a step of labeling each of said one or more pairs of sites with said NMR active nuclei, whereby each said pair of sites becomes occupied by said first and said second NMR active nuclei.

26. The method according to claim 25 further comprising after said labeling step a step of mixing a plurality of labeled molecules in order to form said sample.

27. The method according to claim 13 further comprising a final step of displaying said spectral domain data as an arrangement of at least two dimensions with numerical values of said dipolar couplings along a first dimension and numerical values of said chemical shifts along a second dimension.

28. The method according to claim 13 further comprising a step of generating a second set of NMR time-domain data wherein said second NMR active nuclei is observed in said generating step and has a chemical shift, and a step of analyzing said second set of NMR time-domain data to obtain a second set of spectral-domain data from said second NMR active nuclei, said second set of spectral-domain data identifying said one or more dipolar coupling frequencies characterizing said dipolar couplings between said first and said second nuclei in said one or more pairs of sites, and identifying for each said dipolar coupling frequency the one or more chemical shifts of said second NMR active nuclei with that dipolar coupling frequency.

29. The method according to claim 28 further comprising a step after said step of analyzing said second set of NMR time-domain data, of correlating said spectral-domain data from said first NMR active nuclei and said second set of spectral-domain data from said second NMR active nuclei, wherein said correlating comprises correlating spectral-domain data with the same dipolar coupling frequencies, such that said chemical shifts of said first nuclei are correlated with said chemical shifts of said second nuclei dipolar coupled to said first nuclei.

30. The method according to claim 13 wherein said second NMR active nuclei at said second site of each said one or more pairs of sites has a chemical shift, wherein said generating step generates NMR time-domain data further responsive along at least one third time dimension to said chemical shift of said second NMR active nuclei at second sites of each of said one or more pairs of sites, and wherein said analyzing step further identifies for each said dipolar coupling frequency the one or more chemical shifts of said second nuclei with that dipolar coupling frequency.

31. The method according to claim 30 wherein said NMR time-domain data has three or more time dimensions responsive to said one or more chemical shifts of said NMR active nuclei.

32. The method according to claim 30 further comprising the step after said analyzing step of displaying said spectral domain data as a three-dimensional perspective arrangement with the numerical values of said dipolar couplings along a first dimension, the numerical values of said chemical shifts of each said observed nucleus along a second dimension, and the numerical values of said chemical shifts of each said other nucleus along a third dimension.

33. The method according to claim 13 wherein said generating step further comprises the step of spinning said sample at the magic angle and the step of applying a sequence of zero or more radio-frequency ("RF") pulses in frequency channels of said NMR active nuclei, said sequence of RF pulses generating a magnetization on said first NMR active nucleus at said first sites, said magnetization being observed as a free induction decay ("FID") signal in order to generate said NMR time-domain data.

34. The method according to claim 33 where the step of applying said sequence of RF pulses further comprises applying a first RF pulse sub-sequence for a first time interval and applying a second RF pulse sub-sequence, said first RF pulse sub-sequence for each said pair of NMR active nuclei introducing an amount of dipole coupling to said magnetization responsive to said first time interval, and said second RF pulse sub-sequence generating said FID signal measurable in a second time interval, wherein said FID signal is responsive to both said amount of dipole coupling interaction introduced by said first RF pulse sub-sequence and said chemical shift of each said first NMR active nucleus, and wherein said first and said second time intervals can vary independently.

35. The method according to claim 34 wherein said at least one time dimension along which said NMR time-domain data is responsive to said plurality of dipolar couplings results from variations of said first time-interval and said at least one time dimension along which said NMR time-domain data is responsive to said one or more chemical shifts of said observed nucleus results from variations in said second time-interval.

36. The method according to claim 34 wherein said first RF pulse sub-sequence is a REDOR pulse sequence, said REDOR pulse sub-sequence being applied in a first and a second form, said first form having no pulses in said frequency channel of said second NMR active nucleus at said second sites and said second form applying pulses in said frequency channel of said second NMR active nucleus at said second sites.

37. The method according to claim 34 wherein said first RF pulse sub-sequence introduces an amount of dipole coupling to said magnetization which is responsive to said first time interval with the same form of responsiveness as for a REDOR pulse sequence.

38. The method according to claim 34 wherein said first RF pulse sub-sequence is a TEDOR pulse sequence, said TEDOR pulse sub-sequence having a first sub-first-time-interval and a second sub-first time interval and applying in said first sub-first-time-interval pulses to said frequency channel of said first nuclei at said first sites and applying in said second sub-first-time-interval pulses to said frequency channel of said second nuclei at said second sites.

39. The method according to claim 38 wherein said TEDOR pulse sequence is a symmetric TEDOR pulse sequence in which said first time interval varies by simultaneous increments made in both said first sub-first-time-interval and in said second sub-first-time-interval.

40. The method according to claim 34 wherein said first and said second nuclei at one or more of said pairs of sites are of the same isotopic type, and wherein said first RF pulse sub-sequence is a homonuclear DRAMA pulse sequence.

41. The method according to claim 30 wherein the step of applying said sequence of RF pulses further comprises applying a third RF pulse sub-sequence for a third time interval, said third RF pulse sequence introducing to said magnetization an amount of said chemical shift interaction of said second nuclei at said second sites responsive to said third time interval, wherein said FID signal is further responsive to said amount of chemical shift interaction of said second nuclei at said second sites, and wherein said third time interval can vary independently of said first and said second time-intervals.

42. The method according to claim 41 wherein said at least one third time dimension along which said NMR time-domain data is responsive to said one or more chemical shifts of said second nuclei at said second sites results from variations in said third time-interval.

43. The method according to claim 41 wherein said third RF pulse sub-sequence further comprises pulses transferring said magnetization to each said second NMR active nuclei for said third time interval and allowing said magnetization to interact with said chemical shift of said second NMR active nuclei at said second site of said one or more pairs of sites.

44. The method according to claim 34 wherein the step of applying said sequence of RF pulses further comprises applying a third RF pulse sub-sequence for a third time interval, said third RF pulse sequence introducing to said magnetization an amount of said chemical shift interaction of said second nuclei at said second sites responsive to said third time interval, wherein said FID signal is further responsive to said amount of chemical shift interaction of said second nuclei at said second sites, and wherein said third time interval can vary independently of said first and said second time-intervals.

45. The method according to claim 44 wherein said at least one third time dimension along which said NMR time-domain data is responsive to said one or more chemical shifts of said second nuclei at said second sites results from variations in said third time-interval.

46. The method according to claim 44 wherein said third RF pulse sub-sequence further comprises pulses transferring said magnetization to each said second NMR active nuclei for said third time interval and allowing said magnetization to interact with said chemical shift of said second NMR active nuclei at said second site of said one or more pairs of sites.

* * * * *